(12) United States Patent
Baek

(10) Patent No.: US 10,950,628 B2
(45) Date of Patent: *Mar. 16, 2021

(54) VERTICAL MEMORY DEVICE AND METHOD OF FABRICATION THE SAME

(71) Applicant: Samsung Electronics Co., Ltd., Suwon-si (KR)

(72) Inventor: Seok Cheon Baek, Anyang-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

This patent is subject to a terminal disclaimer.

(21) Appl. No.: 16/869,581

(22) Filed: May 7, 2020

(65) Prior Publication Data
US 2020/0266212 A1     Aug. 20, 2020

Related U.S. Application Data

(63) Continuation of application No. 16/174,187, filed on Oct. 29, 2018, now Pat. No. 10,685,975.

(30) Foreign Application Priority Data

Sep. 13, 2018 (KR) .......................... 10-2018-0109393

(51) Int. Cl.
*H01L 27/11582* (2017.01)
*H01L 27/11573* (2017.01)
(Continued)

(52) U.S. Cl.
CPC .... *H01L 27/11582* (2013.01); *H01L 21/0217* (2013.01); *H01L 21/02164* (2013.01); *H01L 21/76802* (2013.01); *H01L 21/76877* (2013.01); *H01L 21/76895* (2013.01); *H01L 23/481* (2013.01); *H01L 23/528* (2013.01); *H01L 27/11565* (2013.01); *H01L 27/11568* (2013.01); *H01L 27/11573* (2013.01); *H01L 29/1037* (2013.01)

(58) Field of Classification Search
CPC ......... H01L 27/11582; H01L 27/11565; H01L 21/76895; H01L 21/76877; H01L 21/02164; H01L 29/1037; H01L 23/481; H01L 27/11573; H01L 27/11568; H01L 21/76802; H01L 23/528; H01L 21/0217
USPC ....................................................... 257/324
See application file for complete search history.

(56) References Cited

U.S. PATENT DOCUMENTS 8,765,598 B2   7/2014 Smith et al.
9,564,451 B1   2/2017 Shin et al.
(Continued)

FOREIGN PATENT DOCUMENTS

KR     20170046892 A     5/2017

*Primary Examiner* — Caleen O Sullivan
(74) *Attorney, Agent, or Firm* — Renaissance IP Law Group LLP

(57) ABSTRACT

A vertical memory device includes a substrate having a peripheral circuit interconnection, lower word lines stacked on the substrate, vertical channel structures passing through the lower word lines, a first cell contact plug including a bottom end lower than a bottom surface of a first lower word line and being connected to the first lower word line, and lower insulating layers and first lower mold patterns positioned beneath the first lower word line and stacked alternately on each other from the substrate.

20 Claims, 52 Drawing Sheets

(51) Int. Cl.
*H01L 23/528* (2006.01)
*H01L 29/10* (2006.01)
*H01L 23/48* (2006.01)
*H01L 27/11568* (2017.01)
*H01L 21/768* (2006.01)
*H01L 21/02* (2006.01)
*H01L 27/11565* (2017.01)

(56) References Cited

U.S. PATENT DOCUMENTS

| | | |
|---|---|---|
| 9,741,733 B2 | 8/2017 | Lim et al. |
| 9,768,233 B1 | 9/2017 | Fukuda et al. |
| 9,865,540 B2 | 1/2018 | Kim et al. |
| 9,871,053 B2 | 1/2018 | Kwak |
| 9,960,181 B1 | 5/2018 | Cui et al. |
| 10,685,975 B2 * | 6/2020 | Baek ................ H01L 21/02164 |
| 2016/0163732 A1 | 6/2016 | Lim et al. |
| 2017/0271354 A1 | 9/2017 | Kwak |

* cited by examiner

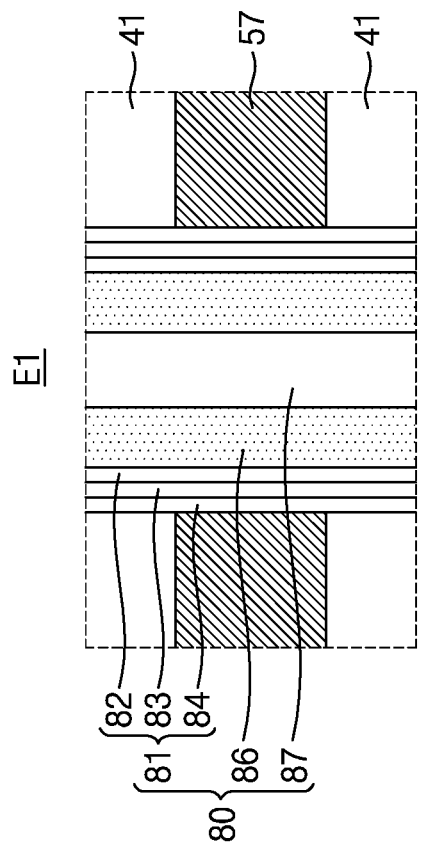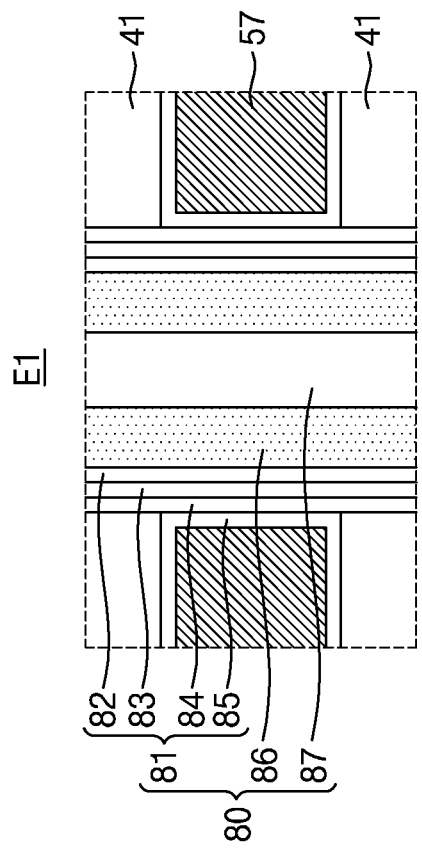

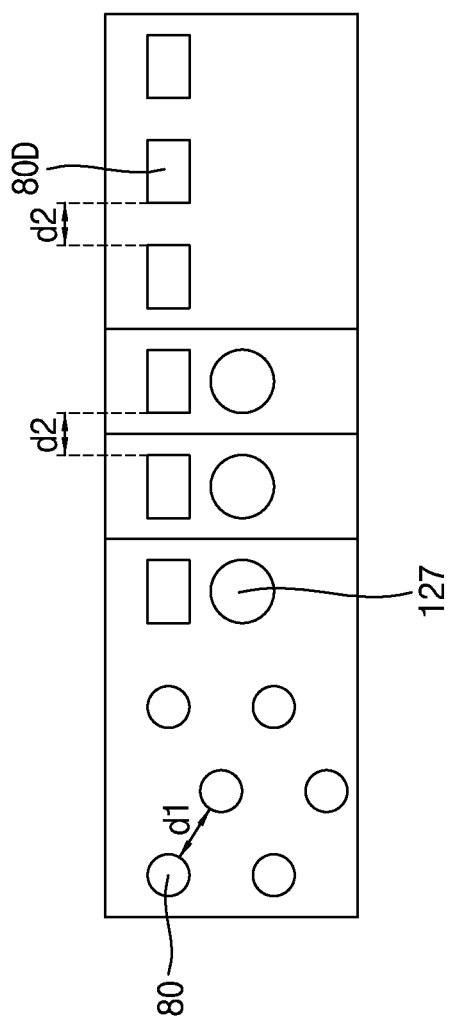
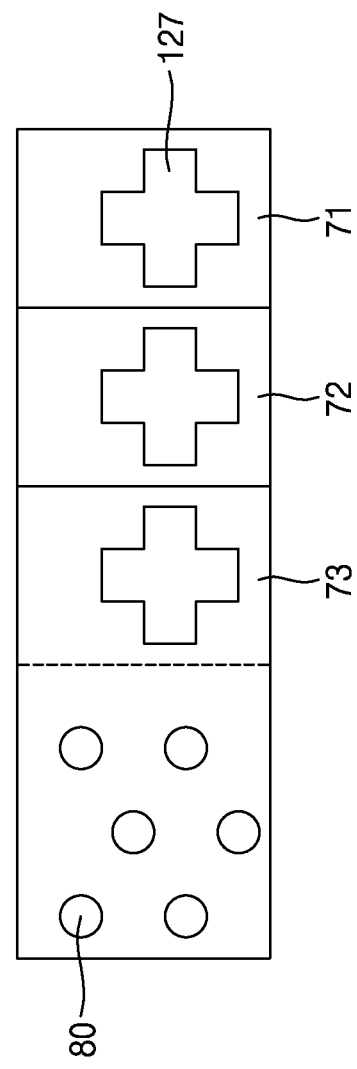

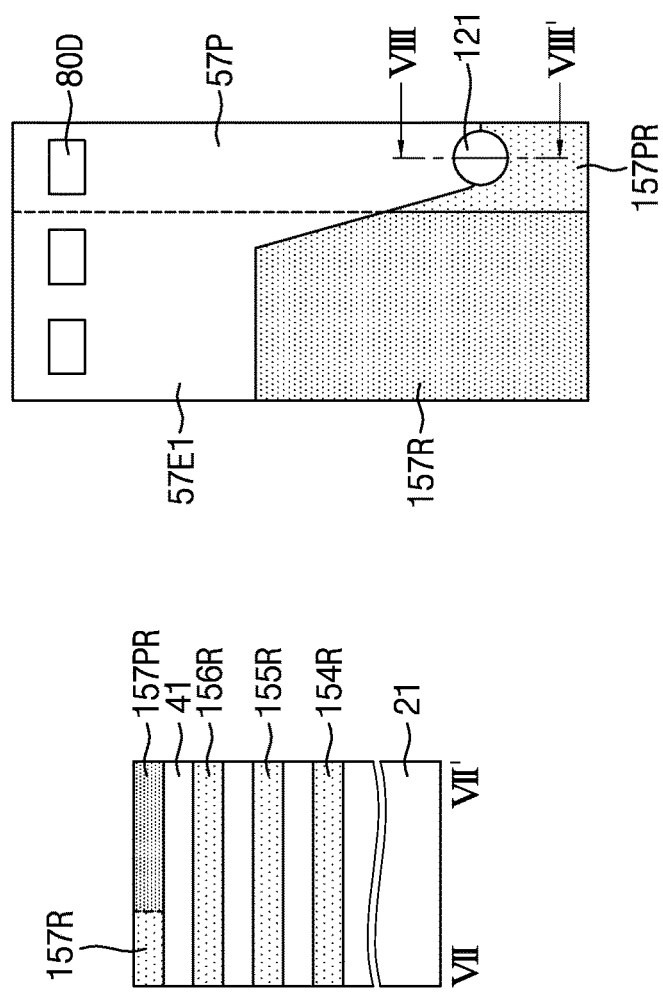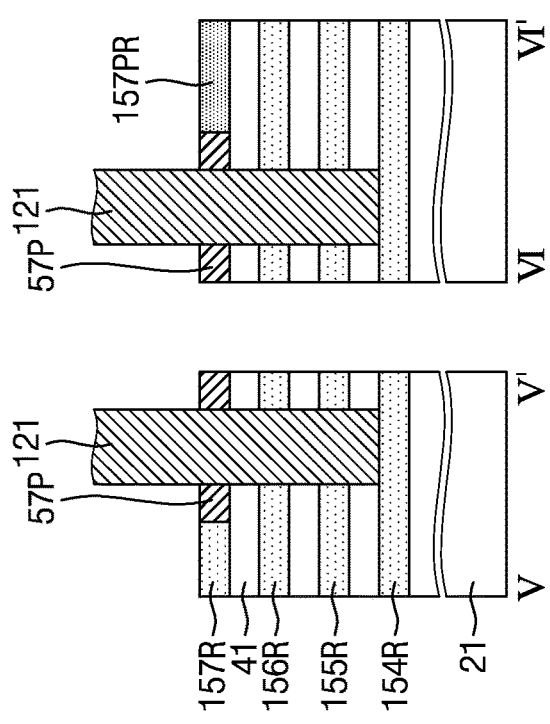

VERTICAL MEMORY DEVICE AND METHOD OF FABRICATION THE SAME

CROSS-REFERENCE TO RELATED APPLICATION

This application is a continuation of U.S. patent application Ser. No. 16/174,187, filed on Oct. 29, 2018, which claims the benefit of Korean Patent Application No. 10-2018-0109393, filed on Sep. 13, 2018, the disclosure of which is incorporated herein by reference in its entirety.

BACKGROUND

1. Field

The present inventive concept relates to vertical memory device and a method of fabrication the same.

2. Description of Related Art

Due to the need for high integration of semiconductor devices, research has been conducted into a technique of employing a stack structure including a plurality of insulating layers and a plurality of conductive layers that are alternately stacked. A channel structure may be formed to pass through the stack structure. Each of the plurality of conductive layers may be electrically connected to peripheral circuits through contact plugs. A height of the stack structure has gradually increased, and forming the contact plugs has become gradually difficult.

SUMMARY

The example embodiments of the inventive concept are directed to providing a semiconductor device, which is advantageous for high integration and has excellent electrical properties, and a method of forming the semiconductor device.

According to an exemplary embodiment of the present inventive concept, a vertical memory device includes a substrate having a peripheral circuit interconnection, lower word lines stacked on the substrate, vertical channel structures passing through the lower word a first cell contact plug including a bottom end lower than a bottom surface of a first lower word line and being connected to the first lower word line, and lower insulating layers and first lower mold patterns positioned beneath the first lower word line and stacked alternately on each other from the substrate.

According to an exemplary embodiment of the present inventive concept, a vertical memory device includes a substrate having a peripheral circuit interconnection and a lower stack structure on the substrate. The lower stack structure includes lower word lines stacked in a staircase structure. Each lower word line has a lower gate line, a first lower extension line, a second lower extension line, a first lower pad and a second lower pad. The lower stack structure further includes vertical channel structures passing through the lower gate line of each of the lower word lines and cell contact plugs each being connected to a corresponding lower word line of the lower word lines. The first lower extension line is extended in a first direction from a first side of the lower gate line, a second lower extension line is extended in the first direction from a second side of the lower gate line, the first lower pad is extended in a second direction crossing the first direction from an end of the first lower extension line and the second lower pad is extended in the second direction from an end of the second lower extension line. Each of the cell contact plugs having a bottom end lower than a bottom surface of the corresponding lower word line.

According to an exemplary embodiment of the present inventive concept, a vertical memory device includes a substrate including a peripheral circuit interconnection, a first isolation trench, a second isolation trench, lower word lines disposed between the first isolation trench and the second isolation trench, lower mold patterns stacked in a staircase structure and a cell contact plug passing through a first lower pad of one of the lower word lines. The lower word lines each includes a lower gate line, a first lower extension line extending in a first direction from a first side of the lower gate line, a second lower extension line extending in the first direction from a second side of the lower gate line and a first lower pad extending in a second direction crossing the first direction from an end of the first lower extension line. The first lower pad of each of the lower word lines is stacked in a staircase structure. Each of the lower mold patterns is positioned at the same height from the substrate with a corresponding lower word line of the lower word lines.

According to an exemplary embodiment of the present inventive concept, a method of fabricating a vertical memory device is provided as follow. A substrate having a peripheral circuit interconnection is formed. A preliminary lower stack structure is formed on the substrate. The preliminary lower stack structure includes lower insulating layers and lower mold layer that are alternately and repeatedly stacked on the substrate. Preliminary lower pads are formed at one ends of the lower mold layers. The preliminary lower pads are stacked in a staircase structure. Gap regions are formed by removing partially the lower mold layers and the preliminary lower pads, thereby forming remaining portions of the lower mold layers as a plurality of first lower mold patterns and forming remaining portions of the preliminary lower pads as a plurality of second lower mold patterns. Word lines are formed by filling the gap regions. The word lines has lower pads at one ends of the word lines. Vertical channel structures are formed to pass through the word lines and the lower insulating layers.

BRIEF DESCRIPTION OF THE DRAWINGS

FIGS. 14 and 15 are enlarged cross-sectional views illustrating a portion of FIG. 11.

FIGS. 16 and 17 are enlarged views illustrating a portion of FIG. 1.

FIG. 26 is a cross-sectional view taken along lines V-V', VI-VI', and VII-VII' of FIG. 21.

FIG. 27 is an enlarged view illustrating a portion of FIG. 1.

DETAILED DESCRIPTION OF EXEMPLARY EMBODIMENTS

Figure 1:
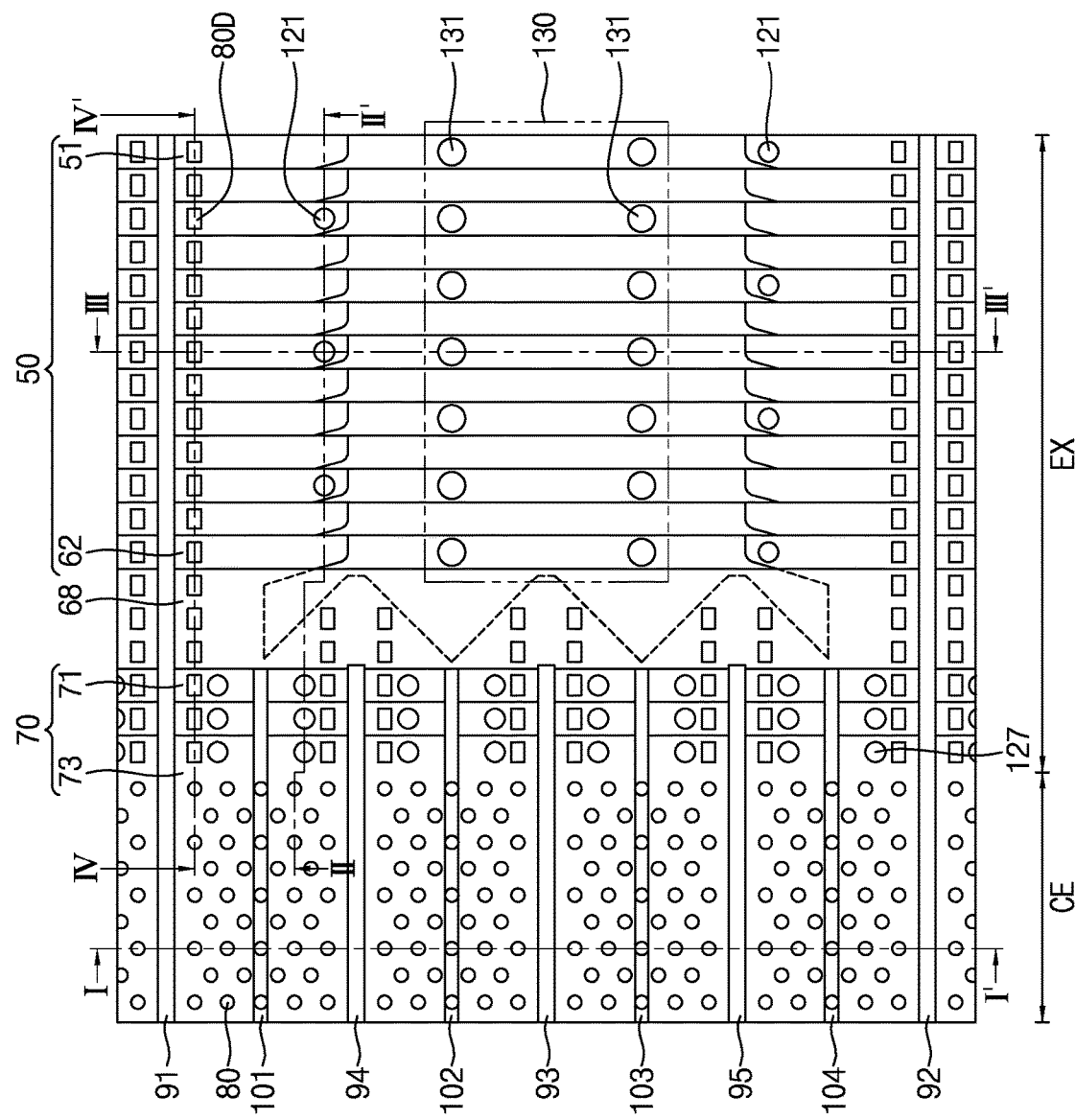
FIG. 1 is a layout for describing a semiconductor device according to an example embodiment of the inventive concept.

FIG. 1 is a layout for describing a semiconductor device according to an example embodiment of the inventive concept. The semiconductor device according to the example embodiment of the inventive concept may include a non-volatile memory such as a vertical NAND (VNAND) device or a three-dimensional (3D) flash memory.

Referring to FIG. 1, the semiconductor device according to the example embodiment of the inventive concept may include a cell region CE, a connection region EX, a lower stack structure 50, a dummy interconnection layer 68, an upper stack structure 70, a plurality of channel structures 80, a plurality of support structures 80D, a plurality of isolation trenches 91 to 95, a plurality of selection line isolation patterns 101 to 104, a plurality of cell contact plugs 121, a plurality of selection contact plugs 127, a through electrode region 130, and a plurality of through electrodes 131. The lower stack structure 50 may include a plurality of lower interconnection layers 51 to 62. The upper stack structure 70 may include a plurality of upper interconnection layers 71 to 73. The channel structures 80 may be referred to as vertical channel structures.

Figure 2:
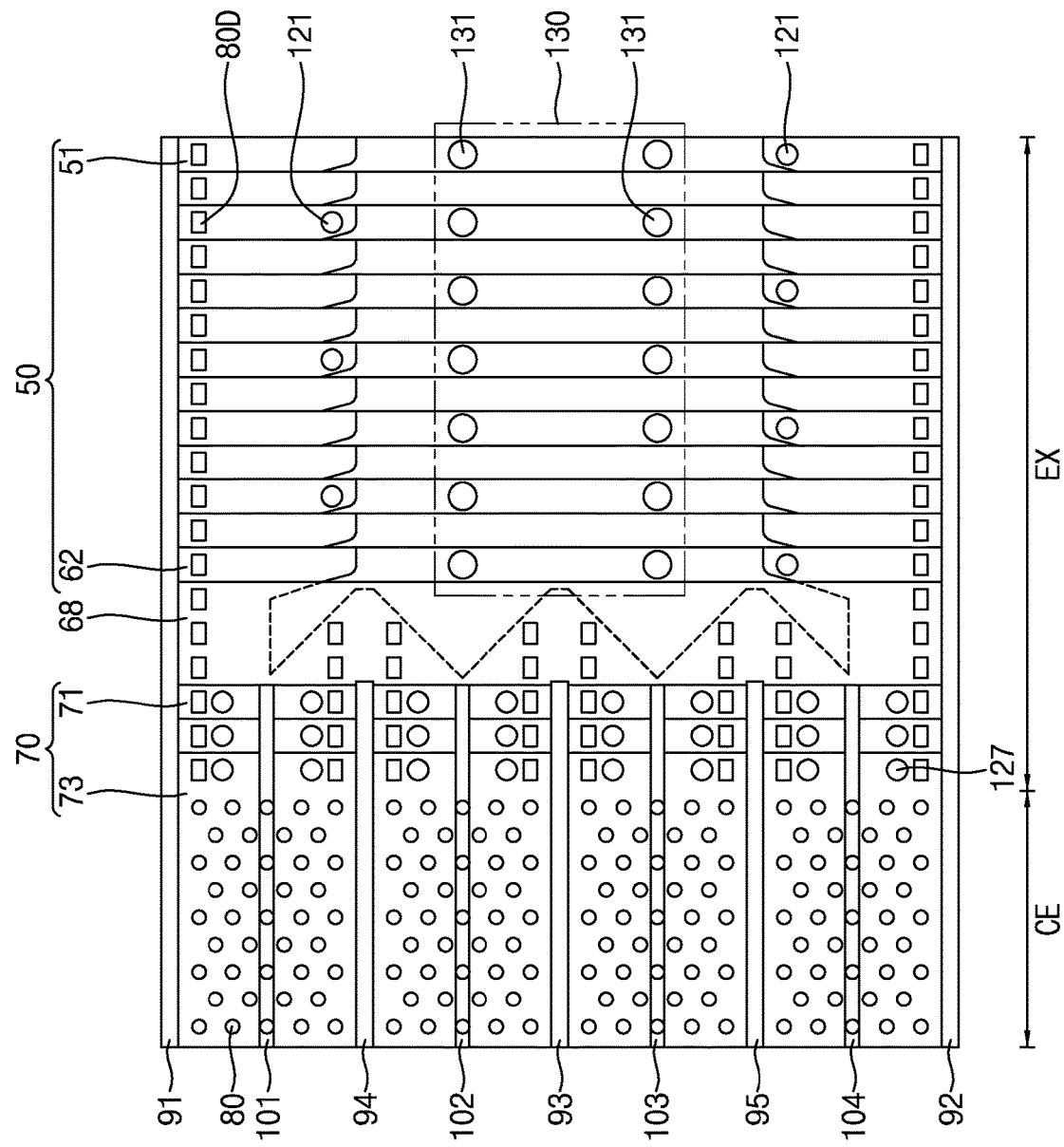
FIG. 2 is a layout illustrating main components of FIG. 1.

FIG. 2 is a layout illustrating main components of FIG. 1.

Referring to FIGS. 1 and 2, the lower stack structure 50, the dummy interconnection layer 68, and the upper stack structure 70 may be defined between a first isolation trench 91 and a second isolation trench 92, which face each other. Each of the first isolation trench 91 and the second isolation trench 92 may cross the cell region CE and the connection region EX.

A third isolation trench 93 may be disposed between the first isolation trench 91 and the second isolation trench 92. A fourth isolation trench 94 may be disposed between the first isolation trench 91 and the third isolation trench 93. A fifth isolation trench 95 may be disposed between the third isolation trench 93 and the second isolation trench 92. Each of the third isolation trench 93, the fourth isolation trench 94, and the fifth isolation trench 95 may have a smaller length than that of each of the first isolation trench 91 and the second isolation trench 92. Each of the third isolation trench 93, the fourth isolation trench 94, and the fifth isolation trench 95 may cross the cell region CE and extend into the connection region EX. Each of the third isolation trench 93, the fourth isolation trench 94, and the fifth isolation trench 95 may completely cross the upper stack structure 70. Each of the third isolation trench 93, the fourth isolation trench 94, and the fifth isolation trench 95 may be formed to pass vertically through the upper stack structure 70, the dummy interconnection layer 68, and the lower stack structure 50.

The plurality of channel structures 80 may be disposed in the cell region CE. The plurality of support structures 80D, the plurality of cell contact plugs 121, the plurality of selection contact plugs 127, and the through electrode regions 130 may be disposed in the connection region EX. The plurality of through electrodes 131 may be disposed in the through electrode region 130. Some of the plurality of support structures 80D may be disposed adjacent to the first isolation trench 91 and the second isolation trench 92. The plurality of channel structures 80 may be divided into a plurality of groups by the plurality of isolation trenches 91 to 95 and the plurality of selection line isolation patterns 101 to 104.

A first selection line isolation pattern 101 may be disposed between the first isolation trench 91 and the fourth isolation trench 94. A second selection line isolation pattern 102 may be disposed between the fourth isolation trench 94 and the third isolation trench 93. A third selection line isolation pattern 103 may be disposed between the third isolation trench 93 and the fifth isolation trench 95. A fourth selection line isolation pattern 104 may be disposed between the fifth isolation trench 95 and the second isolation trench 92. Each of the plurality of selection line isolation patterns 101 to 104 may cross the cell region CE and extend into the connection region EX. Each of the plurality of selection line isolation patterns 101 to 104 may completely cross the upper stack structure 70. Each of the plurality of selection line isolation patterns 101 to 104 may be formed to pass vertically through the upper stack structure 70. Each of the plurality of selection line isolation patterns 101 to 104 may have a smaller length than that of each of the first isolation trench 91 and the second isolation trench 92.

FIGS. 3 to 10 are perspective views illustrating some components of FIG. 1.

Referring to FIGS. 1 to 4, each of the plurality of channel structures 80 and the plurality of support structures 80D may be formed to pass vertically through the upper stack structure 70. The plurality of isolation trenches 91 to 95 and the plurality of selection line isolation patterns 101 to 104 may be formed to pass vertically through the upper stack structure 70.

Figure 3:
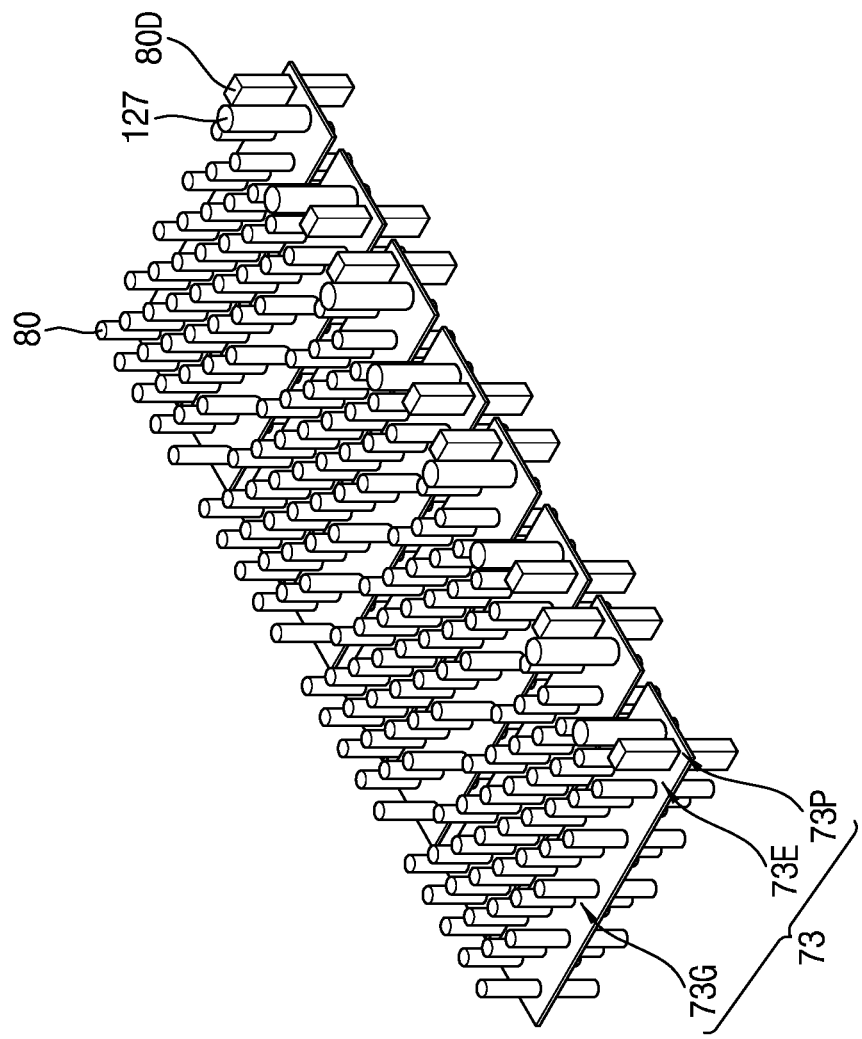
FIGS. 3 to 10 are perspective views illustrating some components of FIG. 1.
Figure 4:
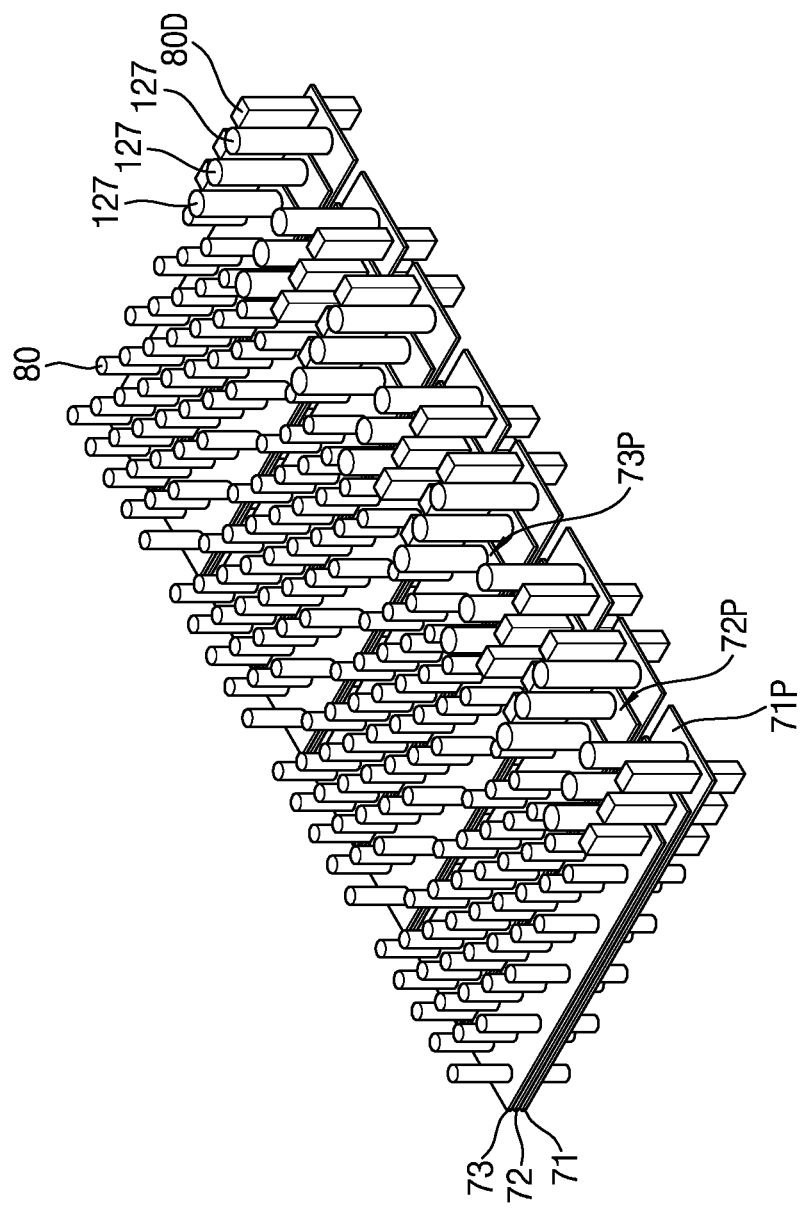

The upper stack structure 70 may include a first upper interconnection layer 71, a second upper interconnection layer 72 disposed on the first upper interconnection layer 71, and a third upper interconnection layer 73 disposed on the second upper interconnection layer 72. As shown in FIG. 3, the third upper interconnection layer 73 may include an upper gate line 73G, an upper extension line 73E, and an upper pad 73P. The upper gate line 73G may be disposed in the cell region CE. The upper extension line 73E and the upper pad 73P may be disposed in the connection region EX. The upper extension line 73E may be formed between the upper gate line 73G and the upper pad 73P and may continue from the upper gate line 73G and the upper pad 73P. For example, the upper extension line 73E may be extended from the upper gate line 73G to the upper pad 73P. Each of the first upper interconnection layer 71 and the second upper interconnection layer 72 may have a similar configuration to that of the third upper interconnection layer 73. The plurality of selection contact plugs 127 may be disposed on a plurality of upper pads 71P, 72P, and 73P. Each of the plurality of selection contact plugs 127 may be in contact with a top surface of a corresponding one of the plurality of upper pads 71P, 72P, and 73P.

Figure 5:
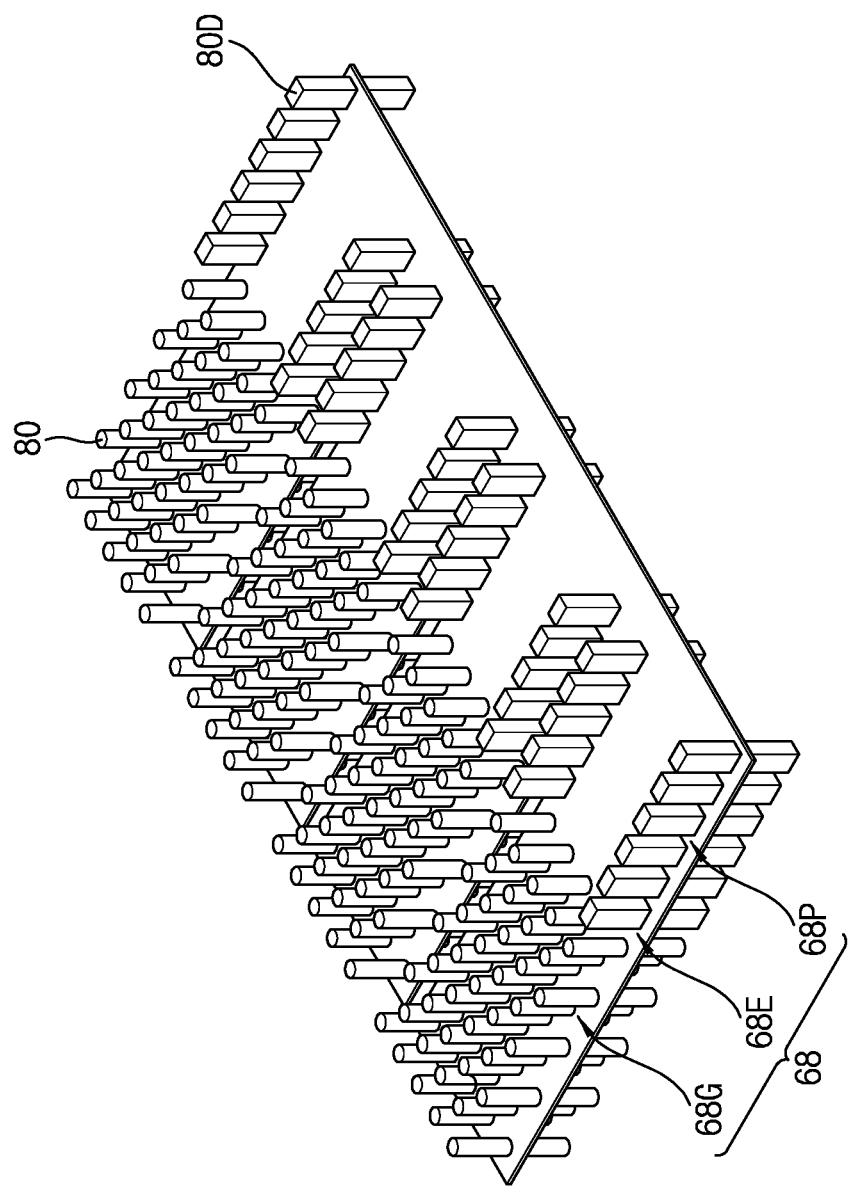
Figure 6:
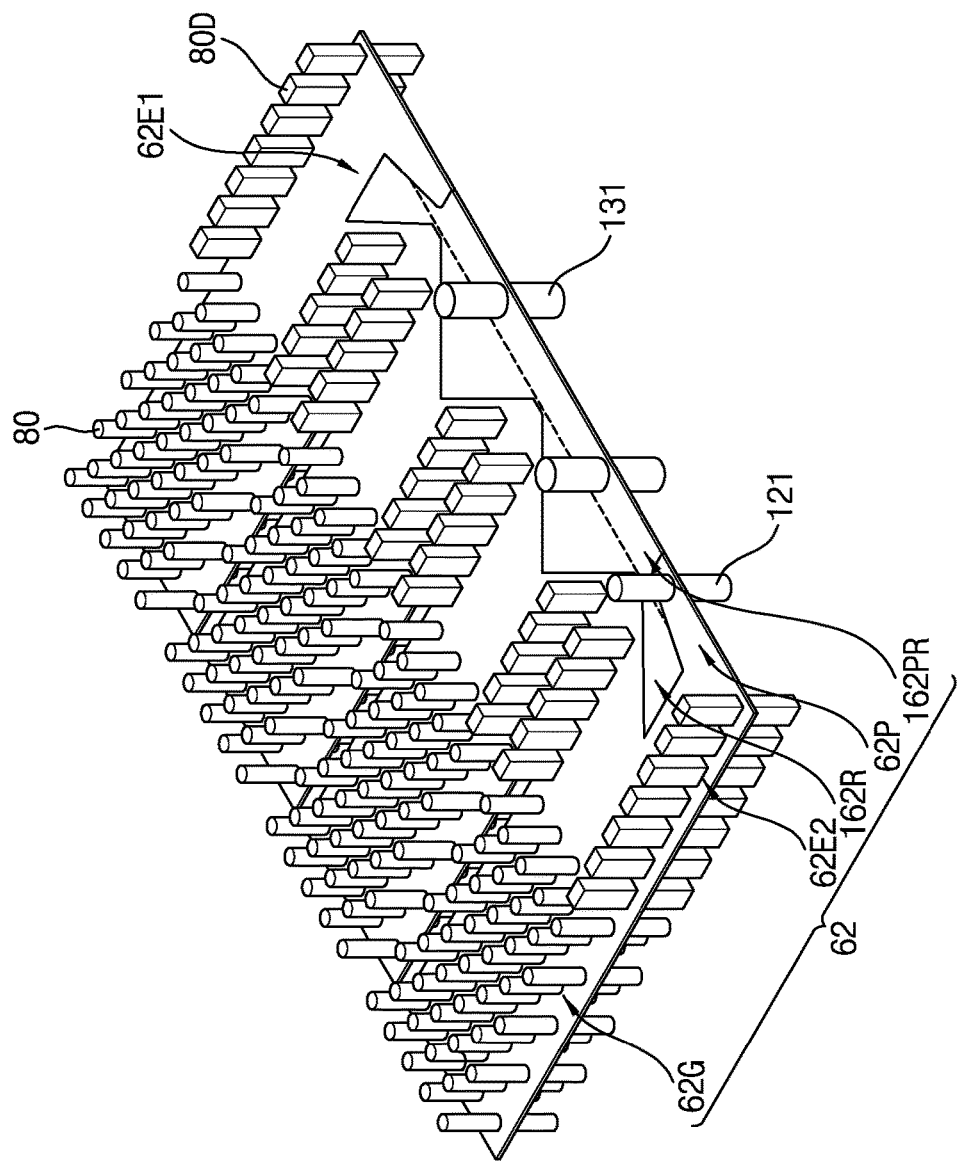
Figure 7:
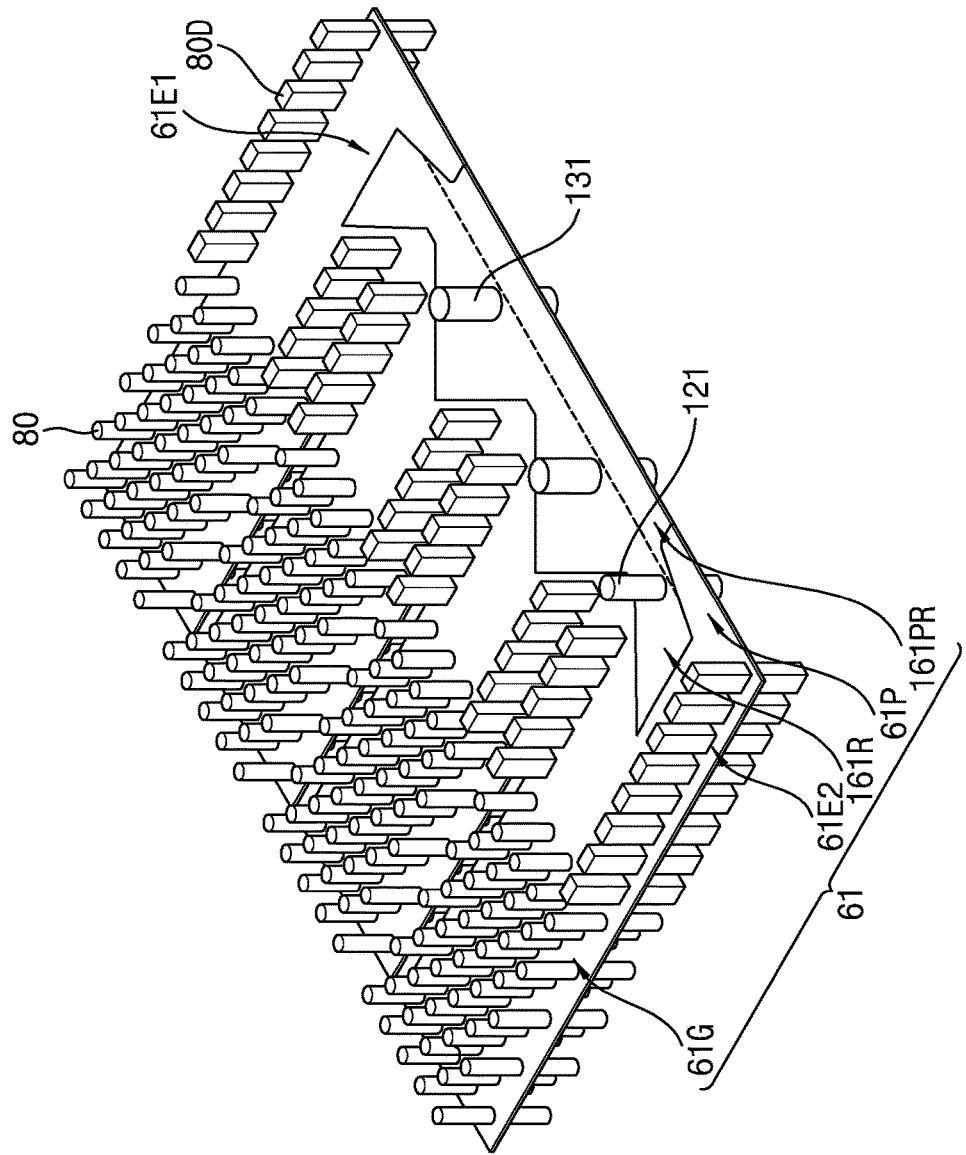
Figure 8:
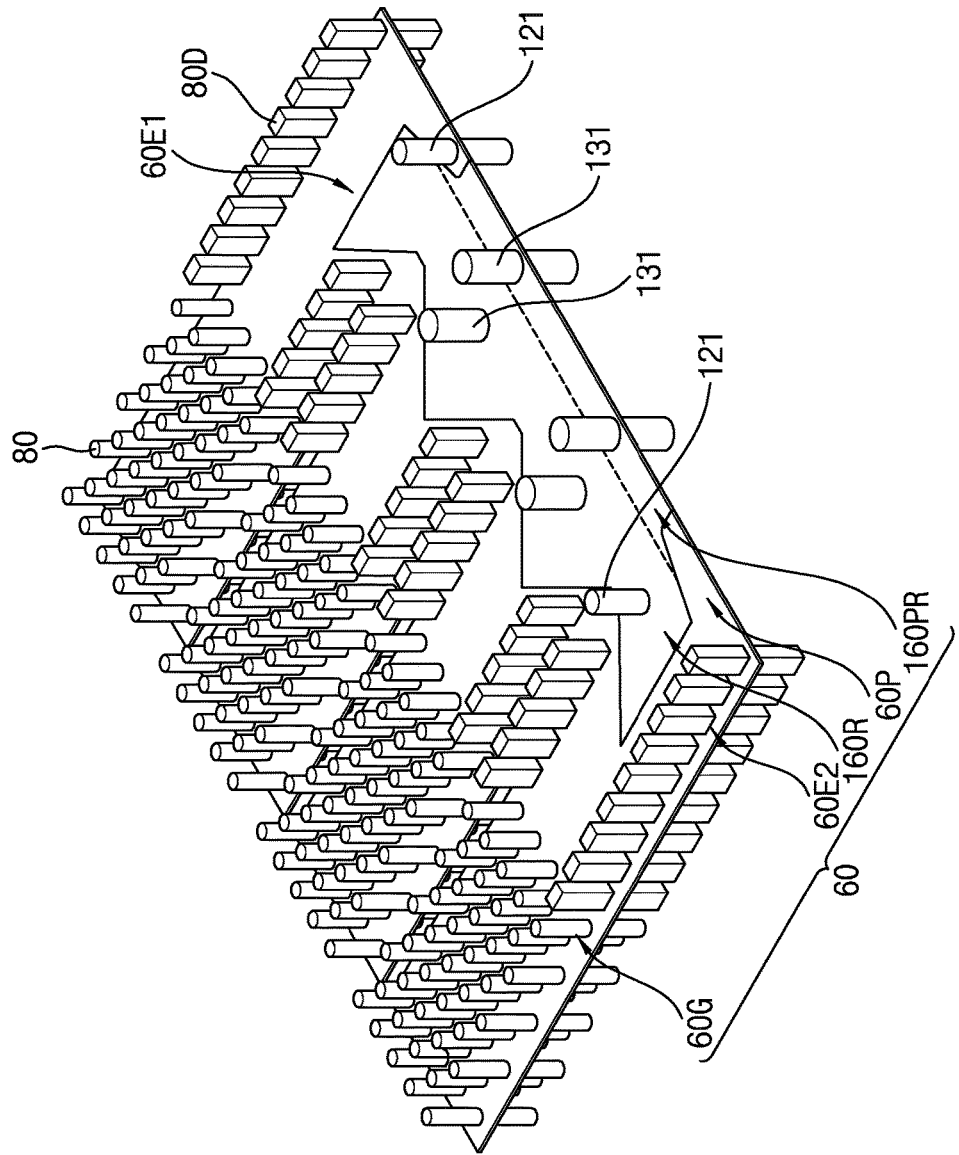

Referring to FIGS. 1, 2, and 5, the dummy interconnection layer 68 may include a dummy gate line 68G, a dummy extension line 68E, and a dummy pad 68P. The dummy gate line 68G may be disposed in the cell region CE. The dummy extension line 68E and the dummy pad 68P may be disposed in the connection region EX. In an embodiment, the dummy interconnection layer 68 may be omitted.

Referring to FIGS. 1, 2, and 6 to 10, the lower stack structure 50 may include a plurality of lower interconnection layers 51 to 62. The plurality of channel structures 80 and the plurality of support structures 80D may be formed to pass vertically through the plurality of lower interconnection layers 51 to 62. The plurality of isolation trenches 91 to 95 may be formed to pass vertically through the plurality of lower interconnection layers 51 to 62.

Figure 9:
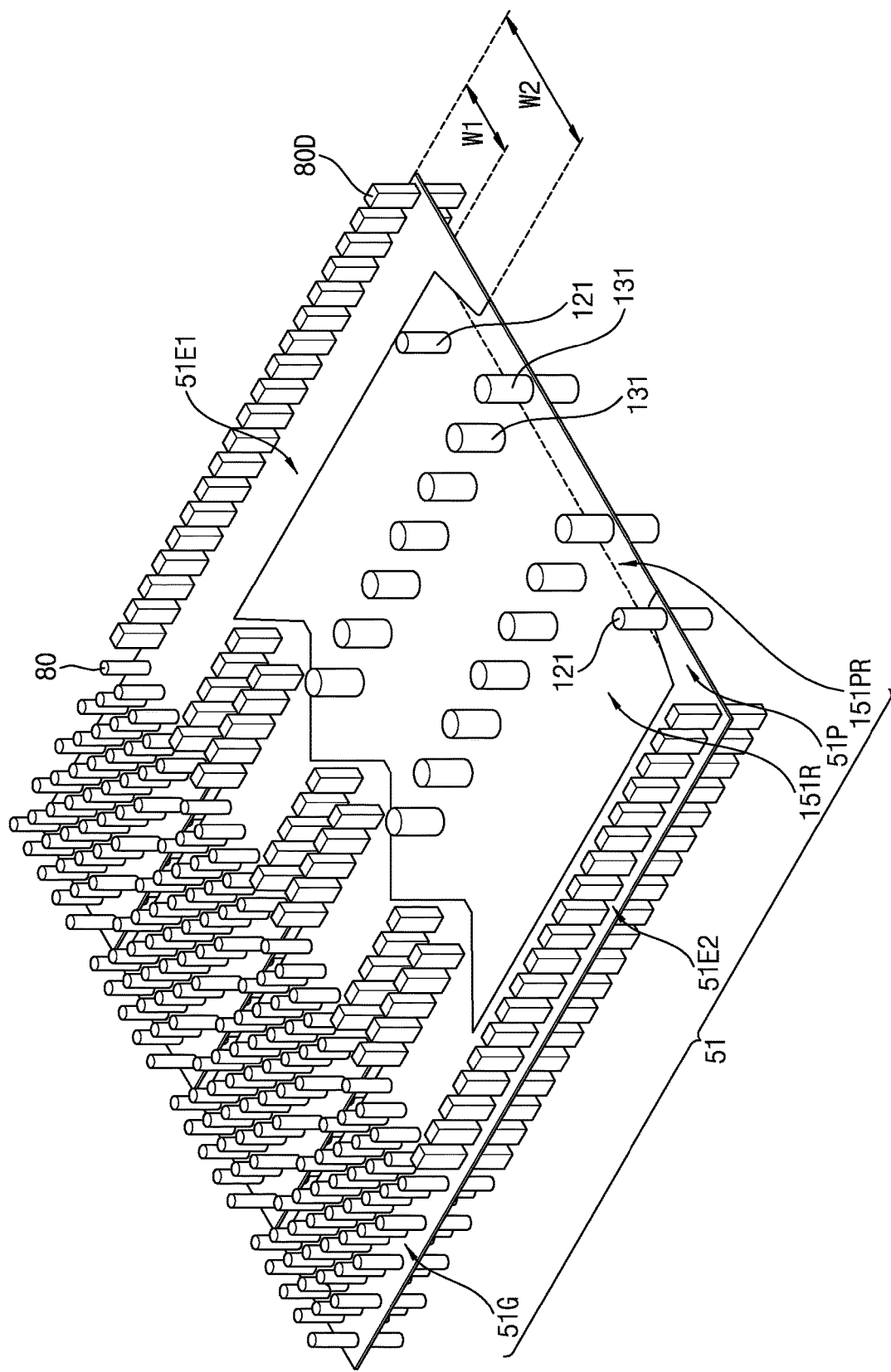
Figure 10:
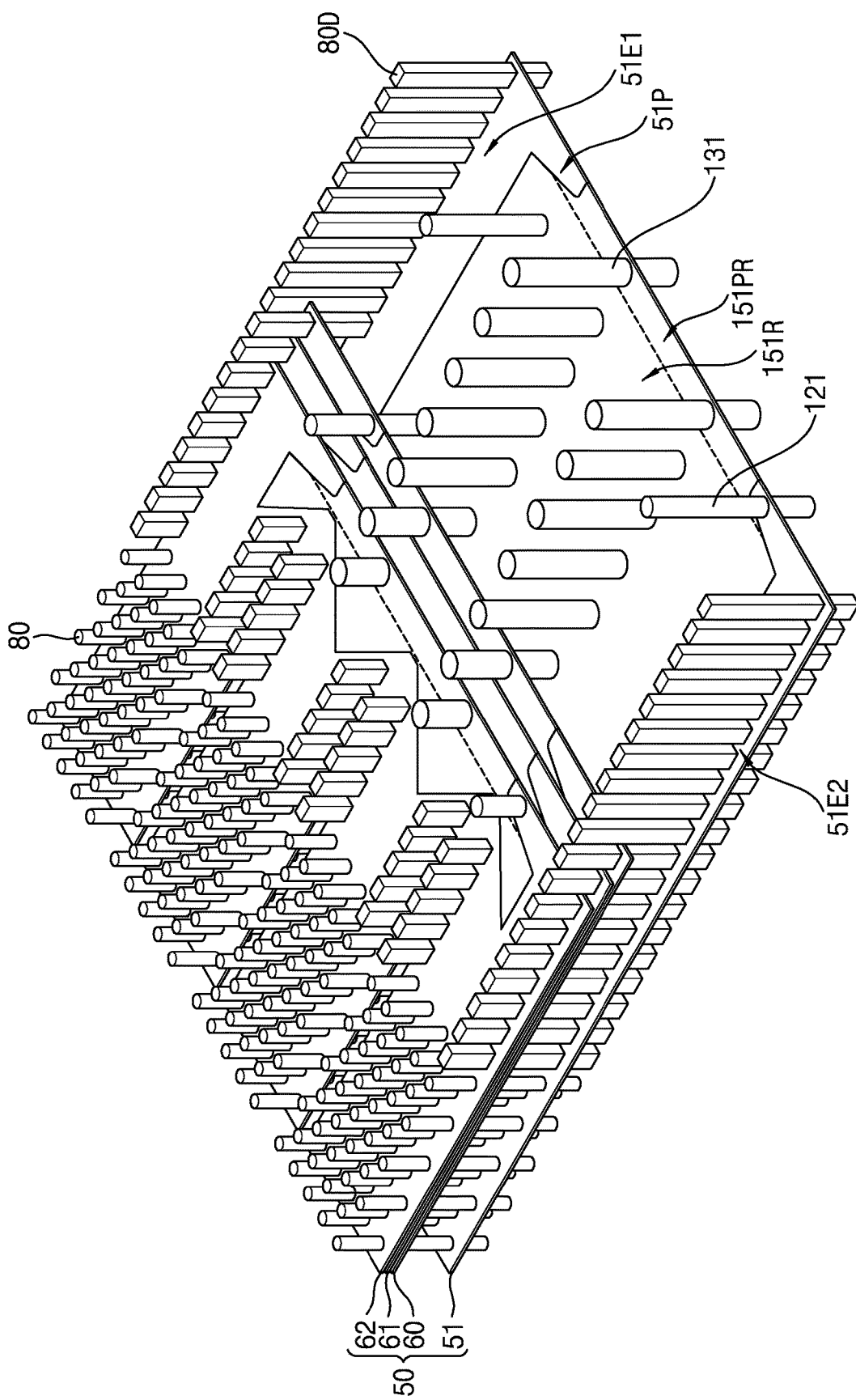

As shown in FIG. 9, a first lower interconnection layer 51 may include a lower gate line 51G, first and second lower extension lines 51E1 and 51E2, a plurality of lower pads 51P, a first lower mold pattern 151R, and a second lower mold pattern 151PR. The lower gate line 51G, the first and second lower extension lines 51E1 and 51E2, the lower pads 51P may be referred to as a lower word line. The lower gate line 51G may be disposed in the cell region CE. The first and second lower extension lines 51E1 and 51E2, the plurality of lower pads 51P, the first lower mold pattern 151R, and the second lower mold pattern 151PR may be disposed in the connection region EX. Each of the first and second lower extension lines 51E1 and 51E2 may be disposed between the lower gate line 51G and the plurality of lower pads 51P. Each of the first and second lower extension lines 51E1 and 51E2 may be in direct contact with the lower gate line 51G and the plurality of lower pads 51P. Each of the first and second lower extension lines 51E1 and 51E2 may continue from a side surface of the lower gate line 51G. For example, each of the first and second lower extension lines 51E and 51E may be extended from the side surface of the lower gate line 51G. Each of the plurality of lower pads 51P may continue from a side surface of the corresponding one of the first and second lower extension lines 51E1 and 51E2. For example, each of the plurality of lower pads 51P may be extended from a side surface of the corresponding one of the first and second lower extension lines 51E1 and 51E2 toward a side surface of the other one of the first and second lower extension lines 51E1 and 51E2.

Each of the first and second lower extension lines 51E1 and 51E2 may have a smaller lateral width than that of the lower gate line 51G. Each of the first and second lower extension lines 51E1 and 51E2 may have a first lateral width W1. Each of the plurality of lower pads 51P may have a second lateral width W2 greater than the first lateral width W1. In an embodiment, the first lower extension line 51E1 may be adjacent to the first isolation trench 91, and the second lower extension line 51E2 may be adjacent to the second isolation trench 92.

The first lower mold pattern 151R and the second lower mold pattern 151PR may constitute a lower mold pattern. The first lower mold pattern 151R and the second lower mold pattern 151PR may be disposed at substantially the same level as those of the lower gate line 51G, the first and second lower extension lines 51E1 and 51E2, and the plurality of lower pads 51P. Bottom surfaces of the first lower mold pattern 151R, the second lower mold pattern 151PR, the lower gate line 51G, the first and second lower extension lines 51E1 and 51E2, and the plurality of lower pads 51P may be substantially coplanar.

The first lower mold pattern 151R may be disposed between the first and second lower extension lines 51E1 and 51E2. The first lower mold pattern 151R may be in direct contact with side surfaces of the first and second lower extension lines 51E1 and 51E2 and side surfaces of the plurality of lower pads 51P. The first lower mold pattern 151R may have substantially the same thickness as those of the lower gate line 51G and the first and second lower extension lines 51E1 and 51E2.

The second lower mold pattern 151PR may be in direct contact with side surfaces of the first lower mold pattern 151R and the lower pad 51P. The second lower mold pattern 151PR may include a material having a higher etch rate than the first lower mold pattern 151R. The second lower mold pattern 151PR may have substantially the same thickness as those of the plurality of lower pads 51P. In an embodiment, the second lower mold pattern 151PR may continue or be extended from the side surface of the first lower mold pattern 151R. The second lower mold pattern 151PR may have substantially the same thickness as that of the first lower mold pattern 151R.

In an embodiment, the second lower mold pattern 151PR and the plurality of lower pads 51P may be thicker than the first lower mold pattern 151R and the first and second lower extension lines 51E1 and 51E2.

Referring to FIGS. 6 to 10, as described above with reference to FIG. 9, each of the plurality of lower interconnection layers 51 to 62 may include a corresponding one of a plurality of lower gate lines 51G, 60G, 61G, and 62G, a corresponding at least one of a plurality of first and second lower extension lines 51E1, 51E2, 60E1, 60E2, 61E1, 61E2, 62E1, and 62E2, a corresponding at least one of a plurality of lower pads 51P, 60P, 61P, and 62P, a corresponding one of a plurality of first lower mold patterns 151R, 160R, 161R, and 162R, and a corresponding one of a plurality of second lower mold patterns 151PR, 160PR, 161PR, and 162PR.

Each of the plurality of cell contact plugs 121 may be formed to pass through the corresponding one of the plurality of lower pads 51P, 60P, 61P, and 62P and formed to pass vertically through the corresponding some of the plurality of first lower mold patterns 151R, 160R, 161R, and 162R. Each of the plurality of through electrodes 131 may be formed to pass through the corresponding one of the plurality of second lower mold patterns 151PR, 160PR, 161PR, and 162PR and formed to pass vertically through the corresponding some of the plurality of first lower mold patterns 151R, 160R, 161R, and 162R.

Figure 11:
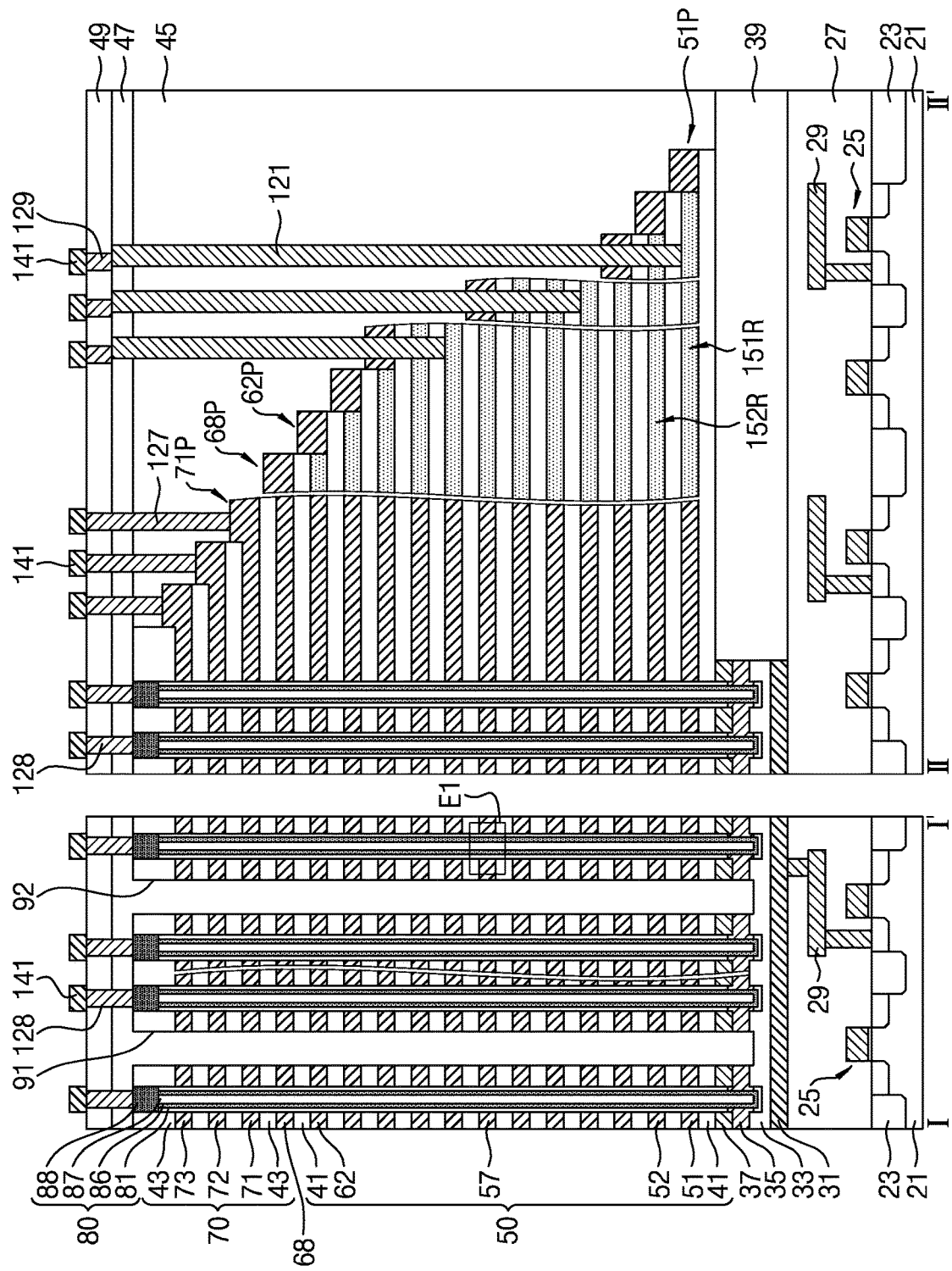
FIG. 11 is a cross-sectional view taken along lines I-I' and II-II' of FIG. 1.

FIG. 11 is a cross-sectional view taken along lines I-I' and II-II' of FIG. 1. The semiconductor device according to the example embodiment of the inventive concept may be interpreted as including a cell on peripheral (COP) structure.

Referring to FIG. 11, the semiconductor device according to the example embodiment of the inventive concept may include a substrate 21, a device isolation layer 23, a plurality of transistors 25, a lower interlayer insulating layer 27, a plurality of peripheral circuit interconnections 29, a lower buried conductive layer 31, a middle buried conductive layer 33, a replacement conductive line 35, a support plate 37, a middle interlayer insulating layer 39, an upper interlayer insulating layer 45, a first insulating layer 47, a second insulating layer 49, a lower stack structure 50, a dummy interconnection layer 68, an upper stack structure 70, a plurality of channel structures 80, a first isolation trench 91, a second isolation trench 92, a plurality of cell contact plugs 121, a plurality of selection contact plugs 127, a plurality of bit plugs 128, a plurality of upper plugs 129, and a plurality of upper circuit interconnections 141.

The lower stack structure 50 may include a plurality of lower insulating layers 41 and a plurality of lower interconnection layers 51 to 62, which are alternately and repeatedly stacked. The upper stack structure 70 may include a plurality of upper insulating layers 43 and a plurality of upper interconnection layers 71, 72, and 73, which are alternately and repeatedly stacked. Each of the plurality of channel structures 80 may include an information storage pattern 81, a channel pattern 86, a core pattern 87, and a bit pad 88. The plurality of channel structures 80 may be formed to pass vertically through the upper stack structure 70, the dummy interconnection layer 68, the lower stack structure 50, the support plate 37, and the replacement conductive line 35 and to penetrate into the middle buried conductive layer 33.

Each of the plurality of cell contact plugs 121 may be connected to the corresponding one of the plurality of lower interconnection layers 51 to 62. Each of the plurality of cell contact plugs 121 may be in contact with the corresponding at least one of a plurality of lower pads 51P to 62P. In an exemplary embodiment, each of the plurality of cell contact plugs 121 may be in contact with one corresponding lower pad of the lower pads 51P to 62P. Each of the plurality of cell contact plugs 121 may be formed to pass through the first insulating layer 47 and the upper interlayer insulating layer 45, formed to pass through the corresponding at least one of a plurality of lower pads 51P and 62P, formed to pass through the corresponding at least one of a plurality of first lower mold patterns 151R to 162R, and formed to pass through the corresponding at least one of the plurality of lower insulating layers 41. Each of the plurality of selection contact plugs 127 may be connected to a corresponding upper interconnection layer of the plurality of upper interconnection layers 71, 72, and 73. Each of the plurality of selection contact plugs 127 may be formed to pass through the second insulating layer 49, the first insulating layer 47, and the upper interlayer insulating layer 45 and to be in contact with the corresponding one of a plurality of upper pads 71P to 73P.

In an embodiment, each of the plurality of selection contact plugs 127 may have a greater lateral width that of each of the plurality of bit plugs 128.

Figure 12:
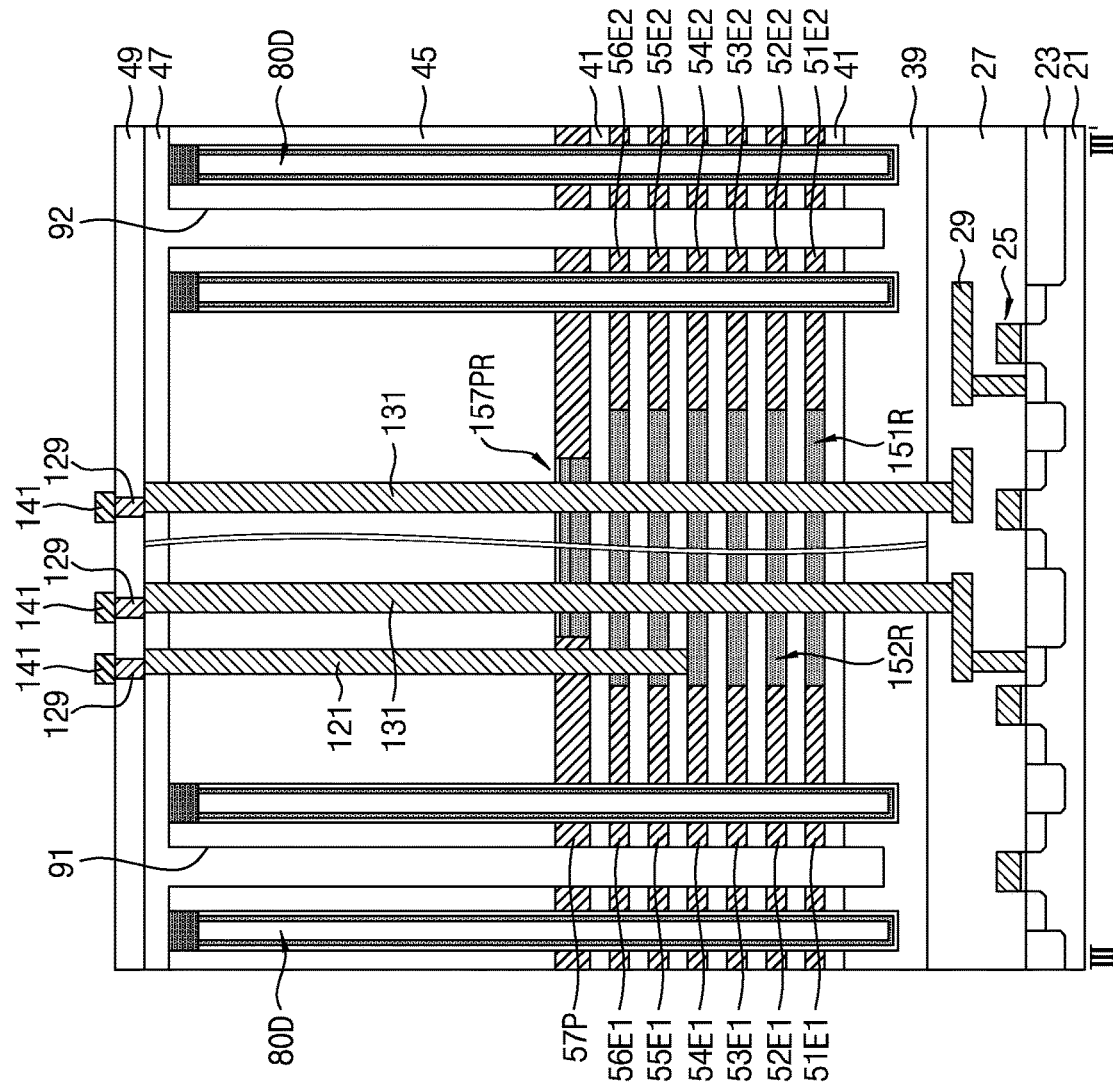
FIG. 12 is a cross-sectional view taken along line of III-III' FIG. 1.

FIG. 12 is a cross-sectional view taken along line of FIG. 1. Referring to FIG. 12, a device isolation layer 23, a plurality of transistors 25, a lower interlayer insulating layer 27, a plurality of peripheral circuit interconnections 29, a middle interlayer insulating layer 39, a plurality of lower insulating layers 41, an upper interlayer insulating layer 45, a first insulating layer 47, a second insulating layer 49, a plurality of first and second lower extension lines 51E1, 51E2, 52E1, 52E2, 53E1, 53E2, 54E1, 54E2, 55E1, 55E2, 56E1, and 56E2, a seventh lower pad 57P, a plurality of first lower mold patterns 151R and 152R, a second lower mold pattern 157PR, a plurality of support structures 80D, a first isolation trench 91, a second isolation trench 92, a cell contact plug 121, a plurality of upper plugs 129, a plurality of through electrodes 131, and a plurality of upper circuit interconnections 141 may be disposed on a substrate 21.

Each of the plurality of through electrodes 131 may be formed to pass through the first insulating layer 47 and the upper interlayer insulating layer 45, formed to pass through the second lower mold pattern 157PR, formed to pass through the plurality of lower insulating layers 41 and the plurality of first lower mold patterns 151R and 152R, formed to pass through the middle interlayer insulating layer 39, and formed to pass partially through the lower interlayer insulating layer 27 and be in contact with a top surface of the corresponding one of the plurality of peripheral circuit interconnections 29. The middle interlayer insulating layer 39 may include a plurality of insulating layers. For example, the middle interlayer insulating layer 39 may include at least one silicon nitride layer disposed between a plurality of silicon oxide layers. The cell contact plugs 121 may be formed to pass through the first insulating layer 47 and the upper interlayer insulating layer 45, formed to pass through the seventh lower pad 57P, formed to pass through the corresponding two of the plurality of first lower mold patterns 151R and 152R beneath the seventh lower pad 57, and formed to pass through the corresponding three of the plurality of lower insulating layers 41 beneath the seventh lower pad 57.

Figure 13:
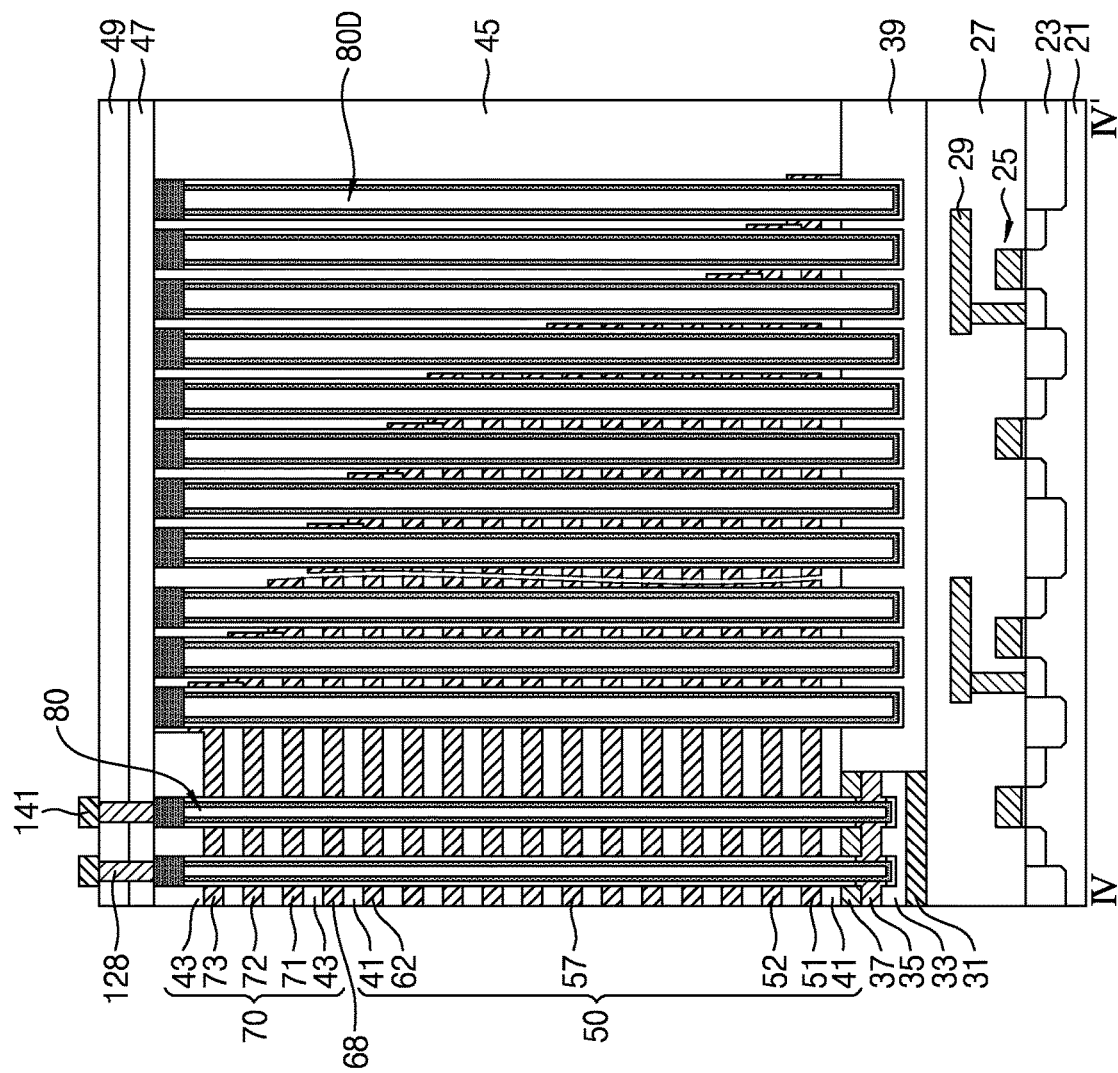
FIG. 13 is a cross-sectional view taken along line IV-IV' of FIG. 1.
Figure 18:
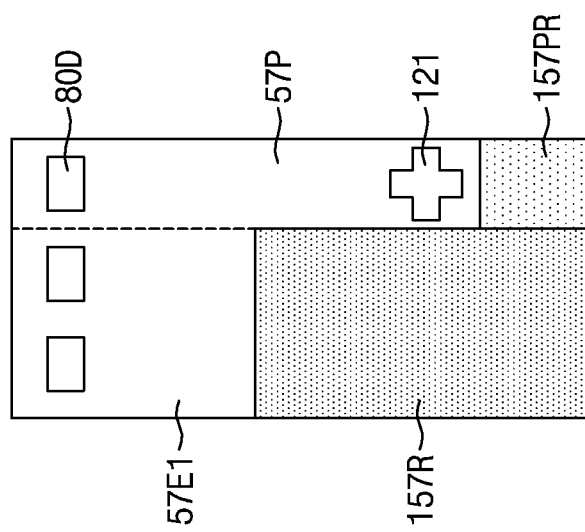
FIGS. 18 to 21 are enlarged views illustrating a portion of FIG. 1.
Figure 19:
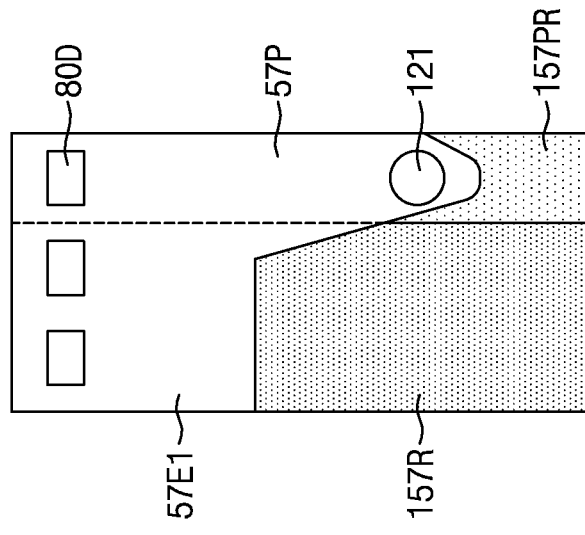
Figure 20:
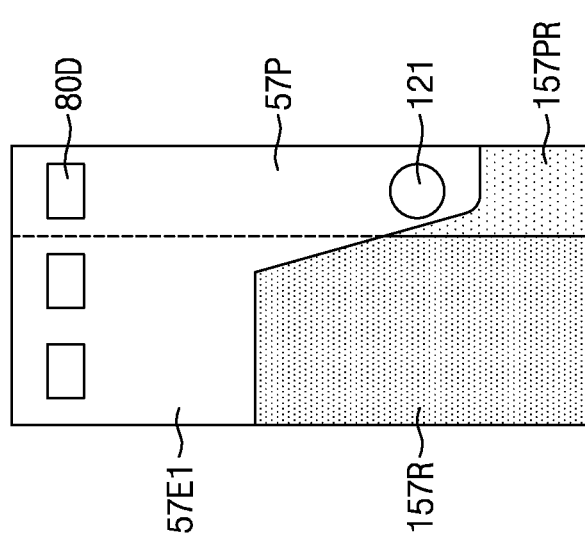

FIG. 13 is a cross-sectional view taken along line IV-IV' of FIG. 1. Referring to FIG. 13, a middle interlayer insulating layer 39, an upper interlayer insulating layer 45, a lower stack structure 50, a dummy interconnection layer 68, an upper stack structure 70, a plurality of channel structures 80, a plurality of support structures 80D, a plurality of bit plugs 128, and a plurality of upper circuit interconnections 141 may be disposed on a substrate 21. Each of the plurality of support structures 80D may have a configuration similar to the plurality of channel structures 80. The plurality of support structures 80D may be formed to pass through the upper interlayer insulating layer 45, the upper stack structure 70, the dummy interconnection layer 68, and the lower stack structure 50 and to penetrate into the middle interlayer insulating layer 39.

Referring back to FIGS. 1 to 13, the semiconductor device, which secures an efficient process margin for mass production, is advantageous for high integration, and has excellent electrical properties, may be implemented due to configurations of the plurality of lower gate lines 51G, 60G, 61G, and 62G, the plurality of first and second lower extension lines 51E1, 51E2, 60E1, 60E2, 61E1, 61E2, 62E1, and 62E2, the plurality of lower pads 51P, 60P, 61P, and 62P, the plurality of first lower mold patterns 151R, 160R, 161R, and 162R, the plurality of second lower mold patterns 151PR, 160PR, 161PR, and 162PR, the plurality of cell contact plugs 121, and the plurality of through electrodes 131.

FIGS. 14 and 15 are enlarged cross-sectional views illustrating portion E1 of FIG. 11. Referring to FIG. 14, the information storage pattern 81 may include a tunnel insulating layer 82, a charge storage layer 83, and a first blocking layer 84. Referring to FIG. 15, the information storage pattern 81 may include a tunnel insulating layer 82, a charge storage layer 83, a first blocking layer 84, and a second blocking layer 85.

FIGS. 16 and 17 are enlarged views illustrating a portion of FIG. 1. Referring to FIG. 16, a minimum lateral distance between the plurality of channel structures 80 may be a first distance d1. A minimum lateral distance between the plurality of support structures 80D may be a second distance d2. The second distance d2 may be smaller than or equal to the first distance d1. Referring to FIGS. 16 and 17, when viewed from above, each of a plurality of selection contact plugs 127 may have various shapes such as a circular shape, a cross shape, or a combination thereof.

Figure 22:
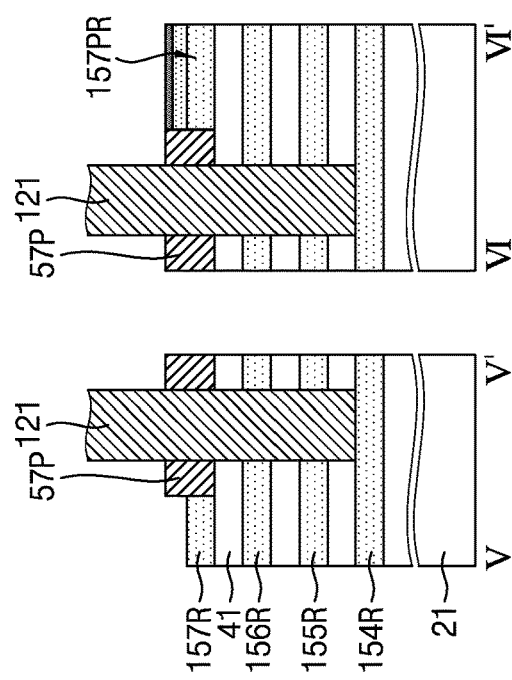
FIG. 22 is a cross-sectional view taken along lines V-V', VI-VI', and VII-VII' of FIG. 21.
Figure 21:
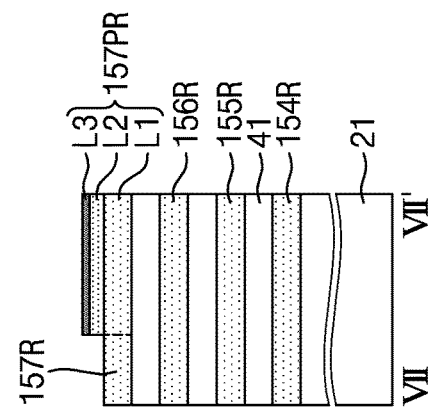

FIGS. 18 to 21 are enlarged views illustrating a portion of FIG. 1, and FIG. 22 is a cross-sectional view taken along lines V-V', VI-VI', and VII-VII' of FIG. 21.

Referring to FIGS. 18 to 21, when viewed from above, a lower pad 57P may have various shapes such as a circular shape, a tetragonal shape, an inclined shape, a shape biased in one direction, or a combination thereof. When viewed from above, the cell contact plugs 121 may have various shapes such as a circular shape, a cross shape, or a combination thereof.

Referring to FIGS. 21 and 22, a plurality of lower insulating layers 41 and a plurality of first lower mold patterns 154R, 155R, 156R, and 157R may be alternately and repeatedly stacked on a substrate 21. A lower pad 57P may be provided on an uppermost layer of the plurality of lower insulating layers 41 and disposed at the same level as that of one first lower mold pattern 157R among the plurality of first lower mold patterns 154R, 155R, 156R, and 157R. A second lower mold pattern 157PR may be disposed on the uppermost layer of the plurality of lower insulating layers 41 and be in contact with a side surface of the lower pad 57P. The second lower mold pattern 157PR may include a first layer L1, a second layer L2 disposed on the first layer L1, and a third layer L3 disposed on the second layer L2. The first layer L1 may continue or may be extended from a side surface of one first lower mold pattern 157R among the plurality of first lower mold patterns 154R, 155R, 156R, and 157R and have substantially the same thickness and material as those of one first lower mold pattern 157R. The second layer L2 may have a higher etch rate than the first layer L1. The third layer L3 may have a lower etch rate than that of the first layer L1.

The second lower mold pattern 157PR may be thicker than one first lower mold pattern 157R among the plurality of first lower mold patterns 154R, 155R, 156R, and 157R. One first lower mold pattern 157R among the plurality of first lower mold patterns 154R, 155R, 156R, and 157R may be in direct contact with side surfaces of a first lower extension line 57E1 and the lower pad 57P. The second lower mold pattern 157PR may be in direct contact with a side surface of one first lower mold pattern 157R among the plurality of first lower mold patterns 154R, 155R, 156R, and 157R and the side surface of the lower pad 57P. The second lower mold pattern 157PR may have substantially the same thickness as that of the lower pad 57P. A cell contact plug 121 may be formed to pass through the lower pad 57P and formed to pass through at least some lower insulating layers 41 and first lower mold patterns 155R and 156R among the plurality of lower insulating layers 41 and the plurality of first lower mold patterns 154R, 155R, 156R, and 157R.

In an embodiment, the plurality of lower insulating layers 41 may include silicon oxide, and the plurality of first lower mold patterns 154R, 155R, 156R, and 157R may include silicon nitride. The first layer L1 of the second lower mold pattern 157PR may include a silicon nitride layer, which is formed at substantially the same time as that of an uppermost pattern 157R of the plurality of first lower mold patterns 154R, 155R, 156R, and 157R. The second layer L2 of the second lower mold pattern 157PR may include silicon nitride having a higher etch rate than the first layer L1. The third layer L3 of the second lower mold pattern 157PR may include silicon nitride having a lower etch rate than the first layer L1.

Figure 23:
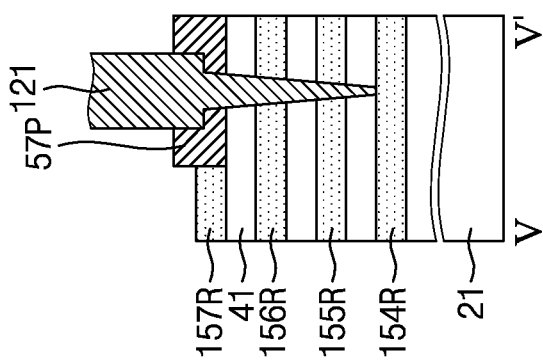
FIGS. 23 to 25 are cross-sectional views taken along line V-V' of FIG. 21.
Figure 24:
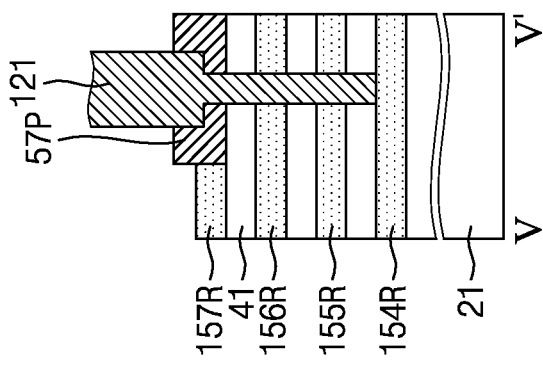
Figure 25:
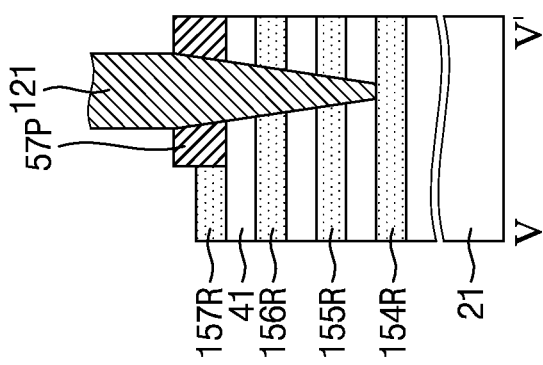

FIGS. 23 to 25 are cross-sectional views taken along line V-V' of FIG. 21. Referring to FIGS. 23 to 25, cross-sections of a cell contact plug 121 and a lower pad 57P may have various shapes depending on process conditions.

FIG. 26 is a cross-sectional view taken along lines V-V', VI-VI', and VII-VII' of FIG. 21.

Referring to FIG. 26, a second lower mold pattern 157PR may have substantially the same thickness as that of one first lower mold pattern 157R among a plurality of first lower mold patterns 154R, 155R, 156R, and 157R. The second lower mold pattern 157PR may be formed in a layer, which is formed of the same material at the same time as those of one first lower mold pattern 157R among the plurality of first lower mold patterns 154R, 155R, 156R, and 157R, using an ion implantation process, a plasma processing process, or a combination thereof. The second lower mold pattern 157PR may have substantially the same thickness as that of the lower pad 57P. The lower pad 57P may have substantially the same thickness as that of one first lower mold pattern 157R among the plurality of first lower mold patterns 154R, 155R, 156R, and 157R.

In an embodiment, the plurality of lower insulating layers 41 may include silicon oxide, and the plurality of first lower mold patterns 154R, 155R, 156R, and 157R may include silicon nitride. The second lower mold pattern 157PR may be formed in a silicon nitride layer, which is formed at the same time as that of one first lower mold pattern 157R among the plurality of first lower mold patterns 154R, 155R, 156R, and 157R, using an ion implantation process, a plasma processing process, or a combination thereof.

Figure 28:
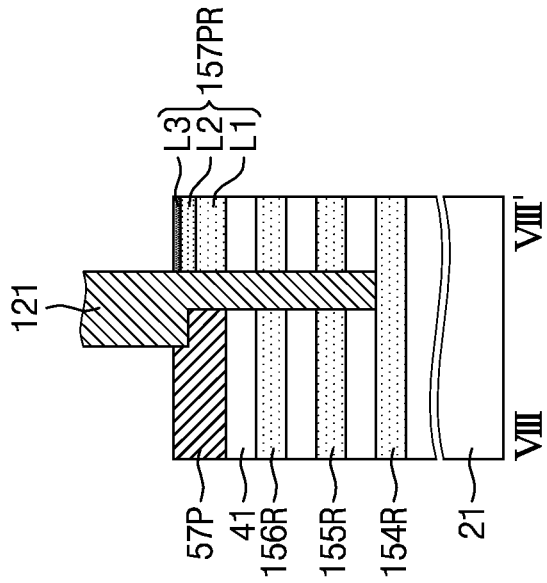
FIGS. 28 and 29 are cross-sectional views taken along line VIII-VIII' of FIG. 27.
Figure 29:
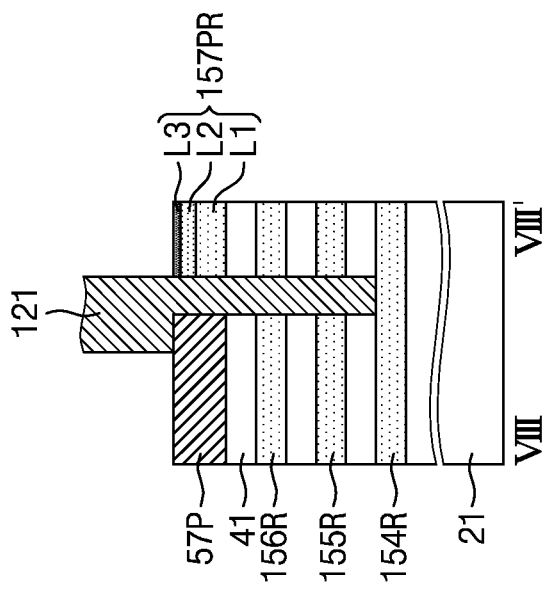

FIG. 27 is an enlarged view illustrating a portion of FIG. 1, and FIGS. 28 and 29 are cross-sectional views taken along line VIII-VIII' of FIG. 27. Referring to FIGS. 27 to 29, a cell contact plug 121 may partially overlap a lower pad 57P. A portion of the cell contact plug 121 may be formed to pass through a portion of a second lower mold pattern 157PR.

Figure 30:
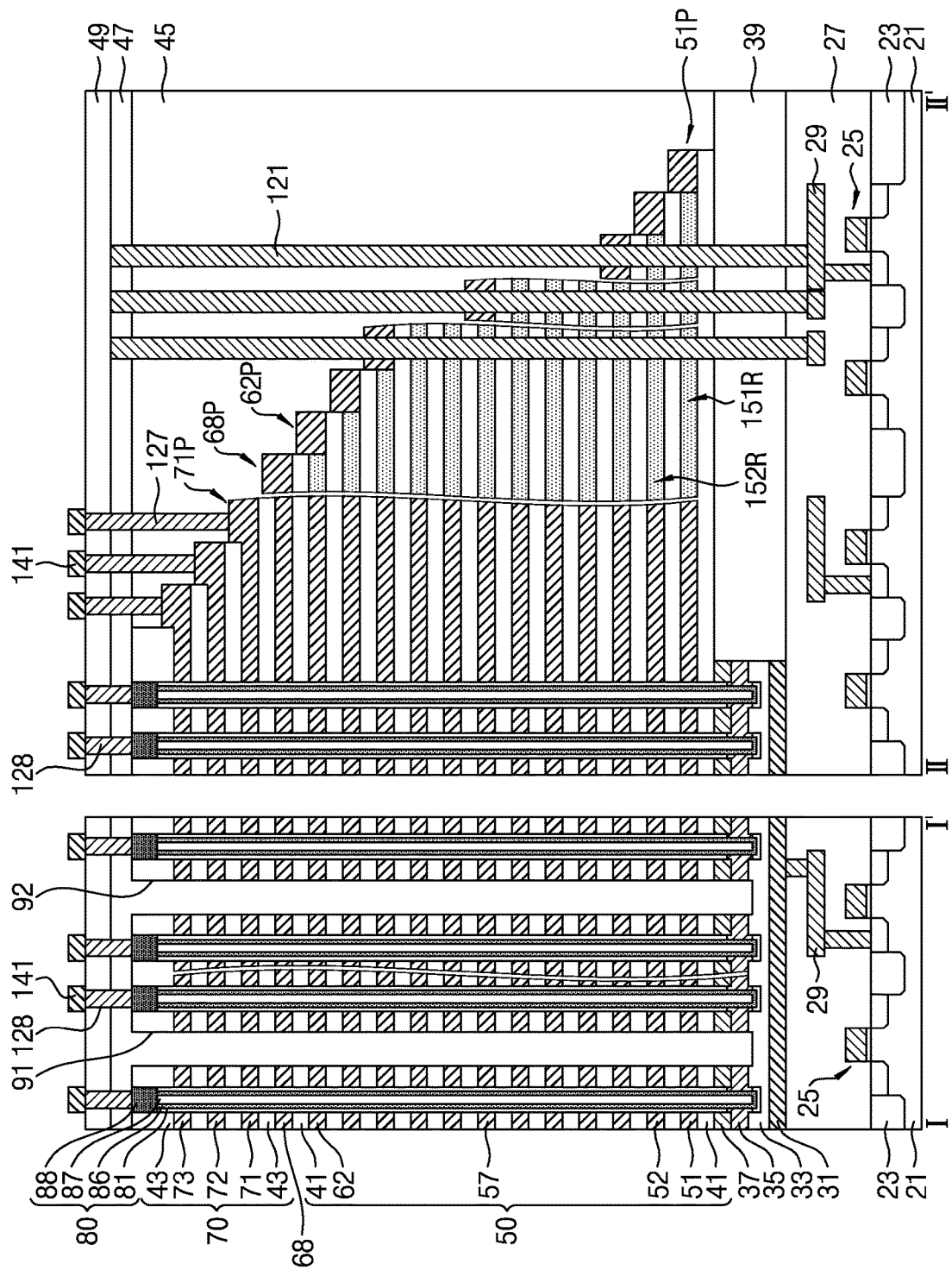
FIG. 30 is a cross-sectional view taken along lines I-I' and II-II' of FIG. 1.

FIG. 30 is a cross-sectional view taken along lines I-I' and II-II' of FIG. 1.

Referring to FIGS. 1 and 30, each of a plurality of cell contact plugs 121 may be formed to pass through a corresponding one of a plurality of lower pads 51P to 62P, formed to pass through a corresponding some of a plurality of lower insulating layers 41, formed to pass through a corresponding some of a plurality of first lower mold patterns 151R, 152R, . . . , formed to pass through a middle interlayer insulating layer 39, and formed to pass partially through a lower interlayer insulating layer 27, and be in direct contact with a corresponding one of a plurality of peripheral circuit interconnections 29.

Figure 31:
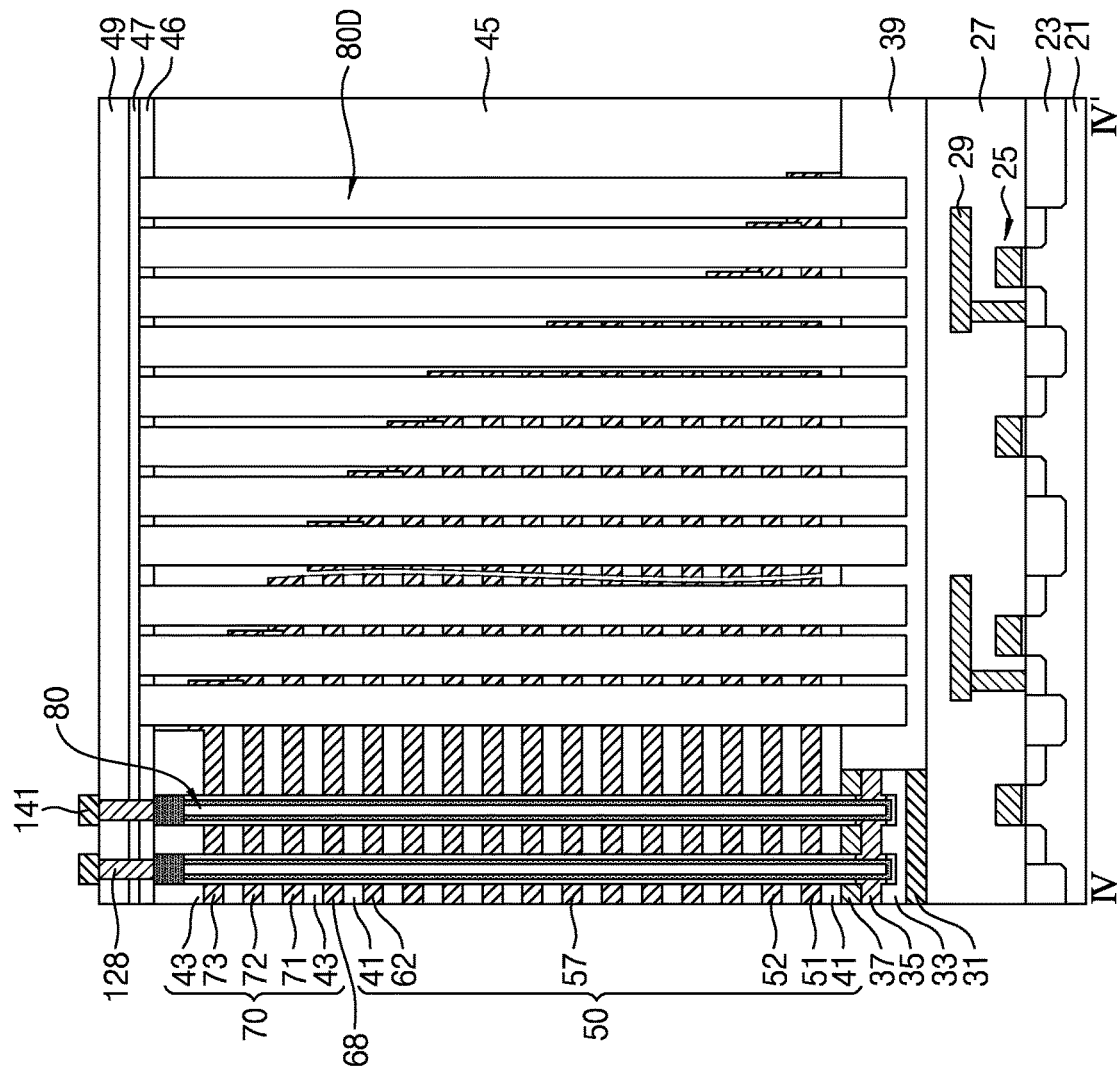
FIG. 31 is a cross-sectional view taken along line IV-IV' of FIG. 1.

FIG. 31 is a cross-sectional view taken along line IV-IV' of FIG. 1.

Referring to FIGS. 1 and 31, a plurality of support structures 80D may be formed of only an insulating layer, such as a silicon oxide layer, unlike a plurality of channel structures 80. In an embodiment, lower ends of the plurality of support structures 80D may be formed at a lower level than lower ends of the plurality of channel structures 80. Upper ends of the plurality of support structures 80D may be formed at a higher level than upper ends of the plurality of channel structures 80. A third insulating layer 46 may be formed on an upper stack structure 70. The third insulating layer 46 may be disposed between the upper stack structure 70 and a first insulating layer 47 and between an upper interlayer insulating layer 45 and the first insulating layer 47. Top surfaces of the plurality of support structures 80D and the third insulating layer 46 may be substantially coplanar.

Figure 32:
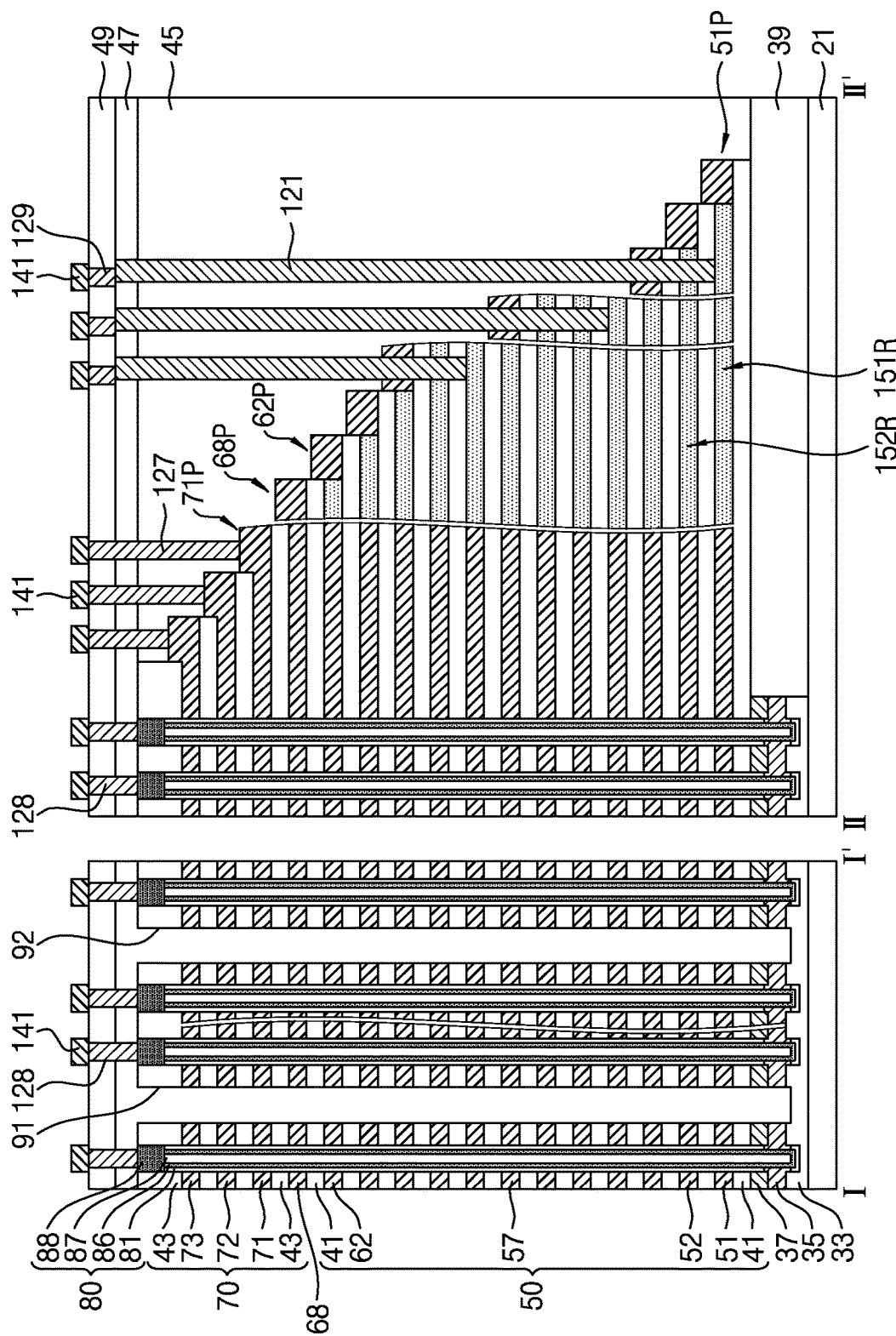
FIG. 32 is a cross-sectional view for describing a semiconductor device according to an example embodiment of the inventive concept.

FIG. 32 is a cross-sectional view for describing a semiconductor device, taken along line I-I' and II-II' of FIG. 1, according to an example embodiment of the inventive concept.

Referring to FIG. 32, a middle buried conductive layer 33, a replacement conductive line 35, a support plate 37, and a middle interlayer insulating layer 39 may be disposed on a substrate 21. Top surfaces of the middle interlayer insulating layer 39 and the support plate 37 may be substantially coplanar. A lower stack structure 50, a dummy interconnection layer 68, and an upper stack structure 70 may be sequentially stacked on the middle interlayer insulating layer 39 and the support plate 37.

Figure 33:
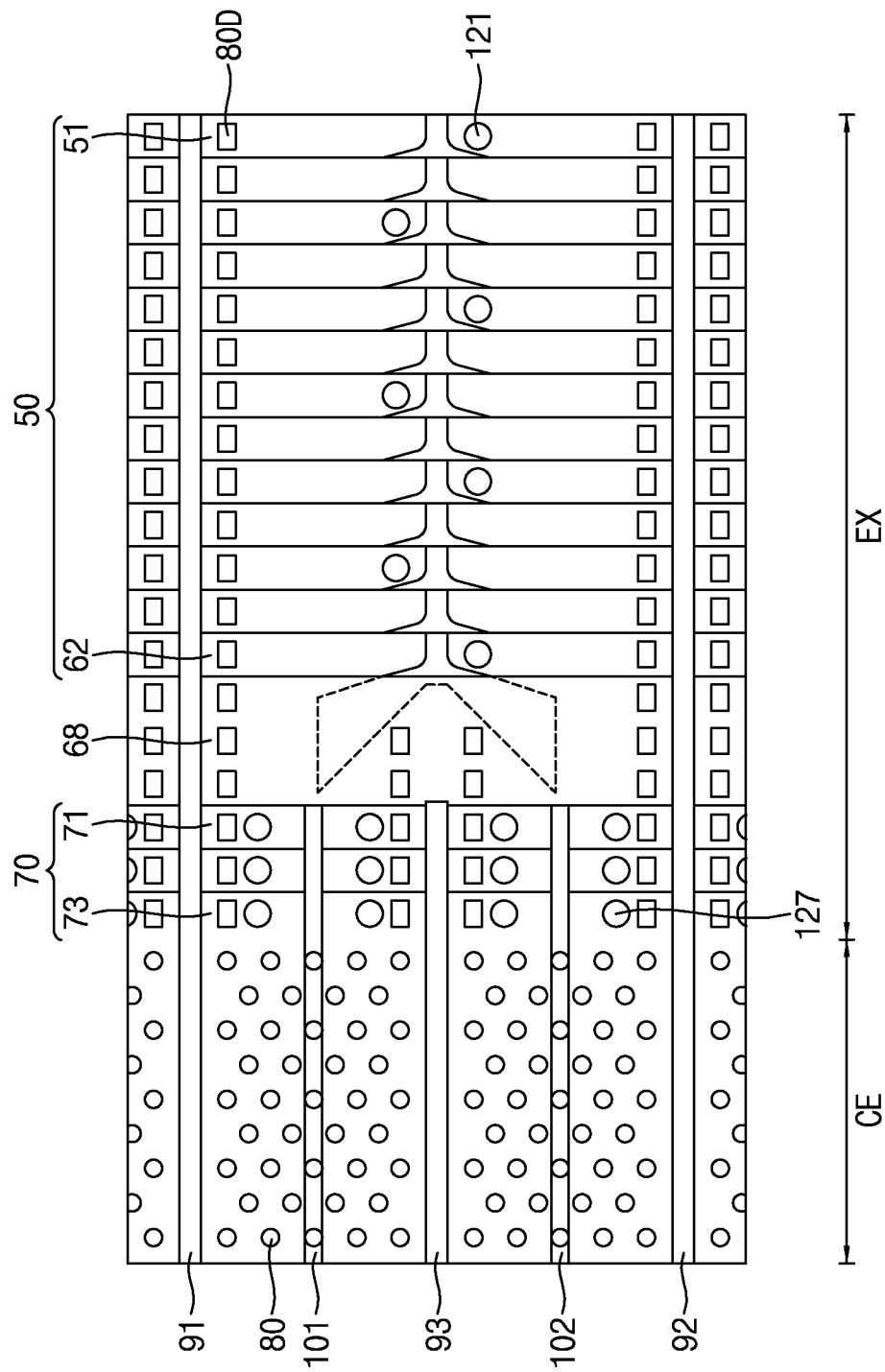
FIG. 33 is a layout for describing a semiconductor device according to an example embodiment of the inventive concept.
Figure 34:
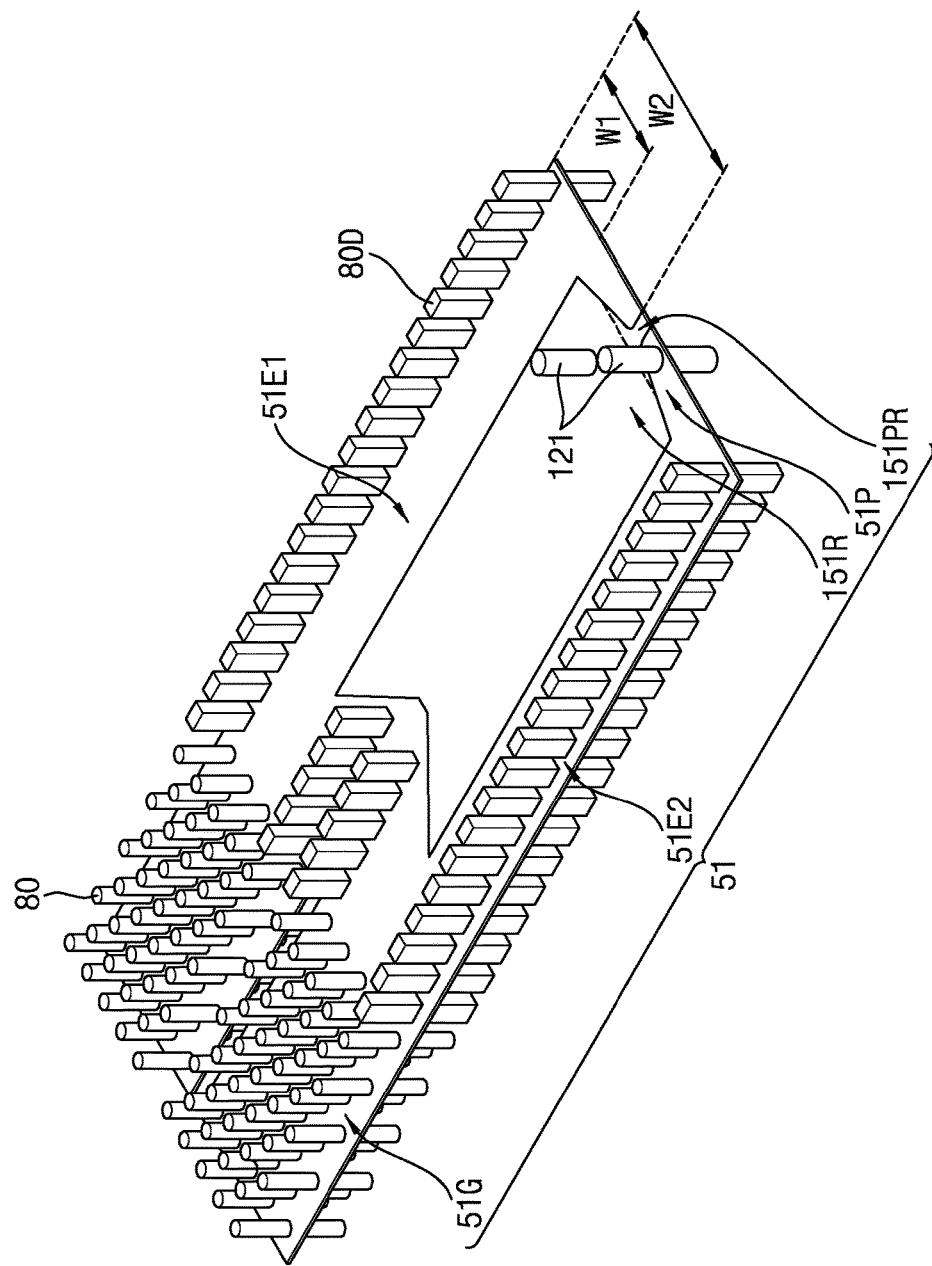
FIG. 34 is a perspective view illustrating some components of FIG. 33.

FIG. 33 is a layout for describing a semiconductor device according to an example embodiment of the inventive concept, and FIG. 34 is a perspective view illustrating some components of FIG. 33.

Referring to FIGS. 33 and 34, a lower stack structure 50, a dummy interconnection layer 68, and an upper stack structure 70 may be defined between a first isolation trench 91 and a second isolation trench 92 that face each other. Each of the first isolation trench 91 and the second isolation trench 92 may cross the cell region CE and the connection region EX. A third isolation trench 93 may be disposed between the first isolation trench 91 and the second isolation trench 92. The third isolation trench 93 may have a smaller length than that of each of the first isolation trench 91 and the second isolation trench 92. The third isolation trench 93 may cross the cell region CE and extend into the connection region EX. The third isolation trench 93 may completely cross the upper stack structure 70. The plurality of channel structures 80 may be disposed in the cell region CE. The plurality of support structures 80D, the plurality of cell contact plugs 121, and the plurality of selection contact plugs 127 may be disposed in the connection region EX. Some of the plurality of support structures 80D may be disposed adjacent to the first isolation trench 91 and the second isolation trench 92.

A first selection line isolation pattern 101 may be disposed between the first isolation trench 91 and the third isolation trench 93. A second selection line isolation pattern 102 may be disposed between the second isolation trench 92 and the third isolation trench 93. A first lower interconnection layer 51 may include a lower gate line 51G, first and second lower extension lines 51E1 and 51E2, a plurality of lower pads 51P, a first lower mold pattern 151R, and a second lower mold pattern 151PR. The second lower mold pattern 151PR may be disposed between the plurality of lower pads 51P.

Figure 35:
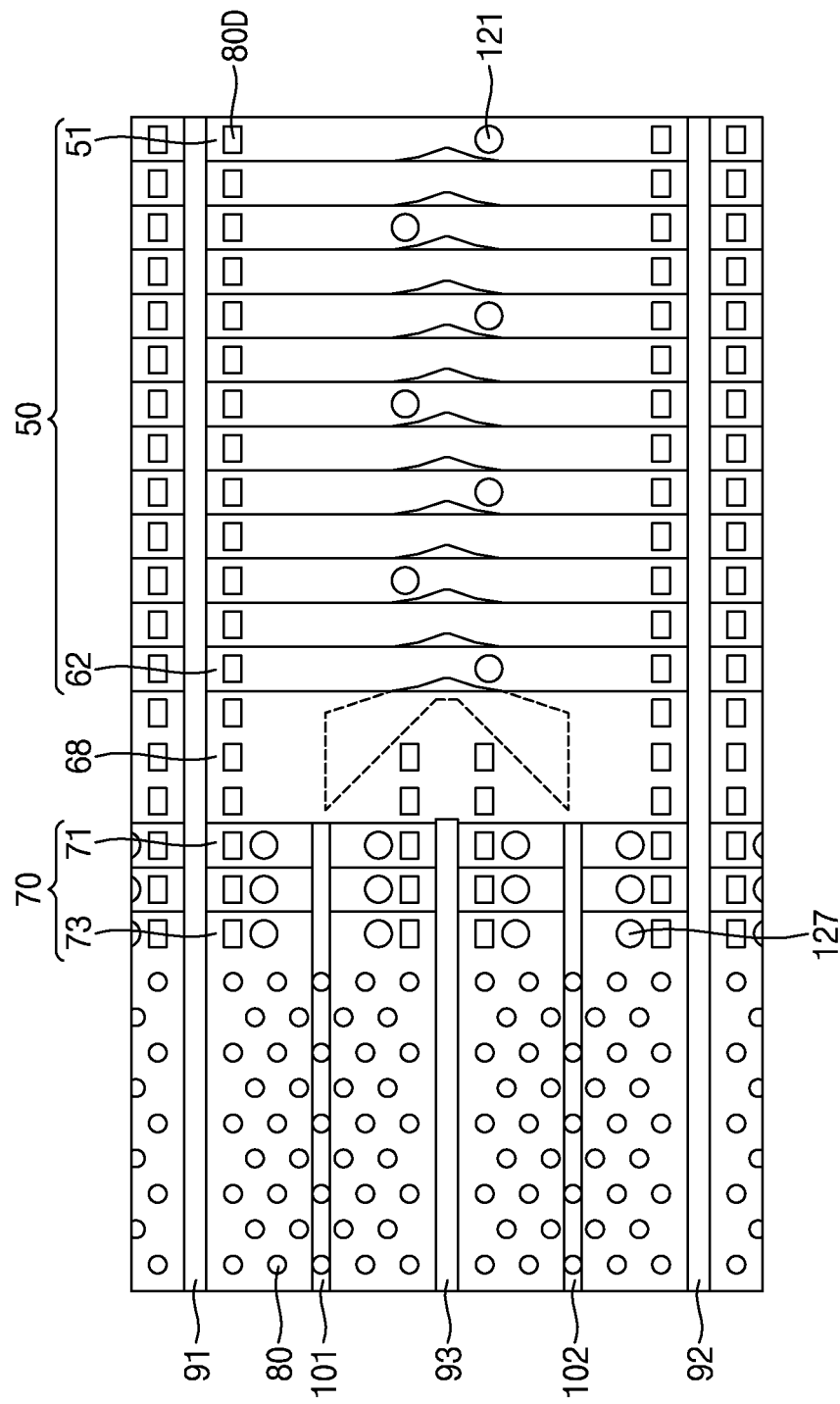
FIG. 35 is a layout for describing a semiconductor device according to an example embodiment of the inventive concept.
Figure 36:
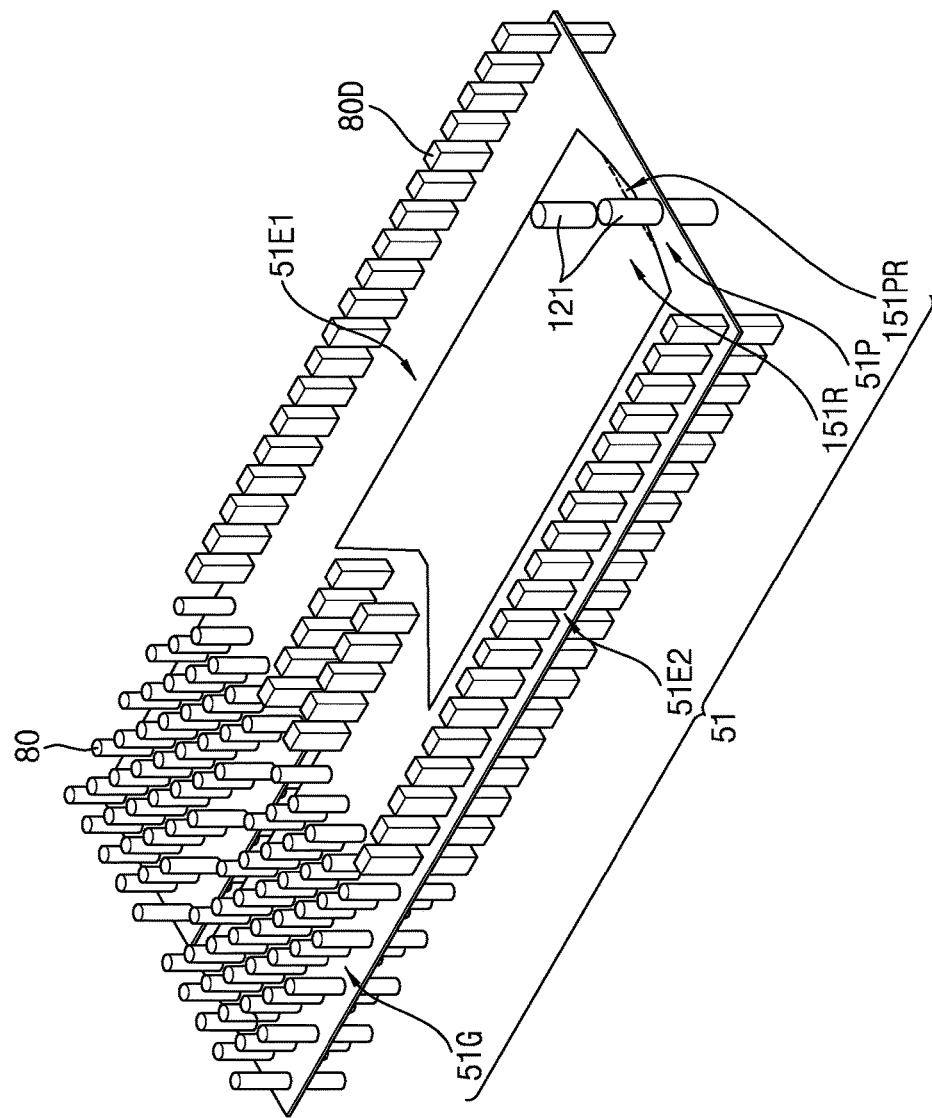
FIG. 36 is a perspective view illustrating some components of FIG. 35.

FIG. 35 is a layout for describing a semiconductor device according to an example embodiment of the inventive concept, and FIG. 36 is a perspective view illustrating some components of FIG. 35. Referring to FIGS. 35 and 36, a plurality of lower pads 51P may be connected to each other. A second lower mold pattern 151PR may be disposed between a first lower mold pattern 151R and the plurality of lower pads 51P.

Figure 37:
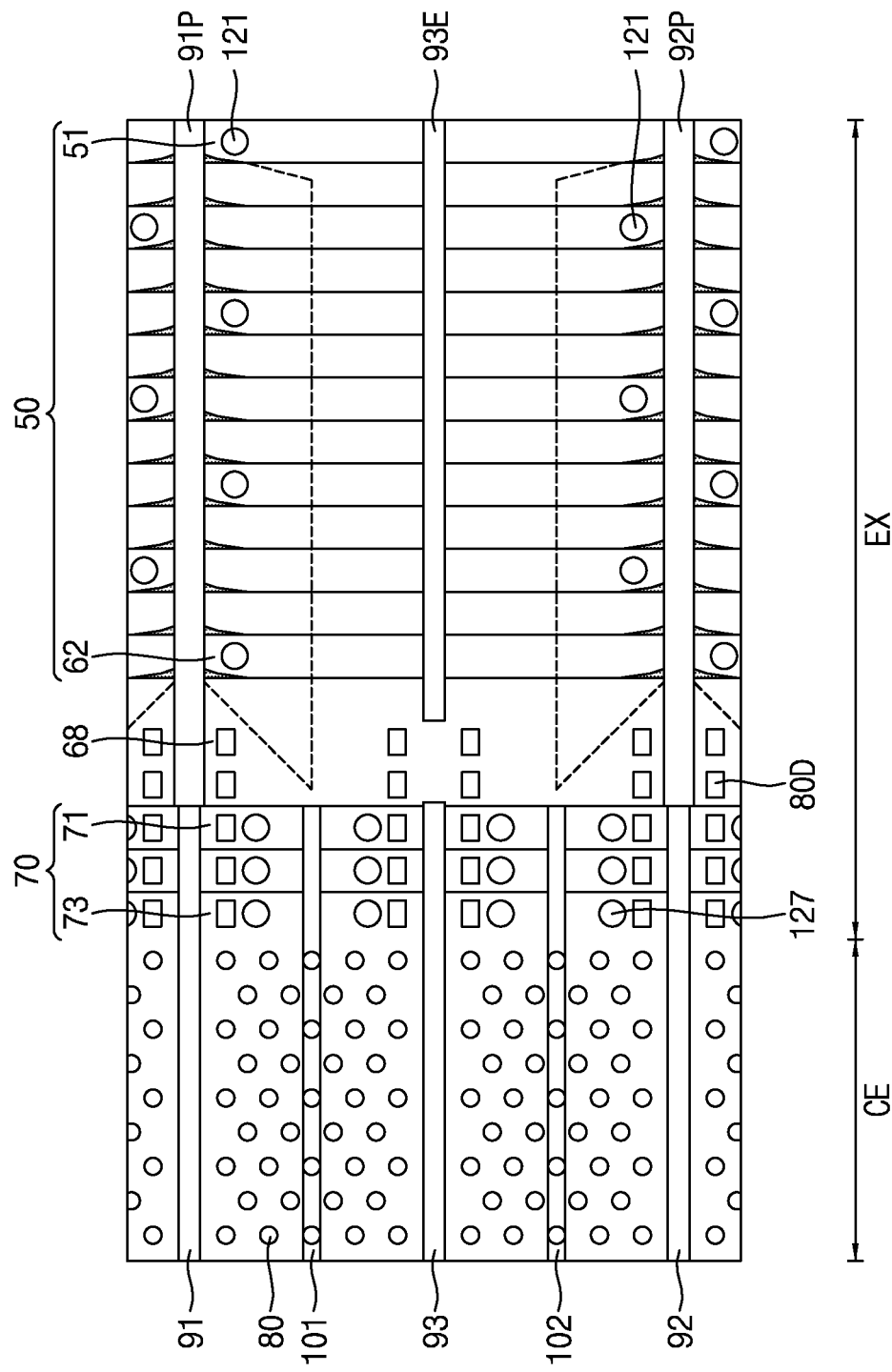
FIG. 37 is a layout for describing a semiconductor device according to an example embodiment of the inventive concept.
Figure 38:
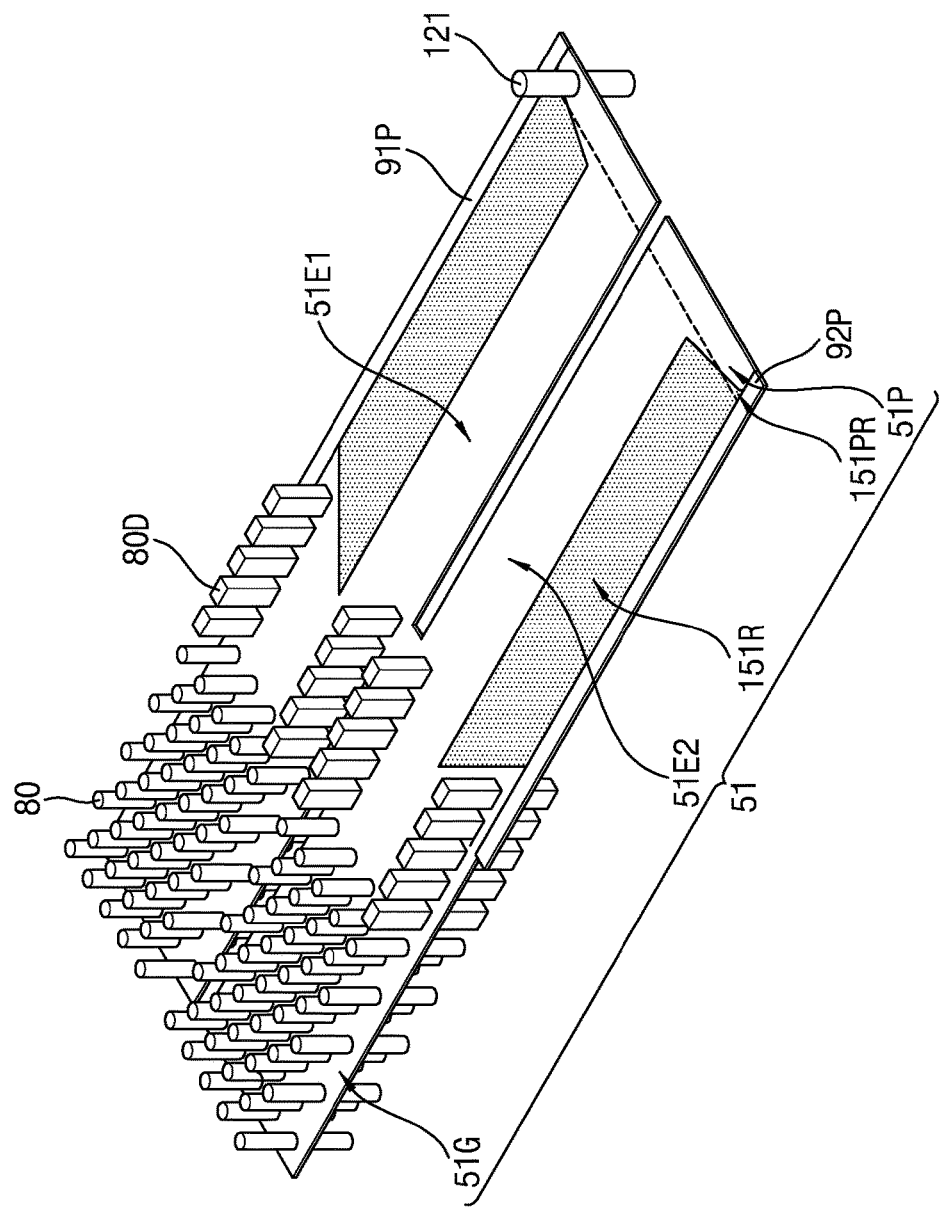
FIG. 38 is a perspective view illustrating some components of FIG. 37.

FIG. 37 is a layout for describing a semiconductor device according to an example embodiment of the inventive concept, and FIG. 38 is a perspective view illustrating some components of FIG. 37.

Referring to FIGS. 37 and 38, a first isolation insulating pattern 91P may be disposed on an extension line of a first isolation trench 91, and a second isolation insulating pattern 92P may be disposed on an extension line of a second isolation trench 92. A third isolation trench 93 may be disposed between the first isolation trench 91 and the second isolation trench 92. A fourth isolation trench 93E may be disposed between the first isolation insulating pattern 91P and the second isolation insulating pattern 92P. The fourth isolation trench 93E may be adjacent to an extension line of the third isolation trench 93 and spaced apart from the third isolation trench 93. A first selection line isolation pattern 101 may be disposed between the first isolation trench 91 and the third isolation trench 93. A second selection line isolation pattern 102 may be disposed between the second isolation trench 92 and the third isolation trench 93. A plurality of cell contact plugs 121 may be connected to a plurality of lower interconnection layers 51 to 62. Each of the plurality of cell contact plugs 121 may be connected to a corresponding one of a plurality of lower pads 51P. Each of the plurality of cell contact plugs 121 may be formed to pass through the corresponding one of the plurality of lower pads 51P.

The first isolation trench 91 and the first isolation insulating pattern 91P may be disposed on first side surfaces of a lower stack structure 50, a dummy interconnection layer 68, and an upper stack structure 70 that are sequentially stacked. The second isolation trench 92 and the second isolation insulating pattern 92P may be disposed on second side surfaces of the lower stack structure 50, the dummy interconnection layer 68, and the upper stack structure 70 that are sequentially stacked. The second isolation trench 92 may face the first isolation trench 91, and the second isolation insulating pattern 92P may face the first isolation insulating pattern 91P.

Each of the first isolation trench 91, the second isolation trench 92, and the third isolation trench 93 may cross a cell region CE and extend into a connection region EX. Each of the first isolation trench 91, the second isolation trench 92, and the third isolation trench 93 may be formed to pass vertically through the lower stack structure 50, the dummy interconnection layer 68, and the upper stack structure 70. Each of the first isolation insulating pattern 91P and the second isolation insulating pattern 92P may be disposed in the connection region EX. The first isolation insulating pattern 91P may be in contact with the first isolation trench 91, and the second isolation insulating pattern 92P may be in contact with the second isolation trench 92. The fourth isolation trench 93E may be disposed in the connection region EX. The fourth isolation trench 93E may be formed to pass vertically through the dummy interconnection layer 68 and the upper stack structure 70.

Each of the plurality of lower interconnection layers 51 to 62 may include a lower gate line 51G, first and second lower extension lines 51E1 and 51E2, a plurality of lower pads 51P, a plurality of first lower mold patterns 151R, and a plurality of second lower mold patterns 151PR. The first and second lower extension lines 51E1 and 51E2 may be adjacent to the fourth isolation trench 93E. The plurality of first lower mold patterns 151R may be disposed between the first lower extension line 51E1 and the first isolation insulating pattern 91P and between the second lower extension line 51E2 and the second isolation insulating pattern 92P. Each of the plurality of first lower mold patterns 151R may be in direct contact with a side surface of the first isolation insulating pattern 91P or a side surface of the second isolation insulating pattern 92P. The plurality of second lower mold patterns 151PR may be disposed between the plurality of first lower mold patterns 151R and the plurality of lower pads 51P.

Figure 39:
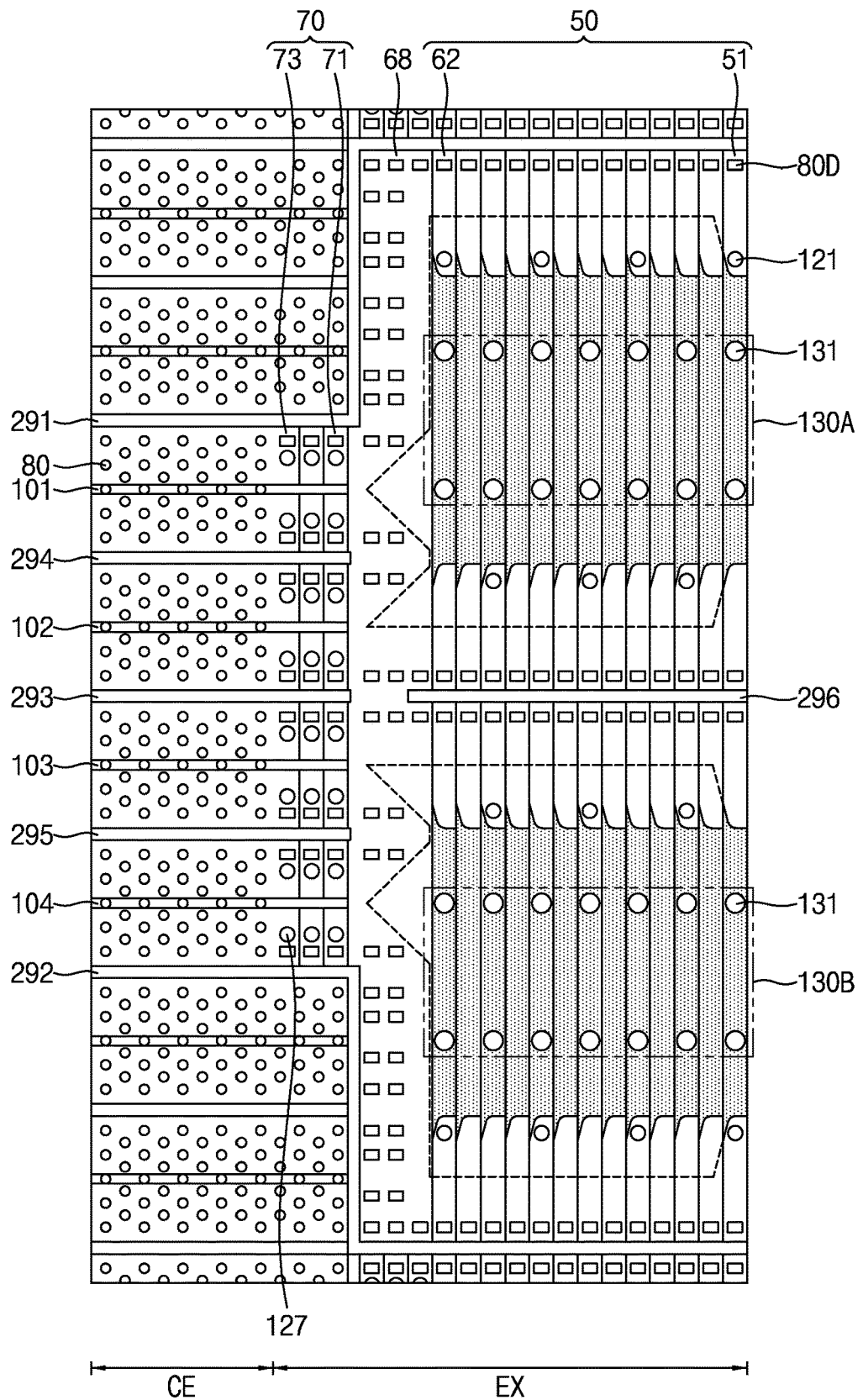
FIG. 39 is a layout for describing a semiconductor device according to an example embodiment of the inventive concept.
Figure 40:
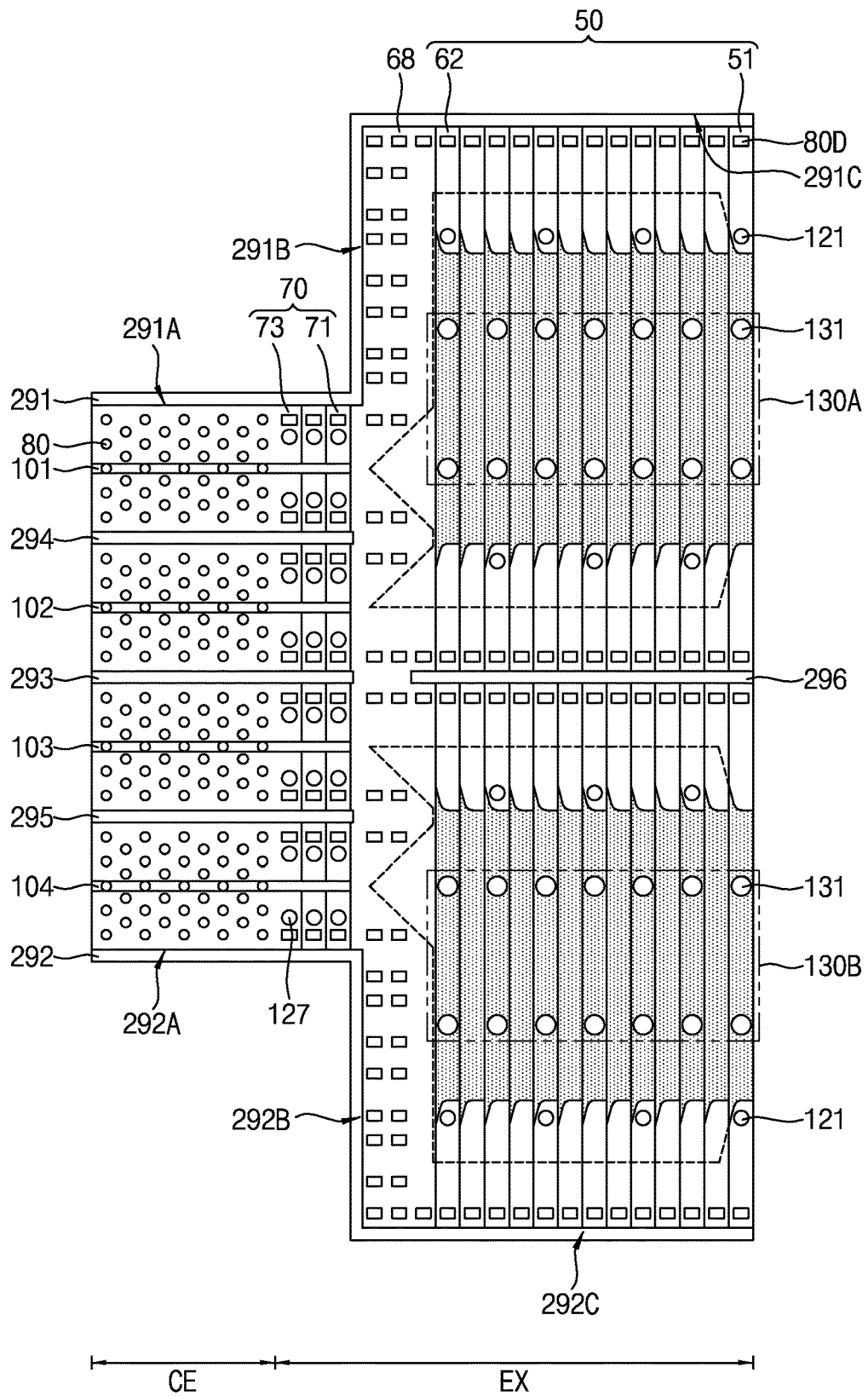
FIG. 40 is a layout illustrating main components of FIG. 39.

FIG. 39 is a layout for describing a semiconductor device according to an example embodiment of the inventive concept. FIG. 40 is a layout illustrating main components of FIG. 39, and FIG. 41 is a perspective view illustrating some components of FIG. 39.

Figure 41:
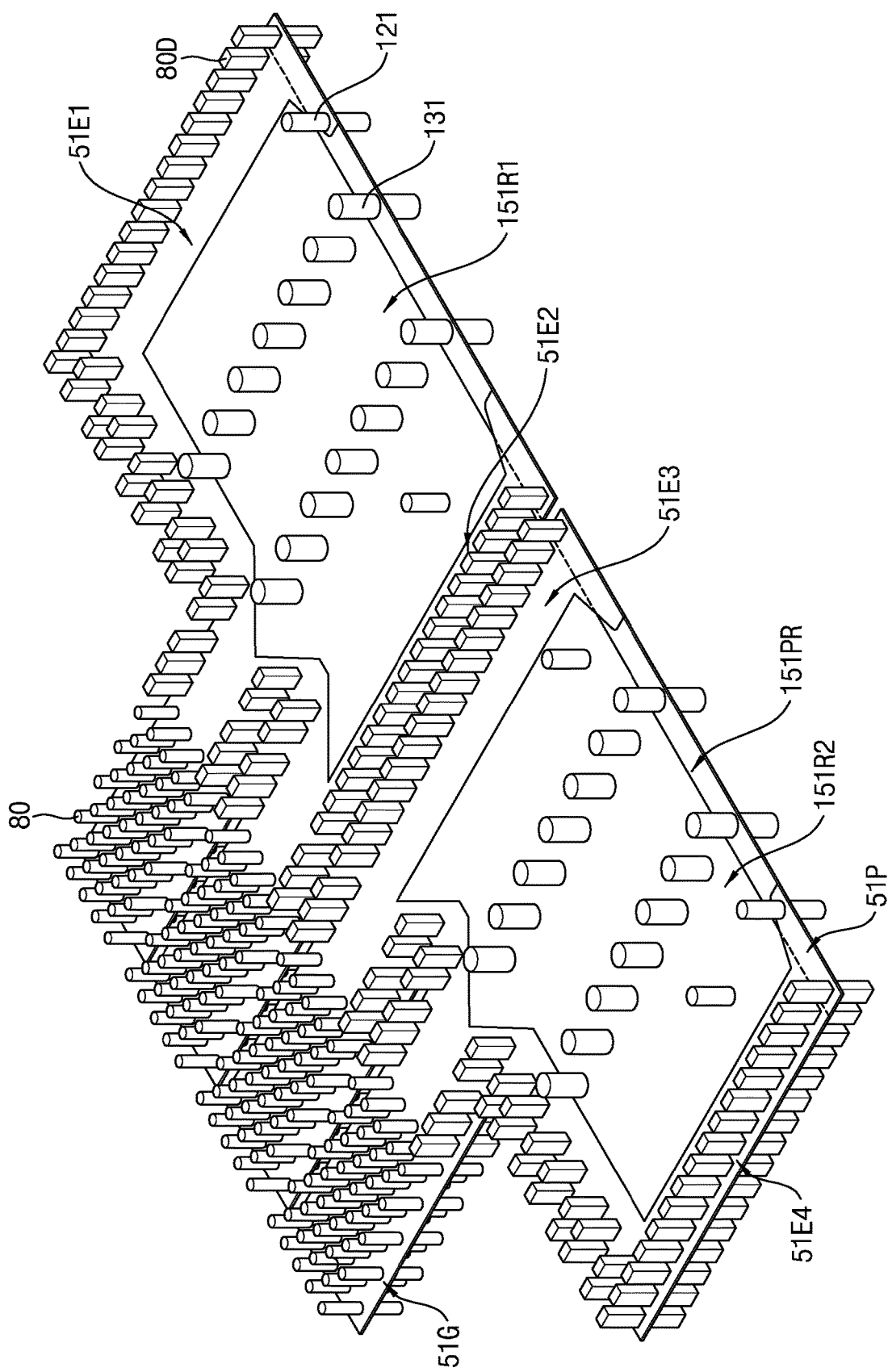
FIG. 41 is a perspective view illustrating some components of FIG. 39.

Referring to FIGS. 39 to 41, a lower stack structure 50, a dummy interconnection layer 68, and an upper stack structure 70, which are sequentially stacked, may be defined between a first isolation trench 291 and a second isolation trench 292, which face each other. The lower stack structure 50 may have a greater lateral width in a connection region EX than in a cell region CE. The first isolation trench 291 may include a first portion 291A, a second portion 291B, and a third portion 291C. The second isolation trench 292 may include a fourth portion 292A, a fifth portion 292B, and a sixth portion 292C.

The first portion 291A may cross the cell region CE and extend into the connection region EX. The second portion 291B may be disposed in the connection region EX and extend into the first portion 291A. The second portion 291B may extend in a direction different from an extension line of the first portion 291A. The second portion 291B may extend in a direction orthogonal to the extension line of the first portion 291A. The third portion 291C may be disposed in the connection region EX and extend into the second portion 291B. The third portion 291C may extend in a direction different from an extension line of the second portion 291B. The third portion 291C may extend in a direction orthogonal to the extension line of the second portion 291B.

The fourth portion 292A may face the first portion 291A, cross the cell region CE, and extend into the connection region EX. The fifth portion 292B may be disposed in the connection region EX and extend into the fourth portion 292A. The fifth portion 292B may extend in a direction different from an extension line of the fourth portion 292A. The fifth portion 292B may extend in a direction orthogonal to the extension line of the fourth portion 292A. The sixth portion 292C may be disposed in the connection region EX, face the third portion 291C, and extend into the fifth portion 292B. The sixth portion 292C may extend in a direction different from an extension line of the fifth portion 292B. The sixth portion 292C may extend in a direction orthogonal to the extension line of the fifth portion 292B.

A third isolation trench 293 may be disposed between the first portion 291A and the fourth portion 292A. A fourth isolation trench 294 may be disposed between the first portion 291A and the third isolation trench 293. A fifth isolation trench 295 may be disposed between the fourth portion 292A and the third isolation trench 293. Each of the third to fifth isolation trenches 293 to 295 may cross the cell region CE and extend into the connection region EX. Each of the third to fifth isolation trenches 293 to 295 may be formed to pass vertically through the lower stack structure 50, the dummy interconnection layer 68, and the upper stack structure 70 that are sequentially stacked. Each of the third to fifth isolation trenches 293 to 295 may completely cross the upper stack structure 70.

A sixth isolation trench 296 may be disposed in the connection region EX and adjacent to an extension line of the third isolation trench 293. The sixth isolation trench 296 may be spaced apart from the third isolation trench 293. The sixth isolation trench 296 may be formed to pass vertically through the dummy interconnection layer 68 and the upper stack structure 70. The sixth isolation trench 296 may be disposed between the third portion 291C and the sixth portion 292C.

A first selection line isolation pattern 101 may be disposed between the first portion 291A and the fourth isolation trench 294. A second selection line isolation pattern 102 may be disposed between the fourth isolation trench 294 and the third isolation trench 293. A third selection line isolation pattern 103 may be disposed between the third isolation trench 293 and the fifth isolation trench 295. A fourth selection line isolation pattern 104 may be disposed between the fifth isolation trench 295 and the fourth portion 292A. Each of the first to fourth selection line isolation patterns 101 to 104 may cross the cell region CE and extend into the connection region EX. Each of the first to fourth selection line isolation patterns 101 to 104 may be formed to pass vertically through the upper stack structure 70. Each of the first to fourth selection line isolation patterns 101 to 104 may completely cross the upper stack structure 70.

A distance between the third portion 291C and the sixth portion 292C may be greater than a distance between the first portion 291A and the fourth portion 292A. For example, the distance between the third portion 291C and the sixth portion 292C may be about two times the distance between the first portion 291A and the fourth portion 292A.

A first through electrode region 130A may be disposed between the third portion 291C and the sixth isolation trench 296. A second through electrode region 130B may be disposed between the sixth isolation trench 296 and the sixth portion 292C. A plurality of through electrodes 131 may be disposed in the first and second through electrode regions 130A and 130B.

Each of a plurality of lower interconnection layers 51 to 62 may include a lower gate line 51G, first to fourth lower extension lines 51E1, 51E2, 51E3, and 51E4, a plurality of lower pads 51P, a first lower right mold pattern 151R1, a first lower left mold pattern 151R2, and a plurality of second lower mold patterns 151PR.

The first lower extension line 51E1 may be disposed between the third portion 291C and the sixth isolation trench 296. The first lower extension line 51E1 may be adjacent to the third portion 291C. The second lower extension line 51E2 may be disposed between the first lower extension line 51E1 and the sixth isolation trench 296. The second lower extension line 51E2 may be adjacent to the sixth isolation trench 296. The third lower extension line 51E3 may be disposed between the sixth isolation trench 296 and the sixth portion 292C. The third lower extension line 51E3 may be adjacent to the sixth isolation trench 296. The fourth lower extension line 51E4 may be disposed between the third lower extension line 51E3 and the sixth portion 292C. The fourth lower extension line 51E4 may be adjacent to the sixth portion 292C.

The first lower right mold pattern 151R1 may be disposed between the first lower extension line 51E1 and the second lower extension line 51E2. The first lower left mold pattern 151R2 may be disposed between the third lower extension line 51E3 and the fourth lower extension line 51E4. Each of the plurality of lower pads 51P may extend to the corresponding one of the first to fourth lower extension lines 51E1, 51E2, 51E3, and 51E4. Each of the plurality of second lower mold patterns 151PR may be disposed between the plurality of lower pads 51P and be in contact with the first lower right mold pattern 151R1 or the first lower left mold pattern 151R2.

Figure 42:
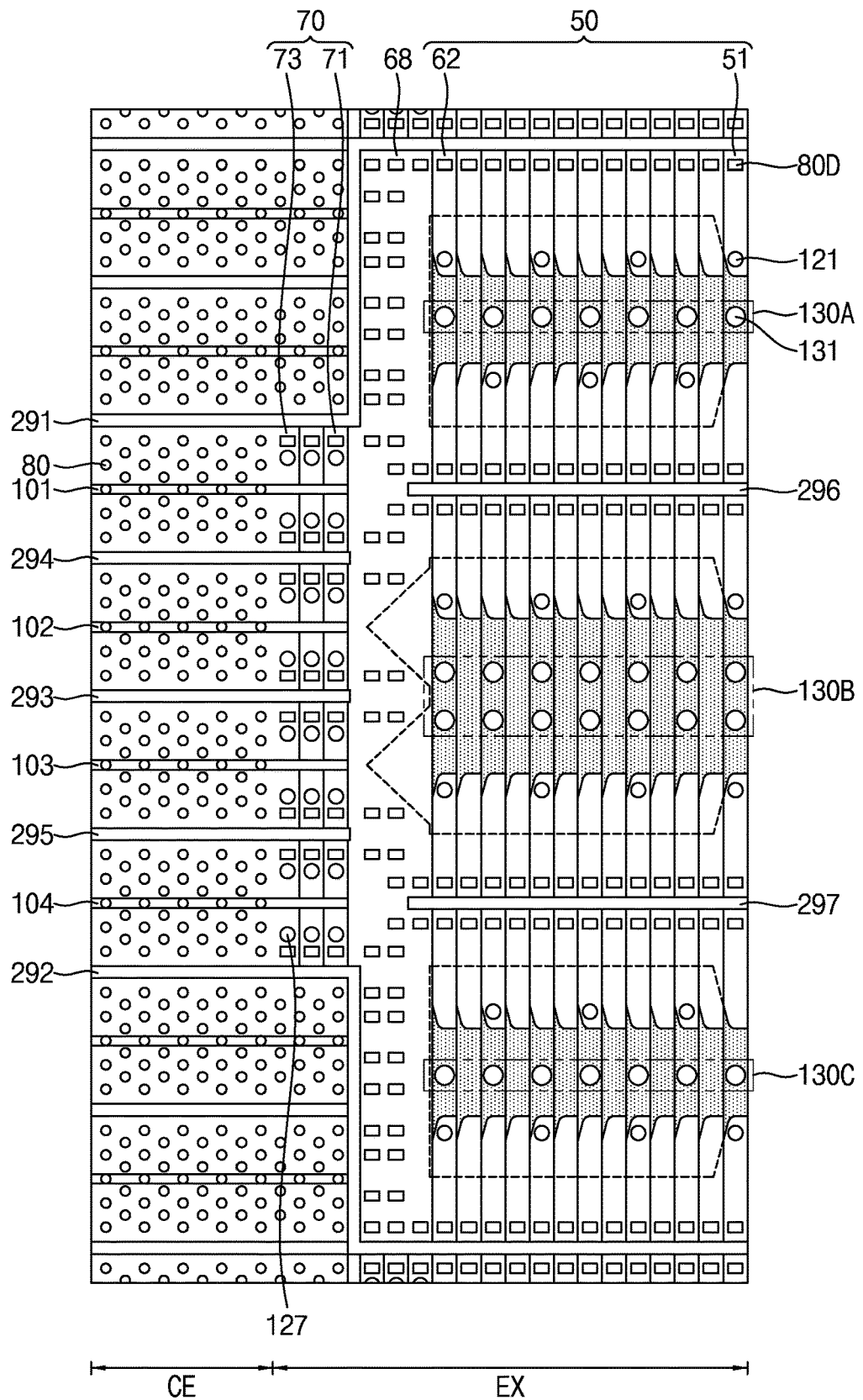
FIG. 42 is a layout for describing a semiconductor device according to an example embodiment of the inventive concept.
Figure 43:
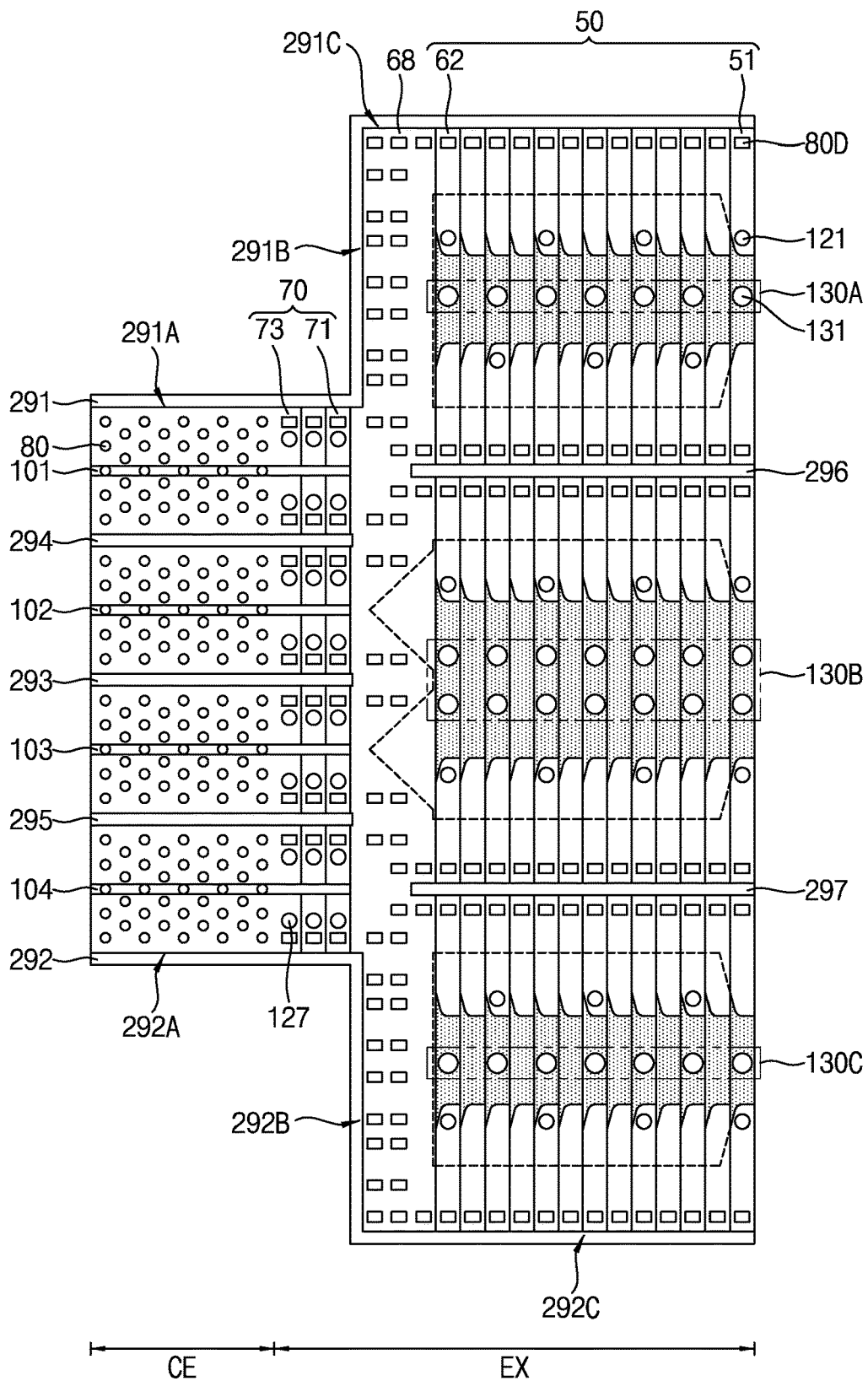
FIG. 43 is a layout illustrating main components of FIG. 42.

FIG. 42 is a layout for describing a semiconductor device according to an example embodiment of the inventive concept. FIG. 43 is a layout illustrating main components of FIG. 42, and FIG. 44 is a perspective view illustrating some components of FIG. 42.

Figure 44:
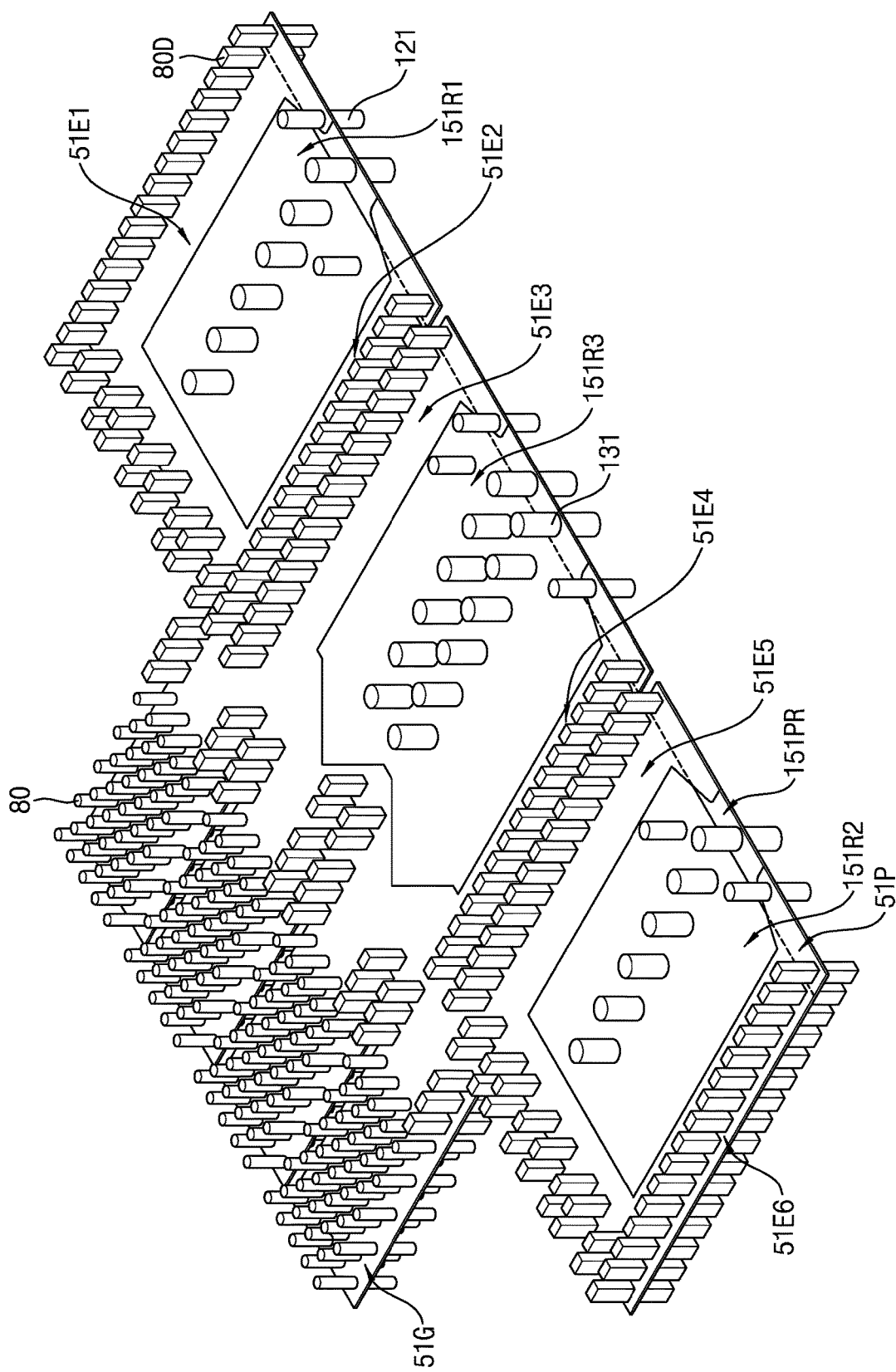
FIG. 44 is a perspective view illustrating some components of FIG. 42.
Figure 45:
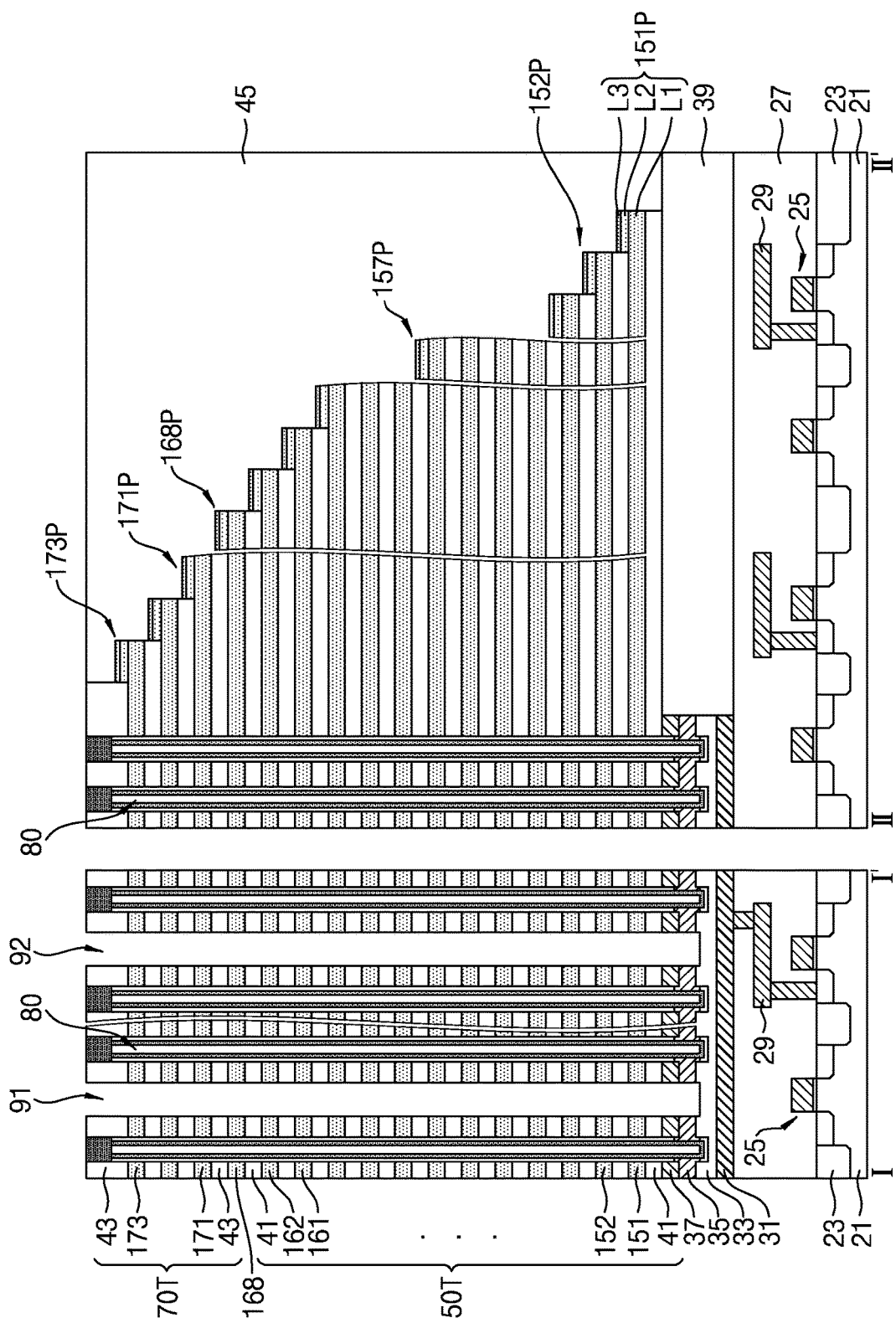
FIGS. 45 to 61 are cross-sectional views, which are taken along lines I-I', II-II', III-III', and IV-IV' of FIG. 1, for describing methods of forming a semiconductor device according to example embodiments of the inventive concept.
Figure 46:
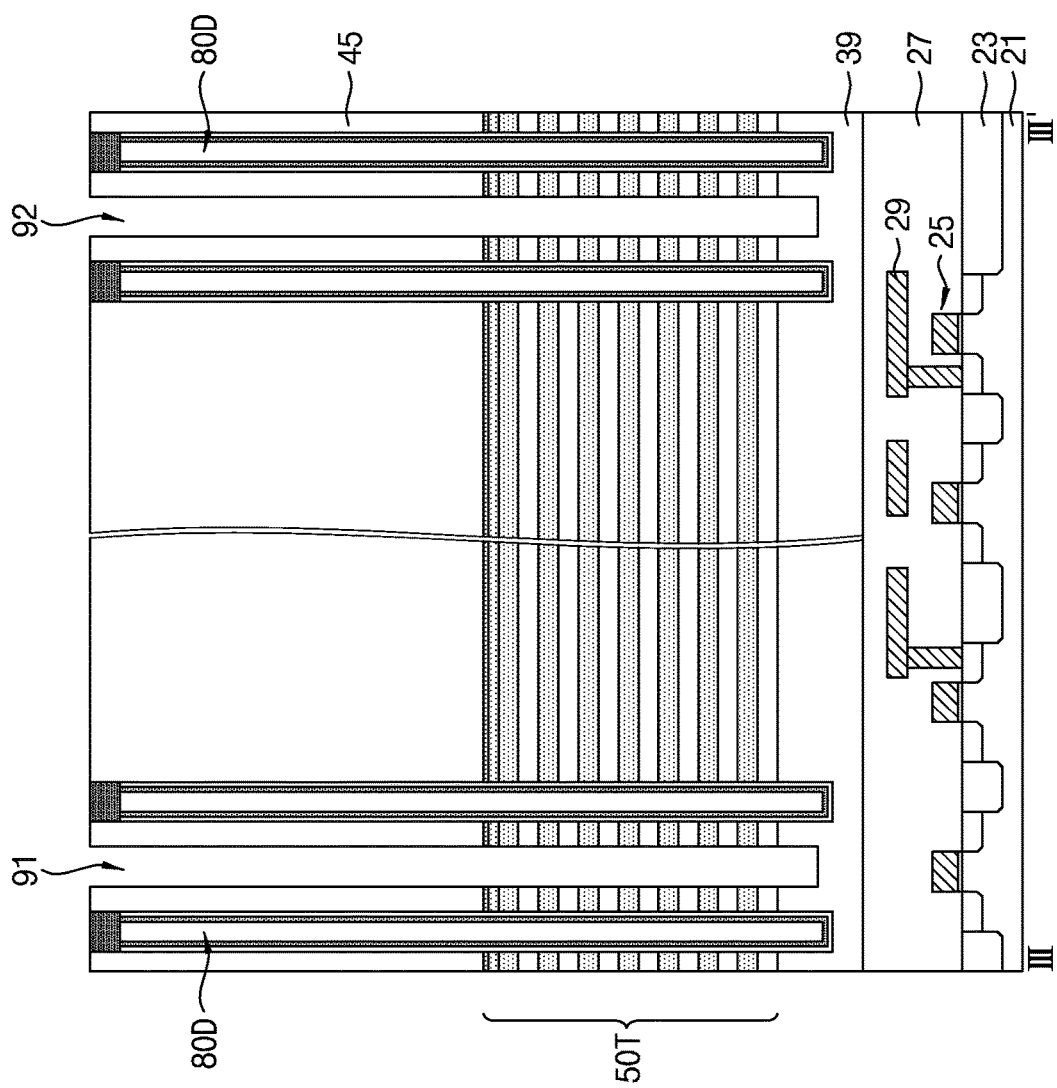
Figure 47:
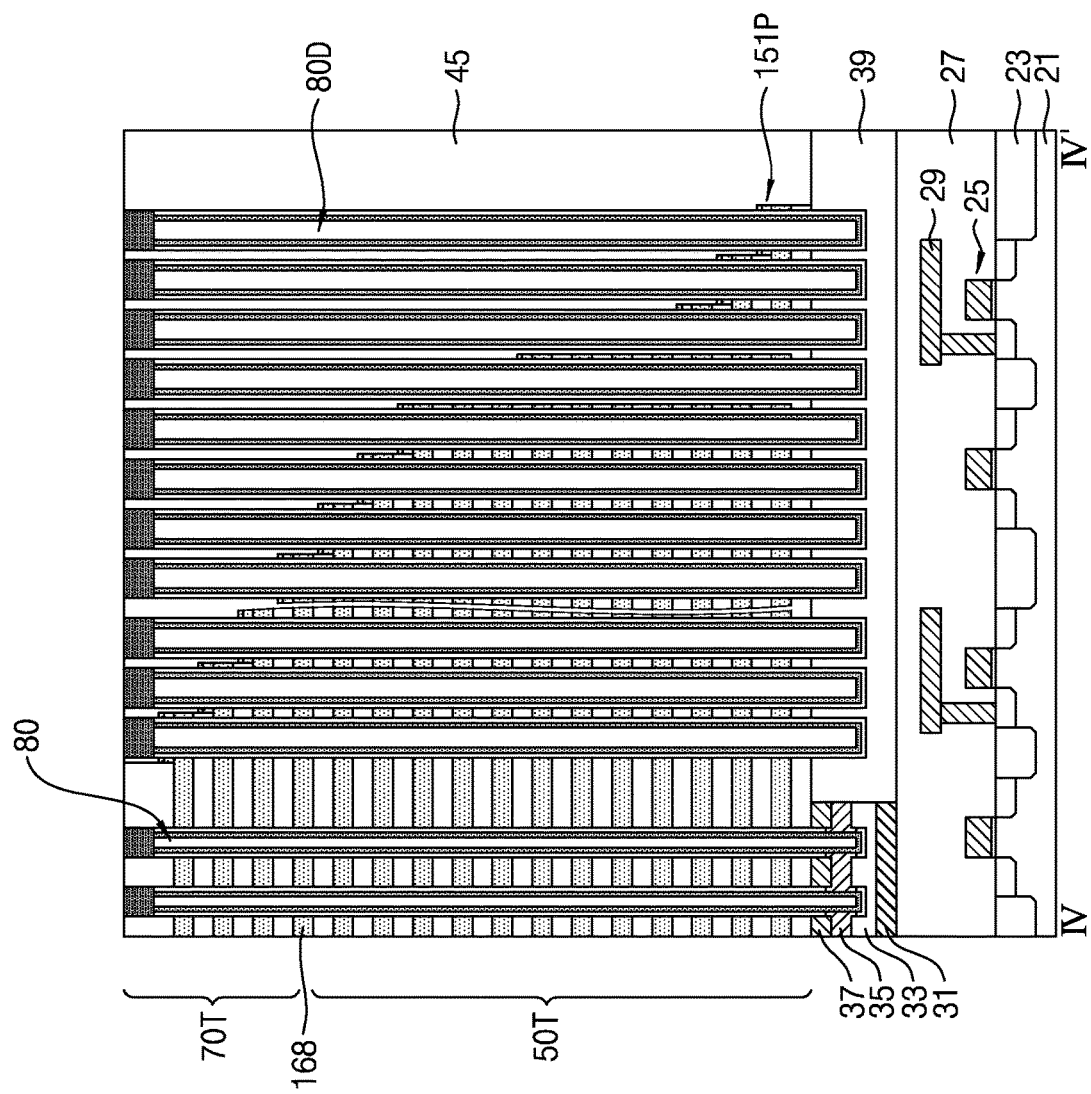
Figure 48:
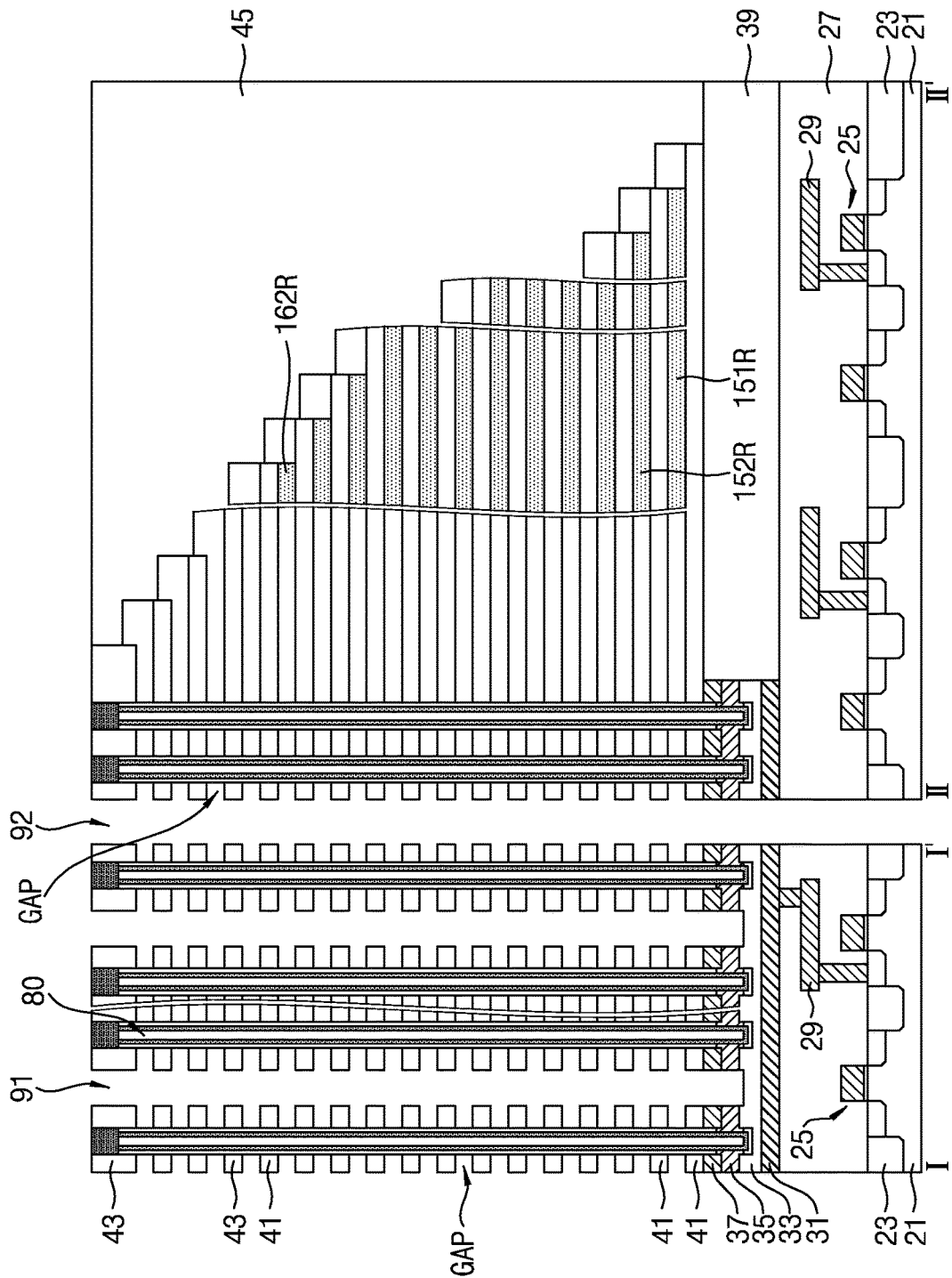
Figure 49:
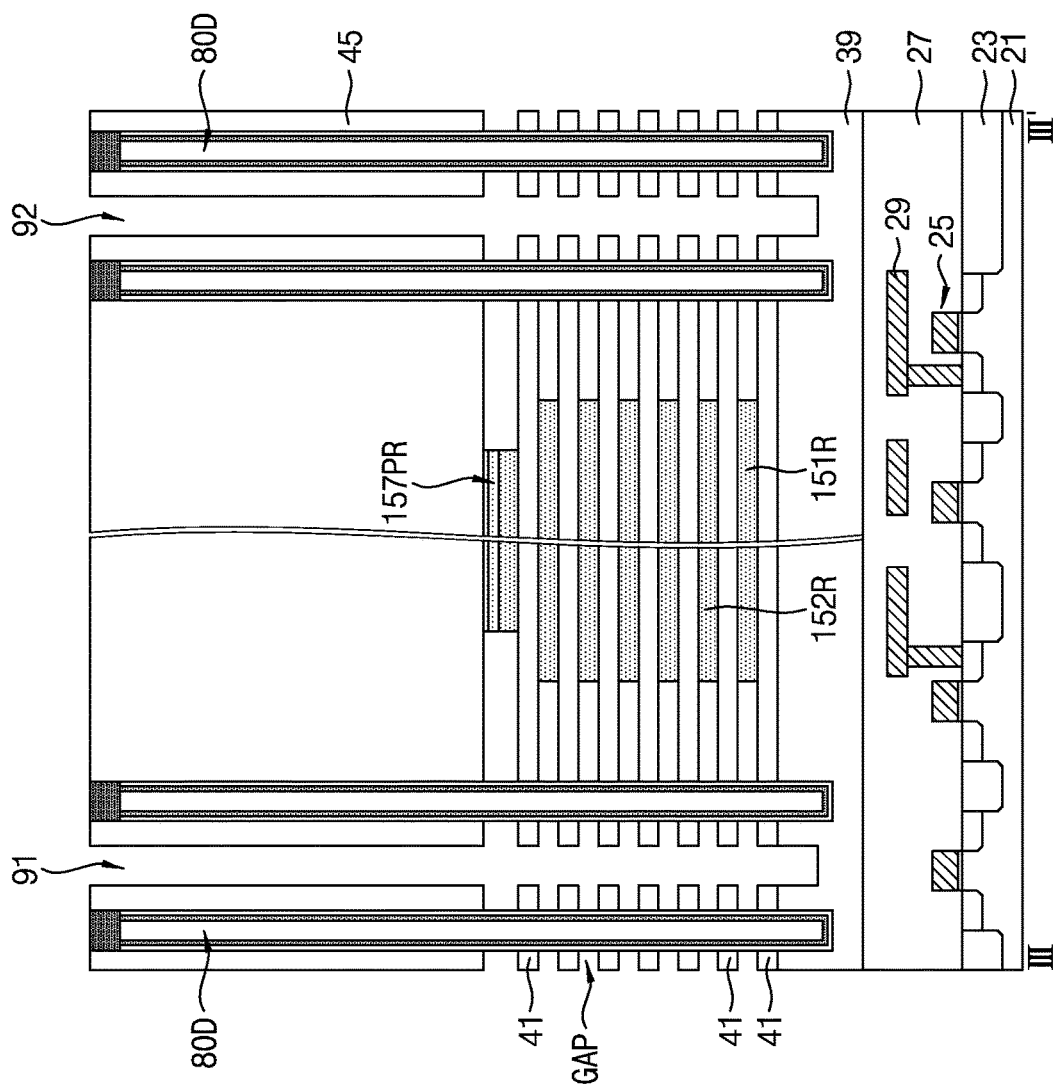
Figure 50:
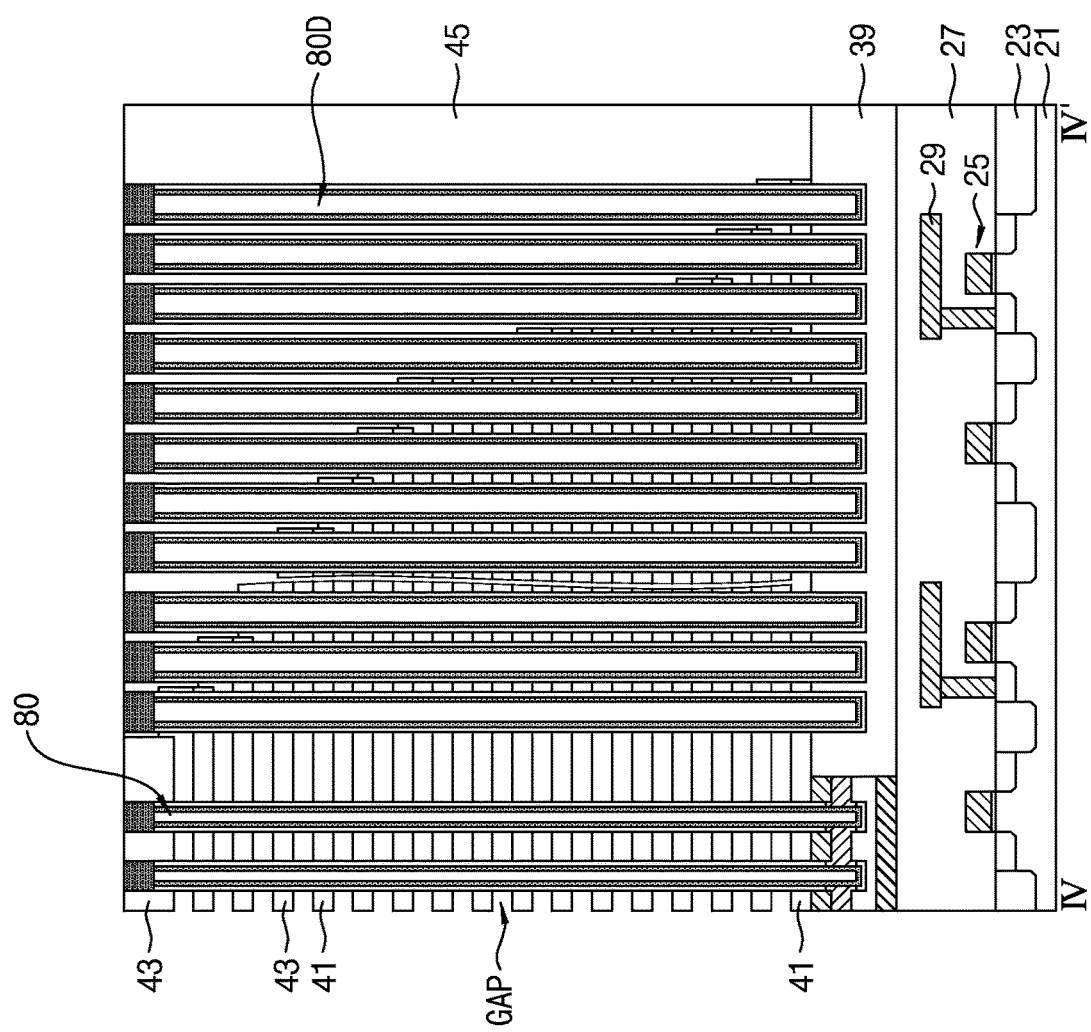
Figure 51:
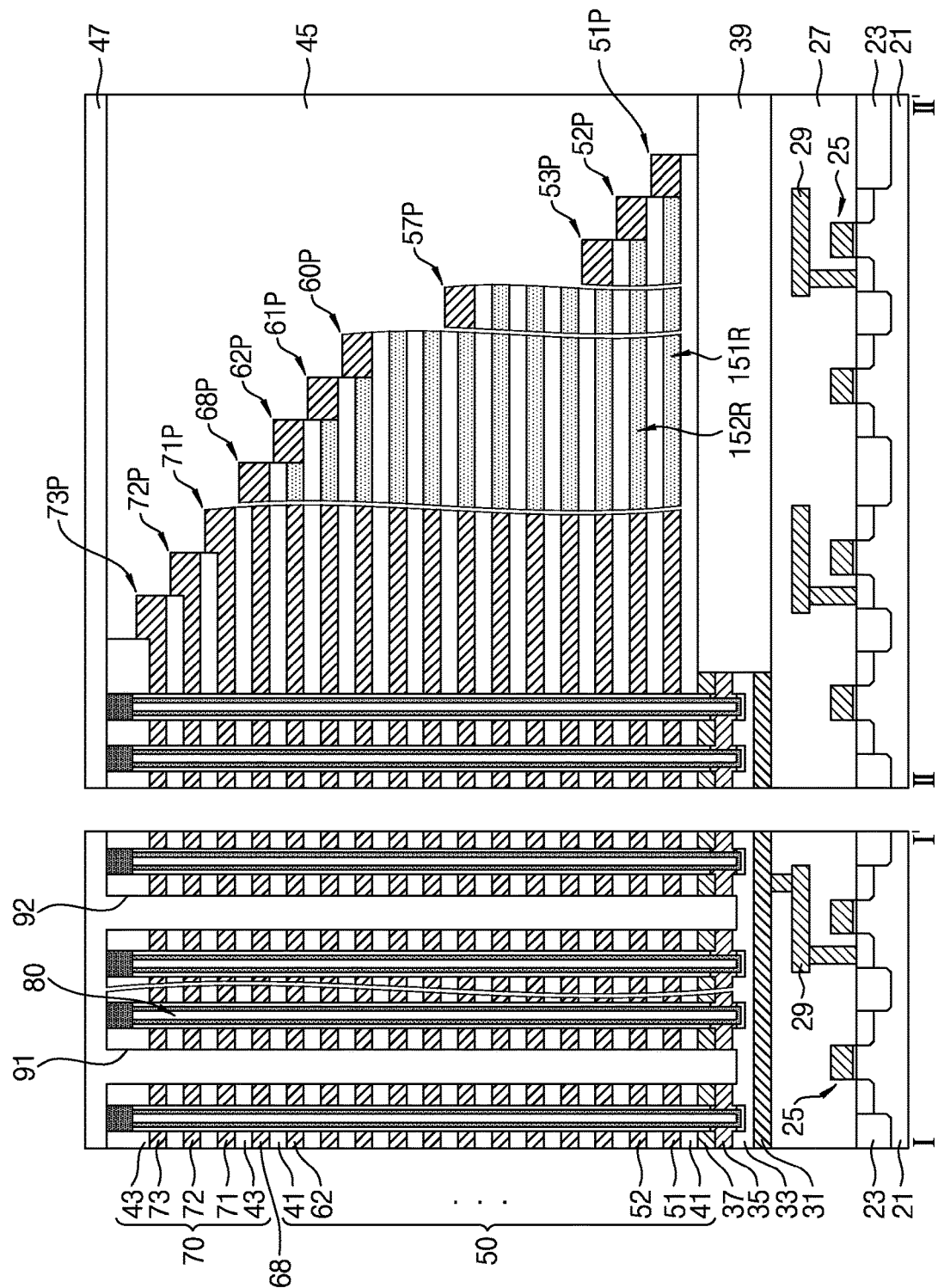
Figure 52:
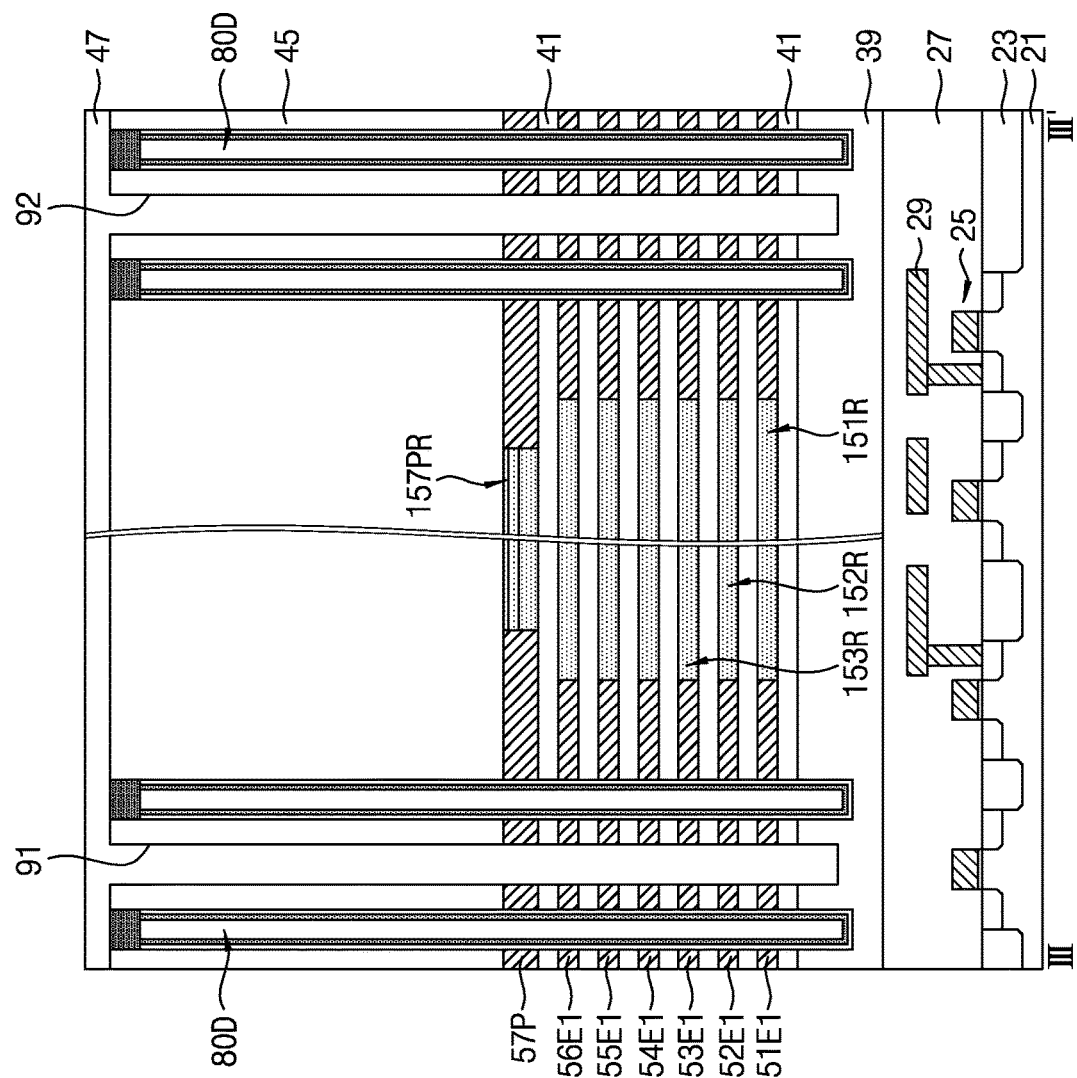
Figure 53:
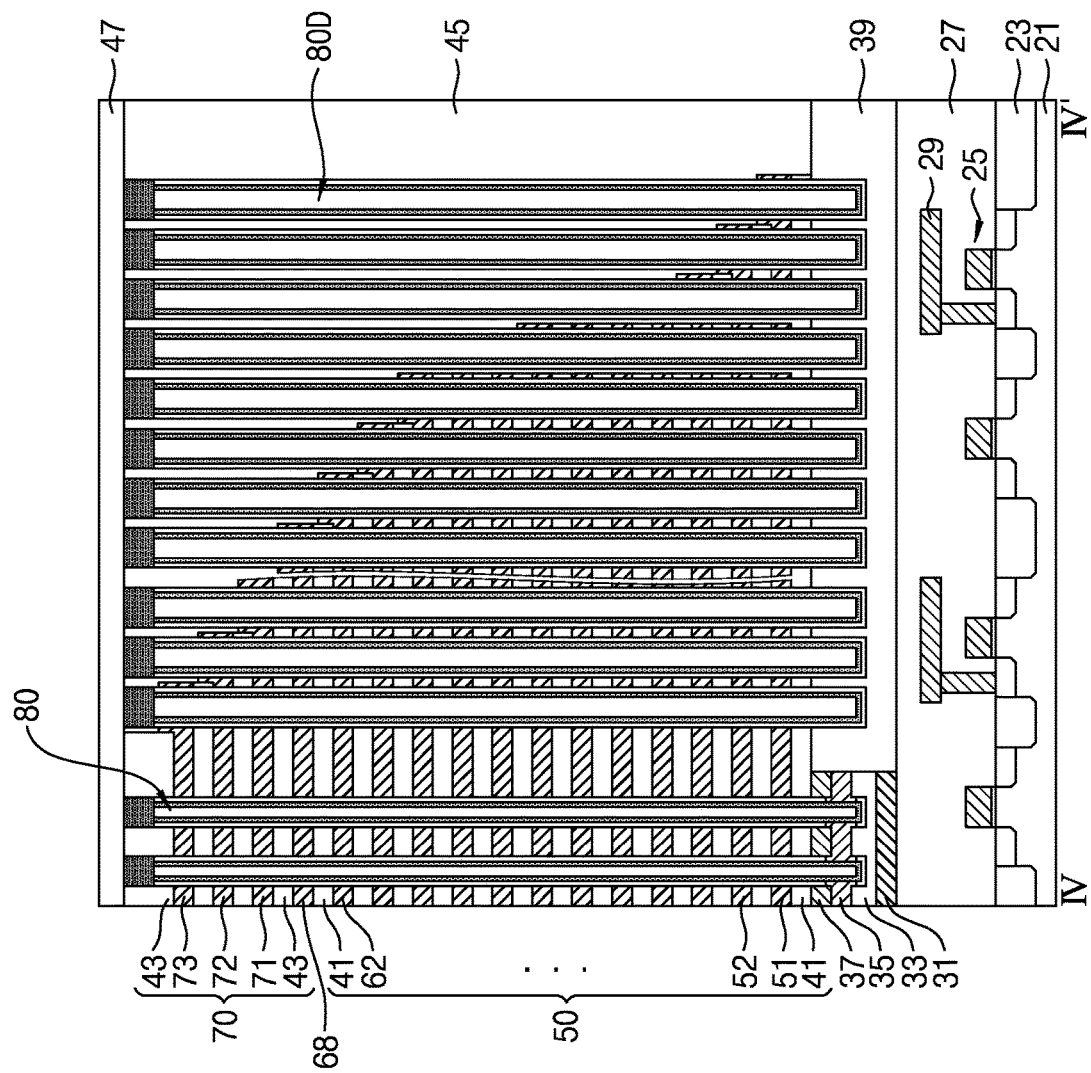
Figure 54:
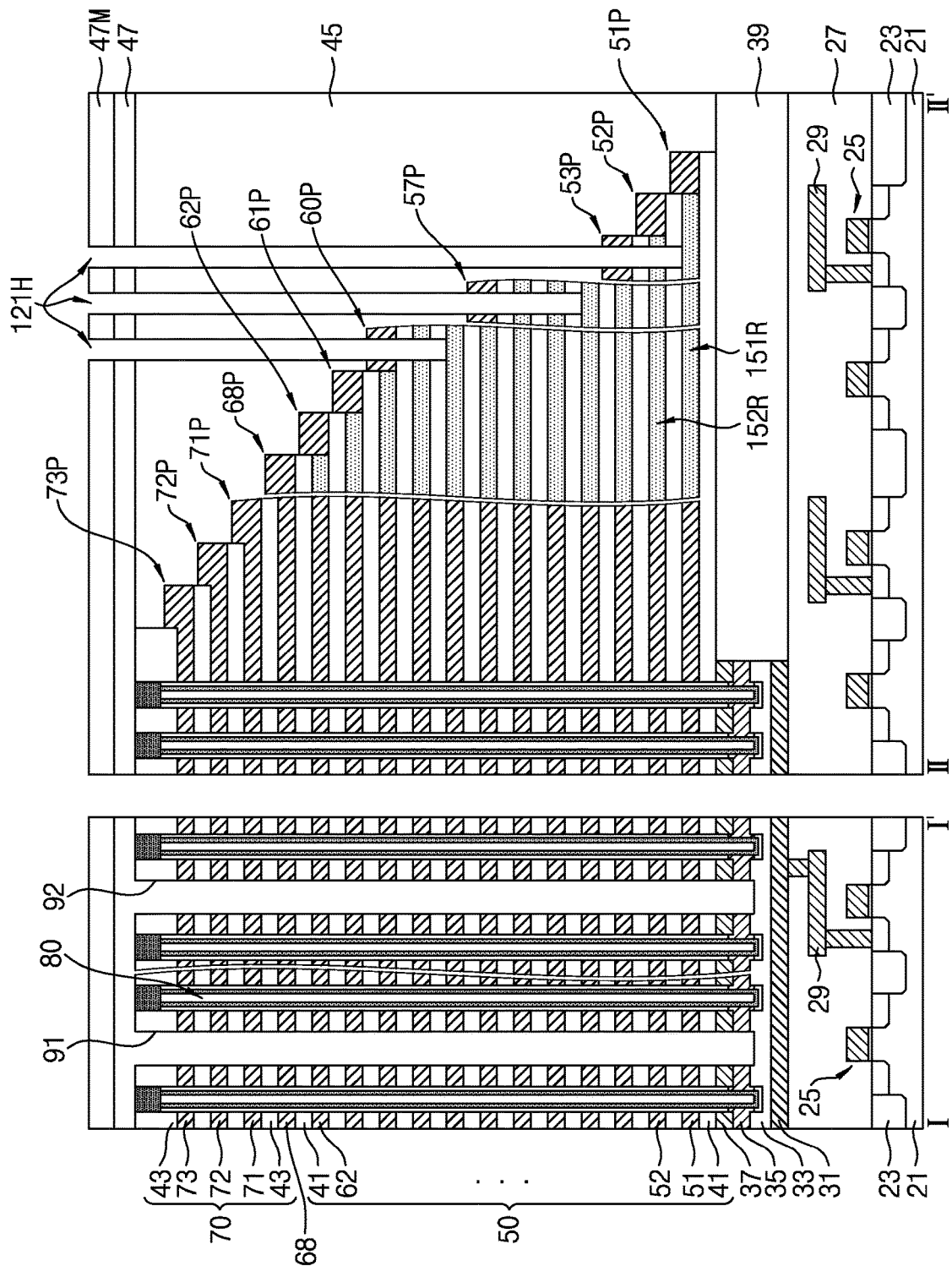
Figure 55:
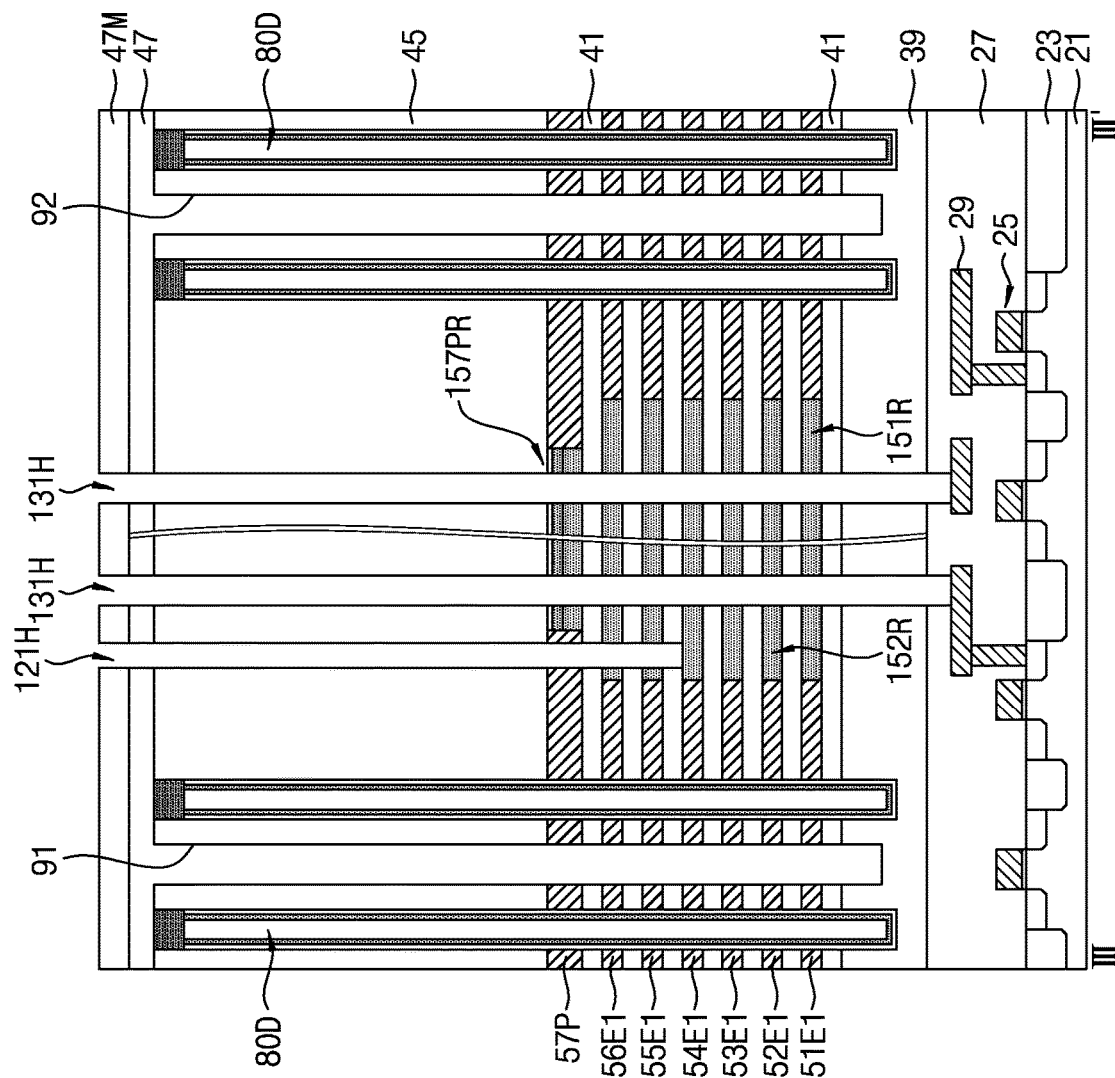
Figure 56:
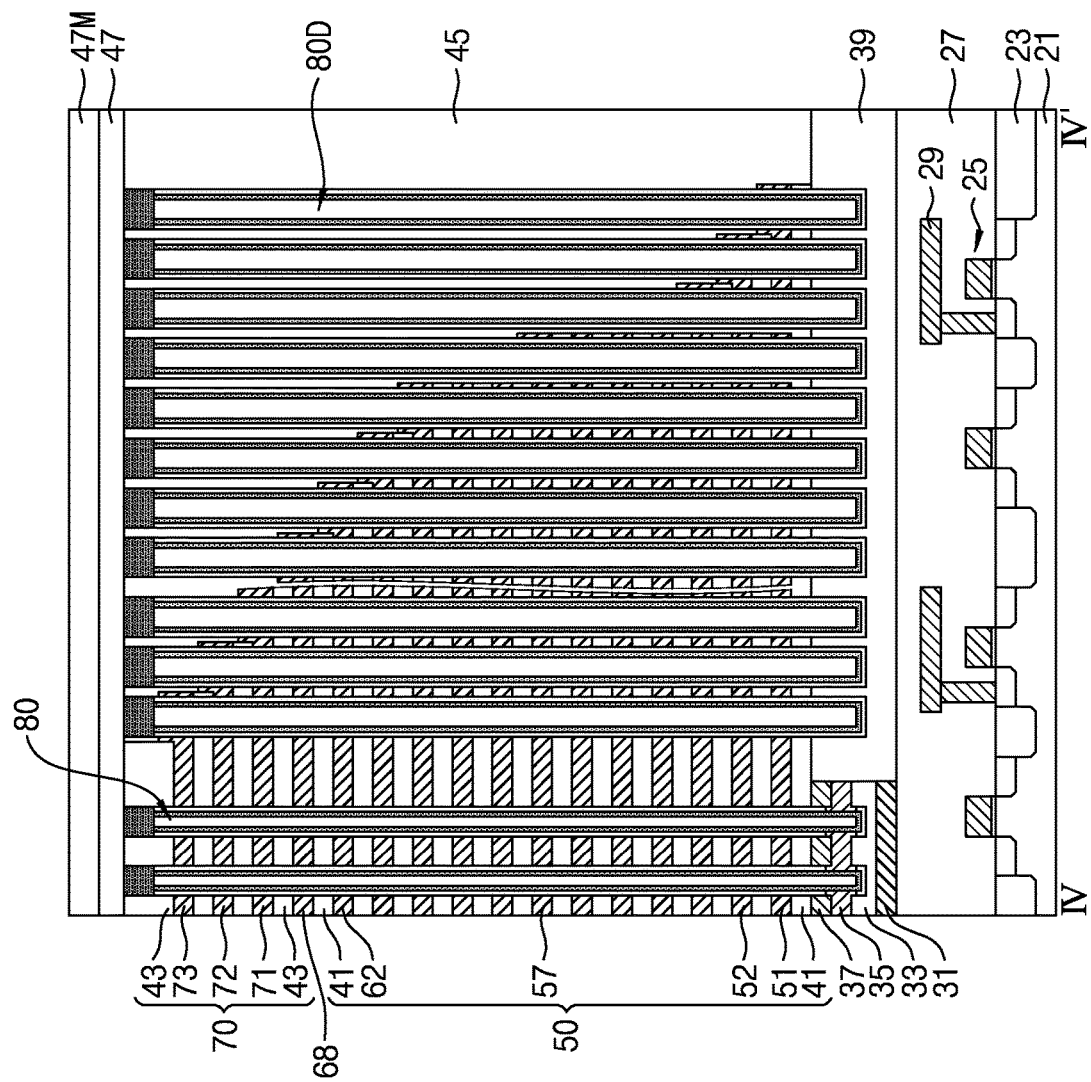
Figure 57:
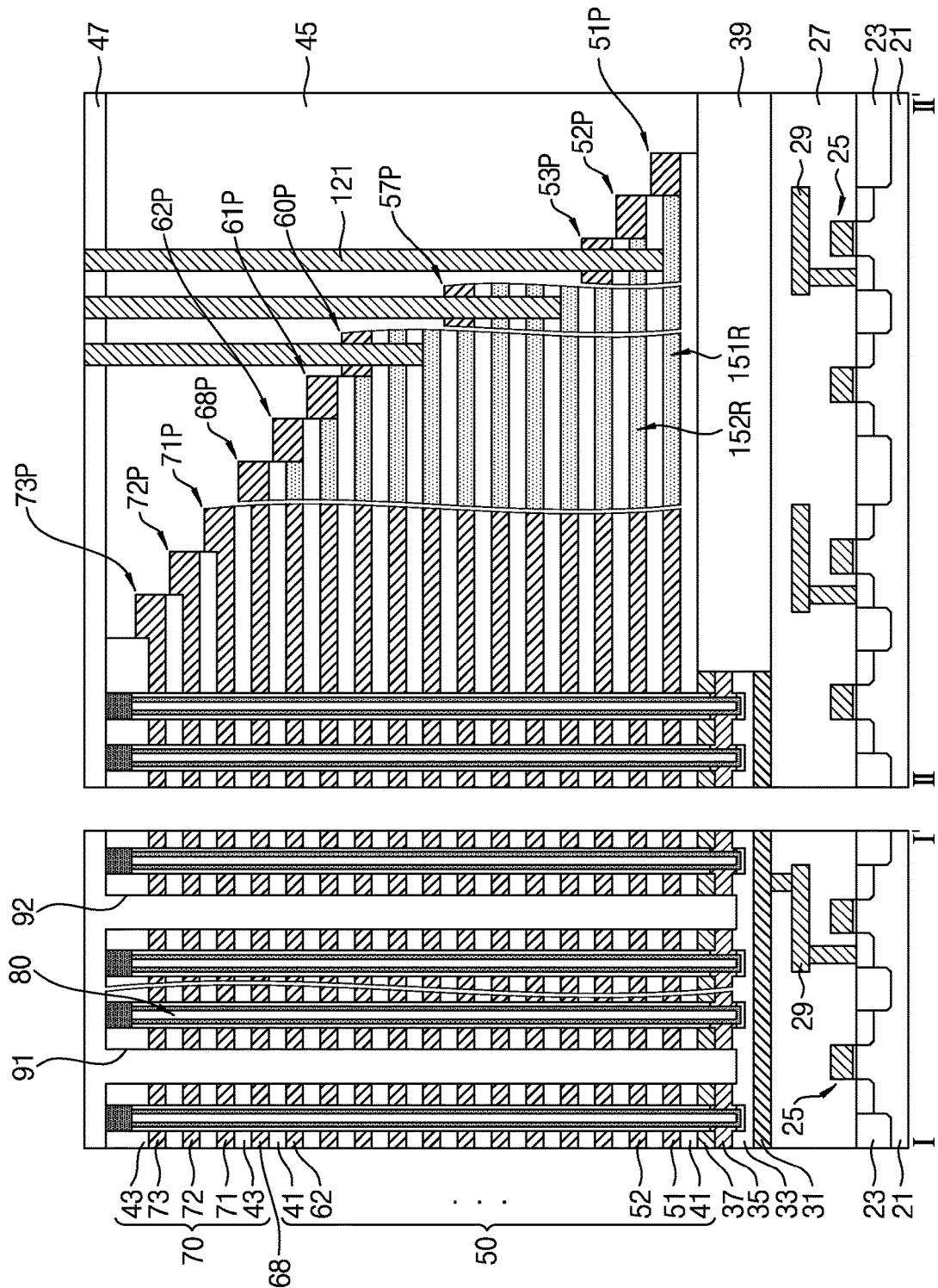
Figure 58:
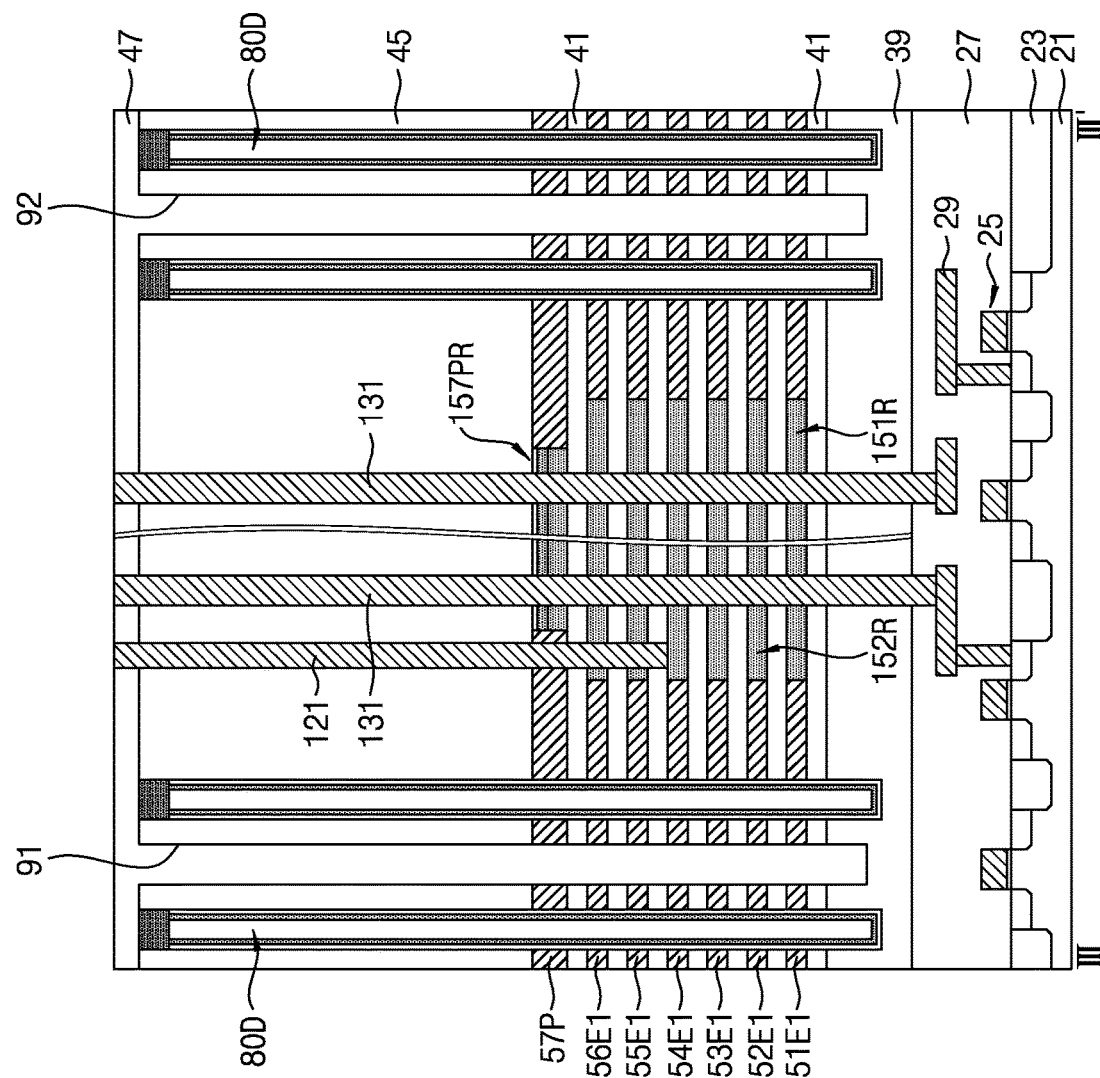
Figure 59:
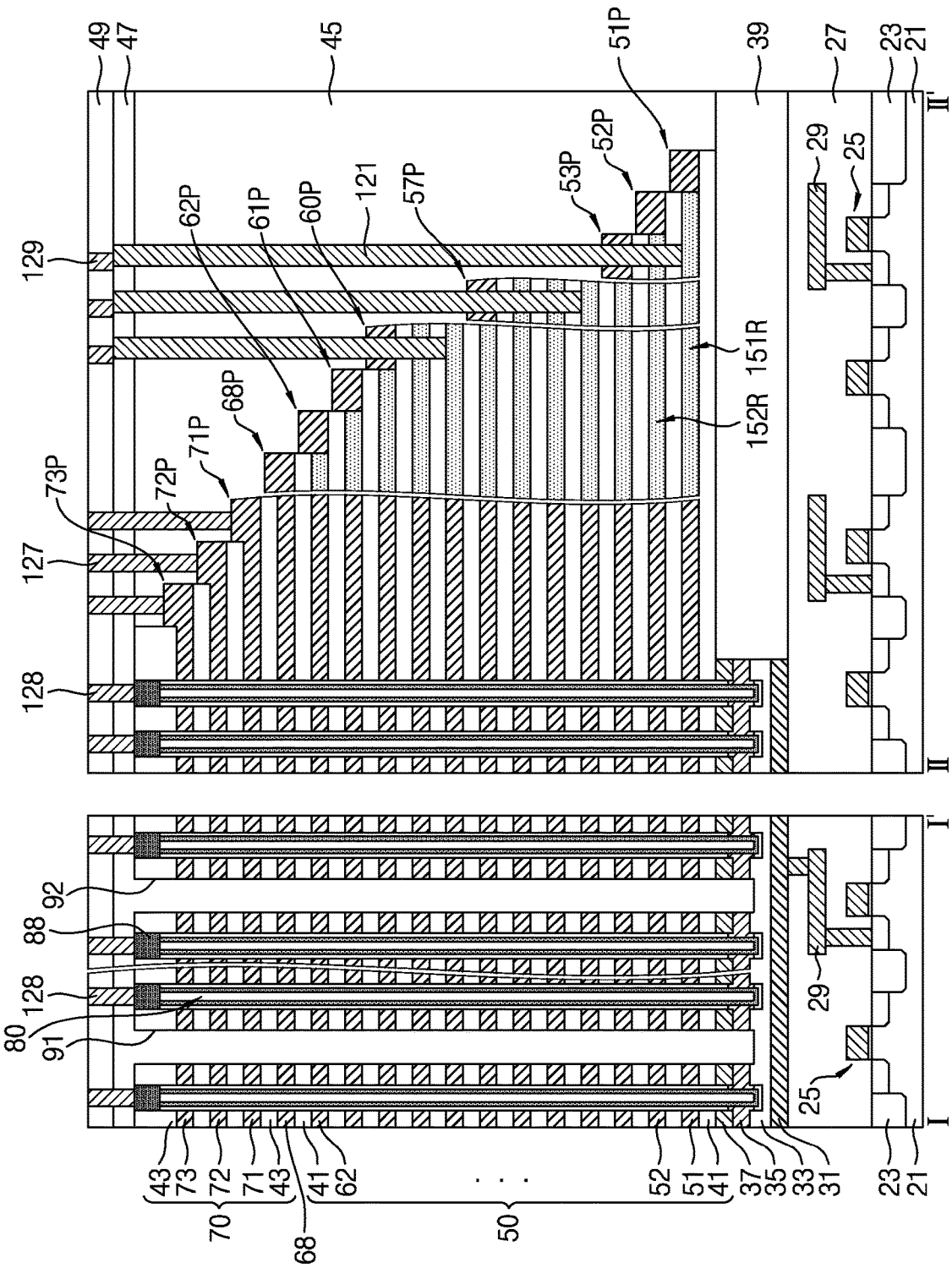
Figure 60:
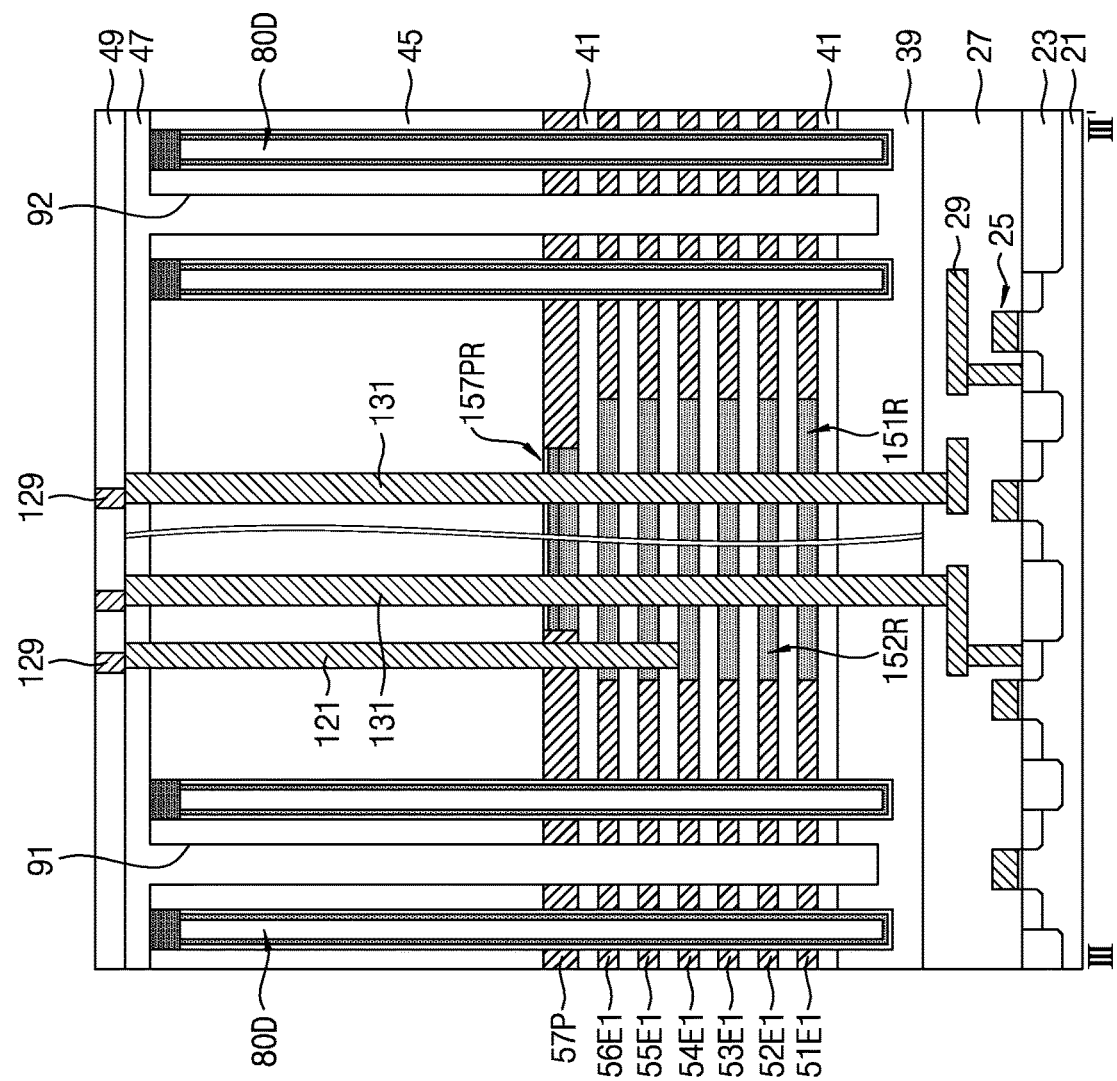
Figure 61:
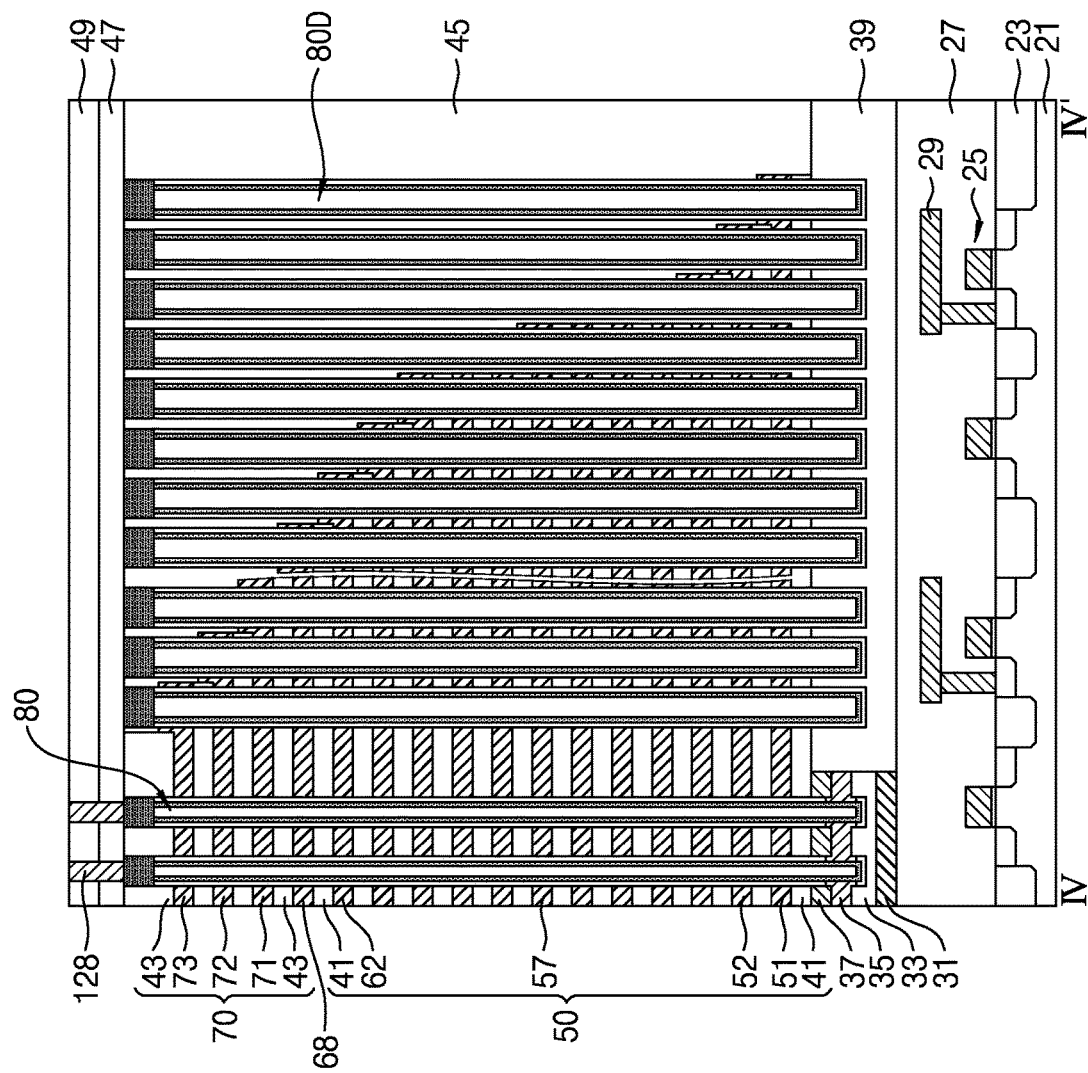

Referring to FIGS. 42 to 44, a lower stack structure 50, a dummy interconnection layer 68, and an upper stack structure 70, which are sequentially stacked, may be defined between a first isolation trench 291 and a second isolation trench 292, which face each other. The lower stack structure 50 may have a greater lateral width in a connection region EX than in a cell region CE. The first isolation trench 291 may include a first portion 291A, a second portion 291B, and a third portion 291C. The second isolation trench 292 may include a fourth portion 292A, a fifth portion 292B, and a sixth portion 292C.

A third isolation trench 293 may be disposed between the first portion 291A and the fourth portion 292A. A fourth isolation trench 294 may be disposed between the first portion 291A and the third isolation trench 293. A fifth isolation trench 295 may be disposed between the fourth portion 292A and the third isolation trench 293.

A sixth isolation trench 296 may be disposed in the connection region EX and adjacent to an extension line of the fourth isolation trench 294. The sixth isolation trench 296 may be spaced apart from the fourth isolation trench 294. The sixth isolation trench 296 may be disposed between the third portion 291C and the sixth portion 292C. A seventh isolation trench 297 may be disposed in the connection region EX and adjacent to an extension line of the fifth isolation trench 295. The seventh isolation trench 297 may be spaced apart from the fifth isolation trench 295. The seventh isolation trench 297 may be disposed between the sixth isolation trench 296 and the sixth portion 292C. Each of the sixth isolation trench 296 and the seventh isolation trench 297 may be formed to pass vertically through the dummy interconnection layer 68 and the upper stack structure 70.

A first selection line isolation pattern 101 may be disposed between the first portion 291A and the fourth isolation trench 294. A second selection line isolation pattern 102 may be disposed between the fourth isolation trench 294 and the third isolation trench 293. A third selection line isolation pattern 103 may be disposed between the third isolation trench 293 and the fifth isolation trench 295. A fourth selection line isolation pattern 104 may be disposed between the fifth isolation trench 295 and the fourth portion 292A. In an embodiment, the sixth isolation trench 296 may be disposed adjacent to an extension line of the first selection line isolation pattern 101. The sixth isolation trench 296 may be spaced apart from the first selection line isolation pattern 101. The seventh isolation trench 297 may be disposed adjacent to an extension line of the fourth selection line isolation pattern 104. The seventh isolation trench 297 may be spaced apart from the fourth selection line isolation pattern 104.

A first through electrode region 130A may be disposed between the third portion 291C and the sixth isolation trench 296. A second through electrode region 130B may be disposed between the sixth isolation trench 296 and the seventh isolation trench 297. A third through electrode region 130C may be disposed between the seventh isolation trench 297 and the sixth portion 292C. A plurality of through electrodes 131 may be disposed in the first to third through electrode regions 130A, 130B, and 130C.

Each of a plurality of lower interconnection layers 51 to 62 may include a lower gate line 51G, first to sixth lower extension lines 51E1, 51E2, 51E3, 51E4, 51E5, and 51E6, a plurality of lower pads 51P, a first lower right mold pattern 151R1, a first lower middle mold pattern 151R3, a first lower left mold pattern 151R2, and a plurality of second lower mold patterns 151PR.

The first lower extension line 51E1 may be disposed between the third portion 291C and the sixth isolation trench 296. The first lower extension line 51E1 may be adjacent to the third portion 291C. The second lower extension line 51E2 may be disposed between the first lower extension line 51E1 and the sixth isolation trench 296. The second lower extension line 51E2 may be adjacent to the sixth isolation trench 296. The third lower extension line 51E3 may be disposed between the sixth isolation trench 296 and the seventh isolation trench 297. The third lower extension line 51E3 may be adjacent to the sixth isolation trench 296. The fourth lower extension line 51E4 may be disposed between the third lower extension line 51E3 and the seventh isolation trench 297. The fourth lower extension line 51E4 may be adjacent to the seventh isolation trench 297. The fifth lower extension line 51E5 may be disposed between the seventh isolation trench 297 and the sixth portion 292C. The fifth lower extension line 51E5 may be adjacent to the seventh isolation trench 297. The sixth lower extension line 51E6 may be disposed between the fifth lower extension line 51E5 and the sixth portion 292C. The sixth lower extension line 51E6 may be adjacent to the sixth portion 292C.

The first lower right mold pattern 151R1 may be disposed between the first lower extension line 51E1 and the second lower extension line 51E2. The first lower middle mold pattern 151R3 may be disposed between the third lower extension line 51E3 and the fourth lower extension line 51E4. The first lower left mold pattern 151R2 may be disposed between the fifth lower extension line 51E5 and the sixth lower extension line 51E6. Each of the plurality of lower pads 51P may extend to the corresponding one of the first to sixth lower extension lines 51E1, 51E2, 51E3, 51E4, 51E5, and 51E6. Each of the plurality of second lower mold patterns 151P

R may be disposed between the plurality of lower pads 51P and be in contact with the corresponding one of the first lower right mold pattern 151R1, the first lower middle mold pattern 151R3, and the first lower left mold pattern 151R2.

FIGS. 45 to 61 are cross-sectional views, which are taken along lines I-I', II-II', III-III', and IV-IV' of FIG. 1, for describing methods of forming a semiconductor device according to example embodiments of the inventive concept.

Referring to FIGS. 1, 2, and 45 to 47, a device isolation layer 23, a plurality of transistors 25, a lower interlayer insulating layer 27, a plurality of peripheral circuit interconnections 29, a lower buried conductive layer 31, a middle buried conductive layer 33, a replacement conductive line 35, a support plate 37, and a middle interlayer insulating layer 39 may be formed on a substrate 21. Top surfaces of the support plate 37 and the middle interlayer insulating layer 39 may be substantially coplanar.

A preliminary lower stack structure 50T, a dummy mold layer 168, and a preliminary upper stack structure 70T may be sequentially stacked on the support plate 37 and the middle interlayer insulating layer 39. The preliminary lower stack structure 50T may include a plurality of lower insulating layers 41 and a plurality of lower mold layers 151 to 162, which are alternately and repeatedly stacked. The preliminary upper stack structure 70T may include a plurality of upper insulating layers 43 and a plurality of upper mold layers 171, 172, and 173, which are alternately and repeatedly stacked.

A plurality of selection line isolation patterns 101 to 104 may be formed to pass through the preliminary upper stack structure 70T. The plurality of selection line isolation patterns 101 to 104 may include an insulating layer such as a silicon oxide layer.

A plurality of preliminary pads 151P to 162P, 168P, and 171P to 173P may be formed at one ends of the plurality of lower mold layers 151 to 162, the dummy mold layer 168, and the plurality of upper mold layers 171, 172, and 173. Each of the plurality of preliminary pads 151P to 162P, 168P, and 171P to 173P may have a higher etch rate than the plurality of lower mold layers 151 to 162, the dummy mold layer 168, and the plurality of upper mold layers 171, 172, and 173.

For example, a first preliminary pad 151P may be formed at one end of a first lower mold layer 151. The first preliminary pad 151P may include a first layer L1, a second layer L2 disposed on the first layer L1, and a third layer L3 disposed on the second layer L2. The first layer L1 may include substantially the same material as that of the first lower mold layer 151. The first layer L1 may have substantially the same thickness as that of the first lower mold layer 151. The second layer L2 may have a higher etch rate than the first layer L1. The third layer L3 may have a lower etch rate than the first layer L1. The first preliminary pad 151P may be thicker than the first lower mold layer 151. Each of the plurality of preliminary pads 151P to 162P, 168P, and 171P to 173P may have substantially the same configuration as that of the first preliminary pad 151P.

In an embodiment, the first preliminary pad 151P may be formed at one end of the first lower mold layer 151 using an ion implantation process, a plasma processing process, or a combination thereof. In this case, the first lower mold layer 151 may become less dense after the process is performed due to, for example, an ion bombardment of the process on a region of the first lower mold layer 151 to be the first preliminary pad 151P. For example, Argon ions with high energy may be collided to the one end of the first lower mold layer 151, thereby making the collided region less dense to form the first preliminary pad 151P. The first preliminary pad 15P being less dense than the first lower mold layer may have a higher etch rate than the first mold layer. The first preliminary pad 151P may have substantially the same thickness as that of the first lower mold layer 151.

An upper interlayer insulating layer 45 may be formed on the plurality of preliminary pads 151P to 162P, 168P, and 171P to 173P. A plurality of channel structures 80 may be formed to pass through the preliminary upper stack structure 70T, the dummy mold layer 168, the preliminary lower stack structure 50T, the support plate 37, and the replacement conductive line 35 and to penetrate into the middle buried conductive layer 33. Each of the plurality of channel structures 80 may include an information storage pattern 81, a channel pattern 86, a core pattern 87, and a bit pad 88. In an embodiment, the formation of the plurality of channel structures 80 may be performed before the replacement conductive line 35 is formed. The replacement conductive line 35 may be formed to pass through a side surface of the information storage pattern 81 and be in direct contact with a side surface of the channel pattern 86.

A plurality of support structures 80D may be formed during the formation of the plurality of channel structures 80. Each of the plurality of support structures 80D may have a similar configuration to that of the plurality of channel structures 80. In an embodiment, each of the plurality of support structures 80D may be formed of an insulating layer, such as a silicon oxide layer, unlike the plurality of channel structures 80. Some of the plurality of support structures 80D may be formed to pass through the upper interlayer insulating layer 45, the plurality of preliminary pads 151P to 162P, 168P, and 171P to 173P, the preliminary upper stack structure 70T, the dummy mold layer 168, and the preliminary lower stack structure 50T and to penetrate into the middle interlayer insulating layer 39. Top surfaces of the upper interlayer insulating layer 45, the preliminary upper stack structure 70T, the plurality of channel structures 80, and the plurality of support structures 80D may be exposed at substantially the same planar surface.

First to fifth isolation trenches 91 to 95 may be formed to pass through the preliminary upper stack structure 70T, the dummy mold layer 168, and the preliminary lower stack structure 50T. Some of the first to fifth isolation trenches 91 to 95 may be formed to pass through the support plate 37 and the replacement conductive line 35. The plurality of lower mold layers 151 to 162, the dummy mold layer 168, the plurality of upper mold layers 171, 172, and 173, and the plurality of preliminary pads 151P to 162P, 168P, and 171P to 173P may be exposed at sidewalls of the first to fifth isolation trenches 91 to 95.

The substrate 21 may include a semiconductor substrate such as a silicon wafer. The device isolation layer 23 may include an insulating layer formed using a shallow trench isolation (STI) method. The device isolation layer 23 may include silicon oxide, silicon nitride, silicon oxynitride, or a combination thereof. The plurality of transistors 25 may include a fin field-effect transistor (finFET), a multi-bridge channel (MBC) transistor, a nanowire transistor, a vertical transistor, a recess-channel transistor, a three-dimensional (3D) transistor, a planar transistor, or a combination thereof. The plurality of peripheral circuit interconnections 29 may include lateral interconnections and vertical interconnections having various shapes. The plurality of peripheral circuit interconnections 29 may include a metal, a metal nitride, a metal oxide, a metal silicide, polysilicon, a conductive carbon, or a combination thereof. Each of the lower interlayer insulating layer 27, the middle interlayer insulating layer 39, and the upper interlayer insulating layer 45 may include silicon oxide, silicon nitride, silicon oxynitride, a low-k dielectric material, or a combination thereof. In an embodiment, the middle interlayer insulating layer 39 may include at least one silicon nitride layer disposed between a plurality of silicon oxide layers.

The lower buried conductive layer 31 may be electrically connected to the plurality of peripheral circuit interconnections 29. The lower buried conductive layer 31 may include a metal, a metal nitride, a metal oxide, a metal silicide, polysilicon, a conductive carbon, or a combination thereof. The middle buried conductive layer 33 may include a semiconductor layer such as a polysilicon layer containing N-type impurities. The replacement conductive line 35 may include a metal, a metal nitride, a metal oxide, a metal silicide, polysilicon, a conductive carbon, or a combination thereof. In an embodiment, the replacement conductive line 35 may include a semiconductor layer such as a polysilicon layer containing N-type impurities. The support plate 37 may include a semiconductor layer such as a polysilicon layer.

The plurality of lower mold layers 151 to 162, the dummy mold layer 168, and the plurality of upper mold layers 171, 172, and 173 may include a different material from the plurality of lower insulating layers 41 and the plurality of upper insulating layers 43. The plurality of lower mold layers 151 to 162, the dummy mold layer 168, and the plurality of upper mold layers 171, 172, and 173 may include a material having an etch selectivity with respect to the plurality of lower insulating layers 41 and the plurality of upper insulating layers 43. For example, each of the plurality of lower mold layers 151 to 162, the dummy mold layer 168, and the plurality of upper mold layers 171, 172, and 173 may include silicon nitride, and each of the plurality of lower insulating layers 41 and the plurality of upper insulating layers 43 may include silicon oxide.

As shown in FIG. 14, the information storage pattern 81 may include a tunnel insulating layer 82, a charge storage layer 83, and a first blocking layer 84. The tunnel insulating layer 82 may include silicon oxide. The charge storage layer 83 may include silicon nitride. The first blocking layer 84 may include silicon oxide, a metal oxide, or a combination thereof. The channel pattern 86 may include a semiconductor layer such as a polysilicon layer. The core pattern 87 may include an insulating layer or a semiconductor layer. The bit pad 88 may include polysilicon, a metal, a metal nitride, a metal oxide, a metal silicide, a conductive carbon, or a combination thereof. In an embodiment, the bit pad 88 may include a semiconductor layer such as a polysilicon layer containing N-type impurities.

Referring to FIGS. 1, 2, and 48 to 50, the plurality of lower mold layers 151 to 162, the dummy mold layer 168, the plurality of upper mold layers 171, 172, and 173, and the plurality of preliminary pads 151P to 162P, 168P, and 171P to 173P may be partially removed using an isotropic etching process to form a plurality of gap regions GAP.

In an exemplary embodiment, the forming of the gap regions GAP may include forming a first isolation trench 91 and a second isolation trench 92 on the substrate 21. The first isolation trench 91 and the second isolation trench 92 each may pass through the lower insulating layers 41 and the lower mold layers 151 to 162, the dummy mold layer 168 and the upper mold layers 171 to 173 stacked on each other and may also pass through the preliminary lower pads 151P to 162P and at least one lower mold layer and at least one lower insulating layer stacked on each other beneath each of the preliminary lower pads 151P to 162R The forming of the gap regions GAP may further include performing an isotropic etching process through the first isolation trench 91 and the second isolation trench 92 on the lower mold layers 151 to 162 and the preliminary lower pads 151P and 162P exposed by the first isolation trench 91 and the second isolation trench 92 to form the first lower mold patterns 151R to 162R and the second lower mold patterns 151PR to 162PR respectively.

The plurality of lower mold layers 151 to 162 and the plurality of preliminary pads 151P to 162P, 168P, and 171P to 173P may partially remain to form a plurality of first lower mold patterns 151R to 162R and a plurality of second lower mold patterns 151PR to 162PR. Each of the plurality of second lower mold patterns 151PR to 162PR may include the first layer L1, the second layer L2, and the third layer L3. Each of the plurality of second lower mold patterns 151PR to 162PR may be thicker than each of the plurality of first lower mold patterns 151R to 162R. The plurality of first lower mold patterns 151R to 162R and the plurality of second lower mold patterns 151PR to 162PR may constitute a plurality of mold patterns.

Referring to FIGS. 1, 2, and 51 to 53, a plurality of lower interconnection layers 51 to 62, a dummy interconnection layer 68, and a plurality of upper interconnection layers 71 to 73 may be formed in the plurality of gap regions GAP. The plurality of lower insulating layers 41 and the plurality of lower interconnection layers 51 to 62, which are alternately and repeatedly stacked, may constitute a lower stack structure 50. The dummy interconnection layer 68 may be formed on the lower stack structure 50. The plurality of upper insulating layers 43 and the plurality of upper interconnection layers 71 to 73, which are alternately and repeatedly stacked, may constitute an upper stack structure 70. The upper stack structure 70 may be formed on the dummy interconnection layer 68. A first insulating layer 47 may be formed to fill the first to fifth isolation trenches 91 to 95 and cover the upper stack structure 70 and the upper interlayer insulating layer 45.

The plurality of lower interconnection layers 51 to 62 may include a plurality of lower gate lines 51G to 62G, a plurality of first and second lower extension lines 51E1 to 62E2, a plurality of lower pads 51P to 62P, the plurality of first lower mold patterns 151R to 162R, and the plurality of second lower mold patterns 151PR to 162PR. The dummy interconnection layer 68 may include a dummy gate line 68G, a dummy extension line 68E, and a dummy pad 68P. The plurality of upper interconnection layers 71 to 73 may include a plurality of upper gate lines 71G to 73G, a plurality of upper extension lines 71E to 73E, and a plurality of upper pads 71P to 73P. The upper gate lines 71G to 73G, the upper extension lines 71E to 73E and the upper pads 71P to 73P may constitute upper word lines.

Each of the plurality of lower gate lines 51G to 62G, the plurality of first and second lower extension lines 51E1 to 62E2, the plurality of lower pads 51P to 62P, the dummy gate line 68G, the dummy extension line 68E, the dummy pad 68P, the plurality of upper gate lines 71G to 73G, the plurality of upper extension lines 71E to 73E, and the plurality of upper pads 71P to 73P may include a metal, a metal nitride, a metal oxide, a metal silicide, polysilicon, a conductive carbon, or a combination thereof.

Referring to FIGS. 1, 2, and 54 to 56, a mask pattern 47M may be formed on the first insulating layer 47. A plurality of cell contact holes 121H and a plurality of through holes 131H may be formed using the mask pattern 47M as an etch mask. Each of the plurality of cell contact holes 121H may be formed to pass through the first insulating layer 47, the corresponding one of the plurality of lower pads 51P to 62P, and the corresponding at least one of the plurality of first lower mold patterns 151R to 162R and the plurality of lower insulating layers 41. Each of the plurality of through holes 131H may be formed to pass through the first insulating layer 47, the corresponding one of the plurality of second lower mold patterns 151PR to 162PR, the corresponding at least one of the plurality of first lower mold patterns 151R to 162R and the plurality of lower insulating layers 41, the middle interlayer insulating layer 39, and the lower interlayer insulating layer 27 and expose the corresponding one of the plurality of peripheral circuit interconnections 29. In an embodiment, a lateral width of each of the plurality of through holes 131H may be greater than a lateral width of each of the plurality of cell contact holes 121H.

Referring to FIGS. 1, 2, 57, and 58, a plurality of cell contact plugs 121 may be formed inside the plurality of cell contact holes 121H, and a plurality of through electrodes 131 may be formed inside the plurality of through holes 131H. The mask pattern 47M may be removed. The plurality of cell contact plugs 121 may be in direct contact with the plurality of lower pads 51P to 62P. The plurality of through electrodes 131 may be in direct contact with the plurality of peripheral circuit interconnections 29.

Referring to FIGS. 1, 2, and 59 to 61, a second insulating layer 49 may be formed on the first insulating layer 47. A plurality of selection contact plugs 127 may be formed to pass through the second insulating layer 49, the first insulating layer 47, and the upper interlayer insulating layer 45 and connected to the plurality of upper pads 71P to 73P. A plurality of bit plugs 128 may be formed to pass through the second insulating layer 49 and the first insulating layer 47 and connected to the plurality of channel structures 80. Each of the plurality of bit plugs 128 may be in direct contact with the bit pad 88. A plurality of upper plugs 129 may be formed to pass through the second insulating layer 49 and connected to the plurality of cell contact plugs 121 and the plurality of through electrodes 131.

Referring back to FIGS. 1, 2, and 11 to 13, the plurality of upper circuit interconnections 141 may be formed on the second insulating layer 49 and be in contact with the plurality of selection contact plugs 127, the plurality of bit plugs 128, and the plurality of upper plugs 129.

Each of the first insulating layer 47 and the second insulating layer 49 may include silicon oxide, silicon nitride, silicon oxynitride, a low-k dielectric material, or a combination thereof. Each of the plurality of cell contact plugs 121, the plurality of through electrodes 131, the plurality of selection contact plugs 127, the plurality of bit plugs 128, the plurality of upper plugs 129, and the plurality of upper circuit interconnections 141 may include a metal, a metal nitride, a metal oxide, a metal silicide, polysilicon, a conductive carbon, or a combination thereof.

Some of the plurality of upper circuit interconnections 141 may correspond to bit lines. The first isolation trench 91 and the second isolation trench 92 may correspond to word line cuts. Some of the plurality of lower gate lines 51G to 62G may correspond to part of word lines. A lowermost line 51G among the plurality of lower gate lines MG to 62G may correspond to a gate-induced drain leakage (GIDL) control line. A second lowermost line among the plurality of lower gate lines 51G to 62G may correspond to a ground selection line (GSL) or a source selection line. The replacement conductive line 35 may correspond to a common source line (CSL). An uppermost line 73G among the plurality of upper gate lines 71G to 73G may correspond to a GIDL control line. A second uppermost line 72G and a third uppermost line 71G among the plurality of upper gate lines 71G to 73G may correspond to string selectin lines (SSLs) or drain selection lines (DSL).

According to the example embodiments of the inventive concept, an extension line having a smaller width than a gate line, a pad connected to the extension line, a mold pattern in contact with side surfaces of the extension line and the pad, and a contact plug formed to pass through the pad can be provided. A semiconductor device that is advantageous for high integration and has excellent electrical properties can be implemented.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A vertical memory device, comprising:
   a substrate having a peripheral circuit interconnection;
   a plurality of lower word lines stacked on the substrate;
   a plurality of vertical channel structures passing through the lower word lines;
   a first cell contact plug including a bottom end lower than a bottom surface of a first lower word line of the lower word lines, wherein the first cell contact plug is connected to the first lower word line; and
   a plurality of lower insulating layers and a plurality of first lower mold patterns positioned beneath the first lower word line and stacked alternately on each other from the substrate,
   wherein the lower word lines include a plurality of lower pads stacked on each other in a staircase structure,
   wherein the first lower word line has a first lower pad of the lower pads, and
   wherein the bottom end of the first cell contact plug is lower than the bottom surface of the first lower pad, and
   wherein the first cell contact plug passes through the first lower pad.

2. The vertical memory device of claim 1,
   wherein the first cell contact plug partially overlaps the first lower pad.

3. The vertical memory device of claim 1,
   wherein the bottom end of the first cell contact plug is positioned lower than a bottom surface of an uppermost lower insulating layer of the lower insulating layers.

4. The vertical memory device of claim 3,
   wherein the bottom surface of the first lower word line is in direct contact with a top surface of the uppermost lower insulating layer.

5. The vertical memory device of claim 1, further comprising:
   a second cell contact plug having a bottom end lower than a bottom surface of a second lower word line of the lower word lines, wherein the second cell contact plug is connected to the second lower word line.

6. The vertical memory device of claim 5,
   wherein the second lower word line is positioned lower than the first lower word line, and
   wherein the bottom end of the second cell contact plug is lower than the bottom end of the first cell contact plug.

7. The vertical memory device of claim 1,
   wherein the first lower word line includes a lower gate line, a first lower extension line extending in a first direction from a first side of the lower gate line, a second lower extension line extending in the first direction from a second side of the lower gate line and a lower pad extending in a second direction crossing the first direction from an end of the first lower extension line,
   wherein the lower pad is thicker than the first lower extension line.

8. The vertical memory device of claim 1,
   wherein the first lower word line includes a lower gate line, a first lower extension line extending in a first direction from a first side of the lower gate line, a second lower extension line extending in the first direction from a second side of the lower gate line and a lower pad extending in a second direction crossing the first direction from an end of the first lower extension line, wherein the vertical channel structures penetrate the lower gate line, and wherein the bottom end of the first cell contact plug is lower than the bottom surface of the lower pad.

9. The vertical memory device of claim 8, wherein the first cell contact plug penetrates the lower pad of the first lower word line.

10. The vertical memory device of claim 1, wherein the first lower word line includes a lower gate line, a first lower extension line extending in a first direction from a first side of the lower gate line, a second lower extension line extending in the first direction from a second side of the lower gate line and a lower pad extending in a second direction crossing the first direction from an end of the first lower extension line, the vertical memory device further comprising:
a through electrode disposed in a region defined by the lower gate line, the first lower extension line, the second lower extension line and lower pad; and
a second lower mold pattern on the first lower mold patterns,
wherein the lower insulating layers and the first lower mold patterns stacked alternately and positioned beneath the second lower mold pattern, and
wherein the second lower mold pattern is positioned at the same height from the substrate with the first lower word line.

11. The vertical memory device of claim 10, wherein the through electrode passes through the second lower mold pattern, and the lower insulating layers and the first lower mold patterns beneath the second lower mold patterns to be connected to the peripheral circuit interconnection.

12. The vertical memory device of claim 10, wherein the second lower mold pattern is shorter than the first lower mold patterns beneath the second lower mold pattern in a second direction crossing the first direction.

13. The vertical memory device of claim 11, further comprising:
an upper circuit interconnection line connecting the through electrode to the first cell contact plug.

14. The vertical memory device of claim 1, wherein the first cell contact plug passes through the lower insulating layers and the first lower mold patterns beneath the first lower word line to be connected to the peripheral circuit interconnection,
the vertical memory device further comprising:
a second cell contact plug having a bottom end lower than a bottom surface of a second lower word line of the lower word lines,
wherein the second lower word line is lower than the first lower word line,
wherein the second cell contact plug is connected to the second lower word line, and
wherein the second cell contact plug passes through the lower insulating layers and the first lower mold patterns to be connected to the peripheral circuit interconnection.

15. The vertical memory device of claim 14, wherein the first cell contact plug and the second cell contact plug have the same height.

16. The vertical memory device of claim 1, wherein the substrate further includes a lower interlayer insulating layer covering the peripheral circuit interconnection, a middle interlayer insulating layer and a conductive layer connected to the peripheral circuit interconnection.

17. The vertical memory device of claim 16, further comprising:
a first isolation trench and a second isolation trench passing through the lower word lines,
wherein the first lower word line includes a lower gate line, a first lower extension line extending in a first direction from a first side of the lower gate line along the first isolation trench, a second lower extension line extending in the first direction from a second side of the lower gate line along the second isolation trench and a lower pad extending in a second direction crossing the first direction from an end of the first lower extension line.

18. The vertical memory device of claim 17, wherein the vertical channel structures are disposed on the conductive layer of the substrate, and
wherein the lower pad is disposed on the middle interlayer insulating layer.

19. A vertical memory device, comprising:
a substrate having a peripheral circuit interconnection; and
a lower stack structure on the substrate, the lower stack structure comprising:
a plurality of lower word lines stacked in a staircase structure, each lower word line having a lower gate line, a first lower extension line, a second lower extension line, a first lower pad and a second lower pad, wherein the first lower extension line is extended in a first direction from a first side of the lower gate line, a second lower extension line is extended in the first direction from a second side of the lower gate line, the first lower pad is extended in a second direction crossing the first direction from an end of the first lower extension line and the second lower pad is extended in the second direction from an end of the second lower extension line;
a plurality of vertical channel structures passing through the lower gate line of each of the lower word lines;
a plurality of cell contact plugs each being connected to a corresponding lower word line of the lower word lines, each of the cell contact plugs having a bottom end lower than a bottom surface of the corresponding lower word line; and
a plurality of lower mold patterns each including a first lower mold pattern and a second lower mold pattern, wherein each of the lower mold patterns is positioned at the same height from the substrate with a corresponding lower word line of the lower word lines,
wherein the first lower mold pattern is disposed between the first lower extension line and the second lower extension line,
wherein the second lower mold pattern is disposed between the first lower pad and the second lower pad, and
wherein a width of the first lower mold pattern is greater than a width of the second lower mold pattern in the second direction.

20. A vertical memory device comprising:
a substrate including a peripheral circuit interconnection;
a first isolation trench;
a second isolation trench;
a plurality of lower word lines disposed between the first isolation trench and the second isolation trench, wherein the lower word lines each includes a lower gate line, a first lower extension line extending in a first direction from a first side of the lower gate line, a second lower extension line extending in the first direction from a second side of the lower gate line and a first lower pad extending in a second direction crossing the first direction from an end of the first lower extension line, and wherein the first lower pad of each of the lower word lines is stacked in a staircase structure;

a plurality of lower mold patterns stacked in a staircase structure, wherein each of the lower mold patterns is positioned at the same height from the substrate with a corresponding lower word line of the lower word lines;

a cell contact plug passing through a first lower pad of one of the lower word lines;

a second lower pad extending in the second direction from an end of the second lower extension line, the second lower pad facing the first lower pad;

a through electrode penetrating at least one lower mold pattern between the first lower pad and the second lower pad to be connected to the peripheral circuit interconnection; and an upper interconnection line connecting the through electrode to the cell contact plug, wherein the upper interconnection line extends in the second direction.

* * * * *